United States Patent
Uesugi et al.

(10) Patent No.: US 7,035,139 B2
(45) Date of Patent: Apr. 25, 2006

(54) MAGNETIC STORAGE CELL AND MAGNETIC MEMORY DEVICE USING SAME

(75) Inventors: Takumi Uesugi, Tokyo (JP); Takeo Kagami, Tokyo (JP)

(73) Assignee: TDK Corporation, Tokyo (JP)

( * ) Notice: Subject to any disclaimer, the term of this patent is extended or adjusted under 35 U.S.C. 154(b) by 71 days.

(21) Appl. No.: 10/893,605

(22) Filed: Jul. 19, 2004

(65) Prior Publication Data

US 2005/0018479 A1 Jan. 27, 2005

(30) Foreign Application Priority Data

Jul. 25, 2003 (JP) ............... 2003-202136

(51) Int. Cl.
*G11C 11/15* (2006.01)
(52) U.S. Cl. .................................... 365/173; 365/158
(58) Field of Classification Search ................ 365/173, 365/158
See application file for complete search history.

(56) References Cited

U.S. PATENT DOCUMENTS

| | | | |
|---|---|---|---|
| 6,473,336 B1 | 10/2002 | Nakajima et al. | |
| 6,717,780 B1* | 4/2004 | Hiramoto et al. | 365/158 |
| 6,778,421 B1* | 8/2004 | Tran | 365/158 |
| 2004/0136234 A1 | 7/2004 | Ohmori | |

FOREIGN PATENT DOCUMENTS

| | | |
|---|---|---|
| EP | 1 107 329 A2 | 6/2001 |
| EP | 1 511 041 A2 | 3/2005 |
| JP | A 2001-236781 | 8/2001 |
| JP | A 2001-266567 | 9/2001 |

\* cited by examiner

*Primary Examiner*—Tuan T. Nguyen
(74) *Attorney, Agent, or Firm*—Oliff & Berridge, PLC

(57) ABSTRACT

A magnetic storage cell including of two magneto-resistive elements to remove in-phase noise in a read output, and reduces a loss of a current magnetic field, when information is written thereinto, to efficiently produce magnetization reversal. In addition, the area occupied by the magnetic storage cell is reduced to increase the storage capacity, and the structure of the magnetic storage cell is simplified to facilitate the manufacturing. The magnetic storage cell including two TMR elements, and an annular magnetic layer provided commonly for the two TMR elements. The TMR elements are disposed in a direction along a laminating surface with respect to each other. A write bit line and a write word line are provided commonly for the two TMR elements. The annular magnetic layer is disposed with its axial direction defined in a direction along the laminating surface, and is passed through by the lines.

20 Claims, 32 Drawing Sheets

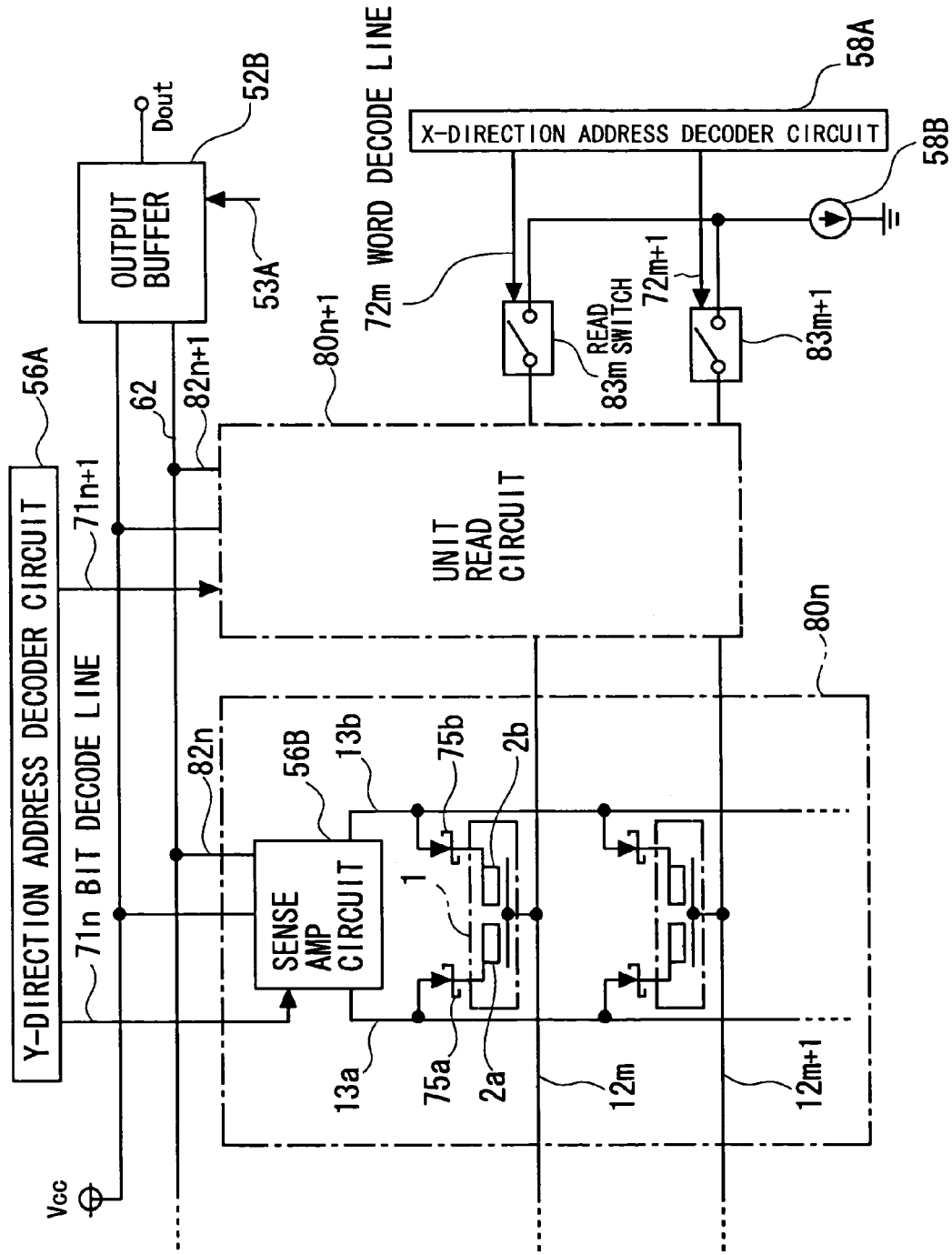

「1」

「0」

MAGNETIC STORAGE CELL AND MAGNETIC MEMORY DEVICE USING SAME

BACKGROUND OF THE INVENTION

The present invention relates to a magnetic storage cell and a magnetic memory device using the same.

Conventionally, in magnetic memory devices such as MRAM (Magnetic Random Access Memory) and the like, magneto-resistive elements such as a TMR element (tunnel magneto-resistive element) and the like are used as magnetic storage cells (see JP-A-2001-236781 and JP-A-2001-266567 (these correspond to U.S. patent application Publication No. 2002/0006058.) and the like).

Such magnetic memory devices are exemplified by JP-A-2001-236781 and JP-A-2001-266567 which disclose a plurality types of magnetic memory devices which have magnetic storage cells, each of which is comprised of a pair of TMR elements, and differentially amplify outputs from two TMR elements in pair to generate a read output. In these magnetic memory devices, a write is always performed in a complementary manner such that one of the TMR elements has a free layer (a magnetic layer, the magnetization direction of which changes depending on an external magnetic field) and a pinned layer (a magnetic layer, the magnetization direction of which is fixed), that have the magnetization directions in parallel with each other (i.e., the TMR element has a low electric resistance), while the other TMR element has a free layer and pinned layer that have the magnetization directions in antiparallel with each other (i.e., the TMR element has a high electric resistance). Then, the outputs of the two TMR elements are differentially amplified and read, thereby removing in-phase noise in the read output and therefore improve the S/N ratio.

In a magnetic memory device disclosed in FIG. 6 of JP-A-2001-236781 (hereinafter called the "first prior art example"), a pair of TMR elements which make up a magnetic storage cell are disposed in a direction along a laminating surface with respect to each other. In the first prior art example, the pair of TMR elements have their pinned layers, the magnetization direction of which are set to be in parallel with each other (in the same orientation). Also, in the first prior art example, the pair of TMR elements have their free layers and pinned layers laminated in the same order as each other. Further, one of the TMR elements in pair is provided with two write lines which generate a current magnetic field (a magnetic field induced by applying a current) that causes a change in the magnetization direction of the free layer in the one TMR element. The two write lines are disposed on both sides thereof in the laminating direction with respect to the one TMR element, and sandwiches the one TMR element. Also, the other one of the pair of TMR elements is provided with two write lines, different from the aforementioned write lines, which generate a current magnetic field that causes a change in the magnetization direction of the free layer in the other TMR element. These two write lines are disposed on both sides thereof in the laminating direction with respect to the other TMR element, and sandwiches the other TMR element. Then, in the first prior art example, the respective directions of currents applied to a total of four write lines, which comprise the two write lines provided for the one TMR element and the two write lines provided for the other TMR element, are set to independently control the magnetization directions of the free layers in the pair of TMR elements, thereby implementing the aforementioned complementary write for a single magnetic storage cell.

In a magnetic memory device disclosed in FIG. 10 of JP-A-2001-236781 (hereinafter called the "second prior art example"), a pair of TMR elements which make up a magnetic storage cell are disposed in a laminating direction to each other. Like the first prior art example, in the second prior art example, the pair of TMR elements also have their pinned layers which are set to have the magnetization directions parallel with each other (in the same orientation). Also, in the second prior art example, the pair of TMR elements also have their free layers and pinned layers laminated in the same order as each other, like the first prior art example. Further, in the second prior art example, a single write line is provided commonly for both the TMR elements in the pair, another write line is provided for one of the pair of TMR elements, and a further write line is provided for the other of the pair of TMR elements. Then, the magnetization direction of the free layer in the one TMR element is changed by a current magnetic field generated by the one write line provided commonly for both the TMR elements in the pair and the one write line provided for the one TMR element. The magnetization direction of the free layer in the other TMR element is changed by a current magnetic field generated by the one write line provided commonly for both the TMR elements in the pair and the one write line provided for the other TMR element. The one write line provided commonly for both the TMR elements in the pair is disposed between the pair of TMR elements, the one write line provided for the one TMR element is disposed on one side of the one TMR element opposite to the other TMR element, and the one write line provided for the other TMR element is disposed on one side of the other TMR element opposite to the one TMR element. Then, in the second prior art example, the respective directions of currents applied to the total of three write lines are set to independently control the magnetization directions of the free layers in the pair of TMR elements, thereby implementing the aforementioned complementary write to a single magnetic storage cell.

In a magnetic memory device disclosed in FIG. 2 of JP-A-2001-266567 (hereinafter called the "third prior art example"), a pair of TMR elements which make up a magnetic storage cell are disposed in a laminating direction to each other in a manner similar to the first prior art example. The third prior art example is also similar to the first prior art example in that the pair of TMR elements have their pinned layers which are set to have the magnetization directions parallel with each other (in the same orientation). Also, in the third prior art example, the free layers and pinned layers in the pair of TMR elements are laminated in reverse orders to each other, so that the free layers in the pair of TMR elements are laminated to be in close proximity to each other. These free layers are antiferromagnetically coupled to each other by a non-magnetic conductive layer laminated therebetween. Further, in the third prior art example, two write lines are provided commonly for both of the TMR elements in the pair, such that the pair of TMR elements are entirely sandwiched by the two write lines on both sides thereof in the laminating direction. The magnetization directions of the free layers in the pair of TMR elements are changed by a current magnetic field generated by the two write lines. Then, in the third prior art example, the directions of currents applied to a total of two write lines are set to collectively control the magnetization directions of the free layers in the pair of TMR elements, thereby implementing the aforementioned complementary write for a single magnetic storage cell.

However, in the first to third prior art examples, the magnetization directions of the free layers in a pair of TMR elements, which make up a single magnetic storage cell, are changed by a current magnetic field generated by a plurality of write lines to store information in the magnetic storage cell, but these prior art examples fail to form a magnetic path which efficiently guides the current magnetic field. Therefore, the conventional magnetic memory devices which have magnetic storage cells, each of which is made up of a pair of TMR cells as in the first to third prior art examples, suffer from a large loss of current magnetic field, and therefore fail to efficiently carry out the magnetization reversal of each free layer.

Generally, magnetic memory devices are basically required to reduce the area occupied by magnetic storage cells to increase the storage capacity, to be simple in structure, and to be easy to manufacture.

SUMMARY OF THE INVENTION

It is an object of the present invention to provide a magnetic storage cell made up of two magneto-resistive elements in a simple structure, which is capable of removing in-phase noise in a read output, reducing a loss of current magnetic field when information is written thereinto to accomplish efficient magnetization reversal, offering a large storage capacity by reducing the area occupied by the magnetic storage cell, and facilitating the manufacturing.

It is another object of the present invention to provide a magnetic memory device which uses the foregoing magnetic storage cell.

A magnetic storage cell according to a first aspect of the present invention includes a first and a second magneto-resistive element each comprised of a laminate, and disposed in a direction along a laminating surface with respect to each other, and a first magnetic layer disposed on one surface side of the laminates so as to be common to the first and second magneto-resistive elements, wherein the first magnetic layer forms a magnetic path for a current magnetic field generated by a plurality of conductors commonly provided for the first and second magneto-resistive elements, and the first and second magneto-resistive elements have electric resistances of which high/low states change simultaneously based on the current magnetic field passing through the first magnetic layer.

According to the first aspect, since the magnetic storage cell is comprised of two magneto-resistive elements, similar to the first to third prior art examples, the outputs of the two magneto-resistive elements is differentially amplified and read, thereby removing in-phase noise of the read output to improve the S/N ratio.

Also, in the first aspect, the magnetic storage cell includes the first magnetic layer for forming a magnetic path for a current magnetic field generated by the plurality of conductors, wherein the high/low states of the electric resistances of the two magneto-resistive elements change based on the current magnetic field passing through the first magnetic layer, so that a loss of the current magnetic field can be reduced by the magnetic layer, thereby efficiently producing the magnetization reversal when information is written.

Further, in the first aspect, since the plurality of conductors for generating the current magnetic field is commonly provided for the two magneto-resistive elements and the high/low states of the electric resistances of the two magneto-resistive elements change simultaneously based on the current magnetic field, the number of conductors is reduced for one magnetic storage cell. Thus, the resulting magnetic storage cell is simple in structure to facilitate its manufacturing process, and has a reduced area occupied thereby to increase the storage capacity.

Further, in the first aspect, the two magneto-resistive elements are disposed in the direction along the laminating surface with respect to each other, and the first magnetic layer is disposed on the same side of the laminates which constitute these magneto-resistive elements so as to be common to the two magneto-resistive elements. Therefore, the first magnetic layer is simple in structure and facilitates its manufacturing process, and the resulting magnetic storage cell has a reduced area occupied thereby to increase the storage capacity, as compared with a magnetic storage cell which has a first magnetic layer for each of two magneto-resistive elements.

A magnetic storage cell according to a second aspect of the present invention is arranged in a manner that, in the first aspect, the first magnetic layer comprises an annular magnetic layer disposed to have an axial direction defined in the direction along the laminating surface and passed through by the plurality of conductors. Here, the term "annular" of the "annular magnetic layer" expresses the state that the layer perfectly encloses the conductors continuously magnetically and electrically and the section of the layer is closed in a direction crossing the plurality of conductors when the layer is viewed from the conductors penetrating the inside of the layer. Accordingly, an insulator is allowed to be contained in the annular magnetic layer as long as the annular magnetic layer is continuous magnetically and electrically. In other words, the annular magnetic layer may contain an oxide film as generated in the manufacturing process. The "axial direction" designates the opening direction when attention is paid to the annular magnetic layer alone, that is, the extending direction of the plurality of conductors penetrating the inside of the annular magnetic layer.

According to the second aspect, since the first magnetic layer is the annular magnetic layer, the first magnetic layer forms a closed magnetic path for a current magnetic field generated by the plurality of conductors. It is therefore possible to more reduce a loss of the current magnetic field and therefore more efficiently produce the magnetization reversal when information is written. Also, since the first magnetic layer forms the closed magnetic path for the current magnetic field generated by the plurality of conductors, the current magnetic field generated by the plurality of conductors provided for the magnetic storage cell less affects adjacent magnetic storage cells, thereby preventing erroneous writing of information. However, in the first aspect, the first magnetic layer need not be necessarily the annular magnetic layer, and may form a closed magnetic path, a portion of which is removed, with respect to the current magnetic field generated by the plurality of conductors.

A magnetic storage cell according to a third aspect of the present invention is arranged in a manner that, in the first or second aspect, each of the first and second magneto-resistive elements is electrically connected to the first magnetic layer.

According to the third aspect, since the first magnetic layer is additionally used as a wiring layer, the wiring structure can be simplified.

A magnetic storage cell according to a fourth aspect of the present invention is arranged in a manner that, in any of the first to third aspects, the plurality of conductors extend in parallel with one another in a region in which the conductors pass through the annular magnetic layer.

According to the fourth aspect, a combined magnetic field generated by applying currents to the plurality of conductors can be increased, as compared with that generated by a plurality of conductors crossing with each other in the region in which they extend through the annular magnetic field, thereby more efficiently producing the magnetization reversal when information is written.

A magnetic storage cell according to a fifth aspect of the present invention is arranged in a manner that, in any of the first to fourth aspects, each of the first and second magneto-resistive elements is configured such that a current flows in a direction perpendicular to the laminating surface.

While the fifth aspect is an example of employing a so-called CPP (Current Perpendicular to Plane) structure (structure in which a sense current is applied perpendicularly to a film plane) as the structure for the first and second magneto-resistive elements, a so-called CIP (Current In Plane) structure (structure in which a sense current is applied in parallel with a film plane) may be employed in the first to fourth aspects.

A magnetic storage cell according to a sixth aspect of the present invention is arranged in a manner that, in any of the first to fifth aspects, the magnetic storage cell takes one of a first state wherein the electric resistance of the first magneto-resistive element is relatively low and the electric resistance of the second magneto-resistive element is relatively high, and a second state wherein the electric resistance of the first magneto-resistive element is relatively high and the electric resistance of the second magneto-resistive element is relatively low, and the magnetic storage cell stores information corresponding to the first or second state.

Information (for example, binary information which takes "1" or "0") is preferably stored in a complementary relationship of the high/low states of the electric resistances of the first and second magneto-resistive elements, as in the sixth aspect.

A magnetic storage cell according to a seventh aspect of the present invention is arranged in a manner that, in any of the first to sixth aspects, (a) each of the first and second magneto-resistive elements includes a second magnetic layer, the magnetization direction of which is fixed, and a third magnetic layer, the magnetization direction of which changes in response to an external magnetic field, where the second magnetic layer and the third magnetic layer are laminated in the same laminating order in the first magneto-resistive element as in the second magneto-resistive element, (b) the high/low states of the resistance of each of the first and second magneto-resistive elements is determined in accordance with a relative relationship between the magnetization directions of the second and third magnetic layers included in the associated magneto-resistive element, and (c) the magnetization directions of the third magnetic layers included in the first and second magneto-resistive elements simultaneously change based on the current magnetic field.

The seventh aspect enumerates examples of principle structure for the first and second magneto-resistive elements.

A magneto-resistive cell according to an eighth aspect of the present invention is arranged in a manner that, in the seventh aspect, each of the first and second magneto-resistive elements includes a tunnel barrier layer between the second and third magnetic layers.

The eighth aspect shows an example of employing TMR elements for the first and second magneto-resistive elements. However, in the first to seventh aspects, a GMR element having a CPP structure, for example, may be employed for the first and second magneto-resistive elements, with a non-magnetic metal layer, provided between the second and third magnetic layers.

A magnetic storage cell according to a ninth aspect of the present invention is arranged in a manner that, in the seventh or eighth aspect, the magnetic storage cell takes one of a first state wherein the magnetization directions of the second and third magnetic layers included in the first magneto-resistive element are substantially in parallel with each other, and the magnetization directions of the second and third magnetic layers included in the second magneto-resistive element are substantially in antiparallel with each other, and a second state wherein the magnetization directions of the second and third magnetic layers included in the first magneto-resistive element are substantially in antiparallel with each other, and the magnetization directions of the second and third magnetic layers included in the second magneto-resistive element are substantially in parallel with each other, and the magnetic storage cell stores information corresponding to the first and second states.

Information (for example, binary information which takes "1" or "0") is preferably stored in a complementary relationship of parallel/antiparallel of the second and third magnetic layers in the first and second magneto-resistive elements as in the ninth aspect.

A magnetic storage cell according to a tenth aspect of the present invention is arranged in a manner that, in any of the seventh to tenth aspects, the third magnetic layer included in at least one of the first and second magneto-resistive elements constitutes a part of the first magnetic layer. According to the tenth aspect, the layered structure is simplified, which is preferred for the magnetic storage cell.

A magnetic storage cell according to an eleventh aspect of the present invention is arranged in a manner that, in any of the seventh to tenth aspects, (a) the magnetization direction of the second magnetic layer included in the first magneto-resistive element and the magnetization direction of the second magnetic layer included in the second magneto-resistive element are set to be substantially in antiparallel with each other, and (b) the magnetization direction of the third magnetic layer included in the first magneto-resistive element and the magnetization direction of the third magnetic layer included in the second magneto-resistive element change based on the current magnetic field to be substantially in parallel with each other.

The eleventh aspect shows an example in which the complementary relationship of the parallel/antiparallel magnetization directions of the second and third magnetic layers in the first and second magneto-resistive elements is implemented by substantially setting the magnetization directions of the second magnetic layers in the first and second magneto-resistive elements opposite to each other (in antiparallel with each other).

A magnetic storage cell according to a twelfth aspect of the present invention is arranged in a manner that, in the eleventh aspect, (a) each of the first and second magneto-resistive elements includes an antiferromagnetic layer laminated on one surface side of the second magnetic layer included in the associated magneto-resistive element opposite to the third magnetic layer included in the associated magneto-resistive element, (b) the antiferromagnetic layer included in one of the first and second magneto-resistive elements is laminated on a surface of the second magnetic layer included in the associated magneto-resistive element to produce exchange coupling with the associated second magnetic layer, (c) the other of the first and second magneto-resistive elements includes one or more bilayer films laminated in sequence between the second magnetic layer and the antiferromagnetic layer included in the associated magneto-resistive element, (d) each of the one or more bilayer films included in the other magneto-resistive element comprises a non-magnetic conductive layer disposed on one side closer to the second magnetic layer included in the associated magneto-resistive element, and a ferromagnetic layer disposed on the opposite side thereto, (e) the antiferromagnetic layer included in the other magneto-resistive element produces exchange coupling with one of the ferromagnetic layer or layers forming part of the one or more bilayer films included in the associated magneto-resistive element, where the one ferromagnetic layer is adjacent in the laminating direction to the antiferromagnetic layer included in the associated magneto-resistive element, (f) the non-magnetic conductive layer included in at least one of the one or more bilayer films produces antiferromagnetic coupling between two layers adjacent to the associated non-magnetic conductive layer on both sides in the laminating direction, (g) the number of times of the antiferromagnetic coupling produced between the second magnetic layer and the antiferromagnetic layer in the other magneto-resistive element is an odd number.

A magnetic storage cell according to a thirteenth aspect of the present invention is arranged in a manner that, in the eleventh aspect, (a) each of the first and second magneto-resistive elements includes an antiferromagnetic layer laminated on one surface side of the second magnetic layer included in the associated magneto-resistive element opposite to the third magnetic layer included in the associated magneto-resistive element, (b) each of the first and second magneto-resistive elements includes one or more bilayer films laminated in sequence between the second magnetic layer and the antiferromagnetic layer included in the associated magneto-resistive element, (c) each of the one or more bilayer films included in the first and second magneto-resistive elements comprises a non-magnetic conductive layer disposed on one side closer to the second magnetic layer included in the associated magneto-resistive element, and a ferromagnetic layer disposed on the opposite side thereto, (d) each of the antiferromagnetic layers included in the first and second magneto-resistive elements produces exchange coupling with one of the ferromagnetic layers forming part of the one or more bilayer films included in the associated magneto-resistive element, where the one ferromagnetic layer is adjacent in the laminating direction to the antiferromagnetic layer included in the associated magneto-resistive element, (e) the non-magnetic conductive layer included in at least one of the one or more bilayer films included in the first magneto-resistive element produces antiferromagnetic coupling between two layers adjacent to the associated non-magnetic conductive layer on both sides in the laminating direction, (f) the non-magnetic conductive layer included in at least one of the one or more bilayer films included in the second magneto-resistive element produces antiferromagnetic coupling between two layers adjacent to the associated non-magnetic conductive layer on both sides in the laminating direction, and (g) one of the number of times of the antiferromagnetic coupling produced between the second magnetic layer and the antiferromagnetic layer in the first magneto-resistive element, and the number of times of the antiferromagnetic coupling produced between the second magnetic layer and the antiferromagnetic layer in the second magneto-resistive element is an odd number, and the other is an even number.

A magnetic storage cell according to a fourteenth aspect of the present invention is arranged in a manner that, in the eleventh aspect, each of the first and second magneto-resistive elements includes an antiferromagnetic layer laminated on a surface of the second magnetic layer included in the associated magneto-resistive element opposite to the third magnetic layer included in the associated magneto-resistive element, and involved in the exchange coupling with the second magnetic layer included in the associated magneto-resistive element, and the antiferromagnetic layer included in the first magneto-resistive element, and the antiferromagnetic layer included in the second magneto-resistive element are made of antiferromagnetic materials which are different in blocking temperature from each other, respectively.

While the twelfth to fourteenth aspects enumerate specific examples of the eleventh aspect, the eleventh aspect is not limited to the twelfth to fourteenth aspects.

A magnetic storage cell according to a fifteenth aspect of the present invention is arranged in a manner that, in any of the seventh to tenth aspects, (a) the magnetization direction of the second magnetic layer in the first magneto-resistive element and the magnetization direction of the second magnetic layer included in the second magneto-resistive element are set to be substantially in parallel with each other, and (b) the magnetization direction of the third magnetic layer in the first magneto-resistive element and the magnetization direction of the third magnetic layer included in the second magneto-resistive element change based on the current magnetic field to be substantially in antiparallel with each other.

The fifteenth aspect shows an example in which the complementary relationship of the parallel/antiparallel magnetization directions of the second and third magnetic layers in the first and second magneto-resistive elements is implemented by substantially setting the magnetization directions of the third magnetic layers in the first and second magneto-resistive elements opposite to each other (in antiparallel with each other).

A magnetic storage cell according to a sixteenth aspect of the present invention is arranged in a manner that, in the fifteenth aspect, (a) the third magnetic layer included in one of the first and second magneto-resistive elements constitutes a part of the first magnetic layer, or is directly in contact with the first magnetic layer, and (b) the other of the first and second magneto-resistive elements includes a non-magnetic conductive layer laminated between the third magnetic layer included in the associated magneto-resistive element and the first magnetic layer for producing antiferromagnetic coupling therebetween.

A magnetic storage cell according to a seventeenth aspect of the present invention is arranged in a manner that, in the fifteenth aspect, (a) the third magnetic layer included in one of the first and second magneto-resistive elements constitutes a part of the first magnetic layer, or is directly in contact with the first magnetic layer, (b) the other of the first and second magneto-resistive elements includes two or more non-magnetic conductive layers and one or more ferromagnetic layers laminated between the third magnetic layer included in the associated magneto-resistive element and the first magnetic layer, (c) the two or more non-magnetic conductive layers have the number of layers larger by one than the number of layers of the one or more ferromagnetic layers, and each of the two or more non-magnetic conductive layers and each of the one or more ferromagnetic layers are alternately laminated, and (d) at least one of the two or more non-magnetic conductive layers produces antiferromagnetic coupling between two layers adjacent to the associated non-magnetic conductive layer on both sides in the laminating direction, and (e) the number of times of the antiferromagnetic coupling produced between the third magnetic layer and the first magnetic layer in the other magneto-resistive element is an odd number.

A magnetic storage cell according to an eighteenth aspect of the present invention is arranged in a manner that, in the fifteenth aspect, (a) each of the first and second magneto-resistive elements includes two or more non-magnetic conductive layers and one or more ferromagnetic layers laminated between the third magnetic layer included in the associated magneto-resistive element and the first magnetic layer, (b) the two or more non-magnetic conductive layers have the number of layers larger by one than the number of layers of the one or more ferromagnetic layers in the first magneto-resistive element, and each of the two or more non-magnetic conductive layers and each of the one or more ferromagnetic layers are alternately laminated in the first magneto-resistive element, (c) the two or more non-magnetic conductive layers have the number of layers larger by one than the number of layers of the one or more ferromagnetic layers in the second magneto-resistive element, and each of the two or more non-magnetic conductive layers and each of the one or more ferromagnetic layers are alternately laminated in the second magneto-resistive element, (d) at least one of the two or more non-magnetic conductive layers produces antiferromagnetic coupling between two layers adjacent to the associated non-magnetic conductive layer on both sides in the laminating direction in the first magneto-resistive element, (e) at least one of the two or more non-magnetic conductive layers produces antiferromagnetic coupling between two layers adjacent to the associated non-magnetic conductive layer on both sides in the laminating direction in the second magneto-resistive element, and (f) one of the number of times of the antiferromagnetic coupling produced between the third magnetic layer and the first magnetic layer in the magneto-resistive element, and the number of times of the antiferromagnetic coupling produced between the third magnetic layer and the first magnetic layer in the second magneto-resistive element is an odd number, and the other is an even number.

While the sixteenth to eighteenth aspects respectively enumerate specific examples of the fifteenth aspect, the fifteenth aspect is not limited to the sixteenth to eighteenth aspects.

A magnetic storage cell according to a nineteenth aspect of the present invention is arranged in a manner that, in any of the first to eighteenth aspects, information is read based on currents flowing through the first and second magneto-resistive elements.

A magnetic memory device according to a twentieth aspect of the present invention includes a plurality of magnetic storage cells for storing information, wherein each of the magnetic storage cells is a magnetic storage cell according to any of the first to nineteenth aspects.

According to the magnetic memory device in the twentieth aspect, since the magnetic memory device employs the magnetic storage cells according to any of the first to nineteenth aspects, in-phase noise can be removed from a read output by the single magnetic storage cell comprised of two magneto-resistive elements. In addition, the magnetic memory device can reduce a loss of the current magnetic field when information is written to efficiently produce the magnetization reversal. The magnetic memory device also offers a large storage capacity by reducing the area occupied by the magnetic storage cells, and is simple in structure to facilitate its manufacturing process.

BRIEF DESCRIPTION OF THE DRAWINGS

FIG. 7 is a circuit diagram illustrating a circuit configuration of the magnetic memory device illustrated in FIG. 1;

DESCRIPTION OF THE EMBODIMENTS

In the following, a magnetic storage cell and a magnetic memory device using the same according to the present invention will be described with reference to the accompanying drawings.

First, a magnetic memory device according to a first embodiment of the present invention will be described with reference FIG. 1 and the like.

Figure 1:
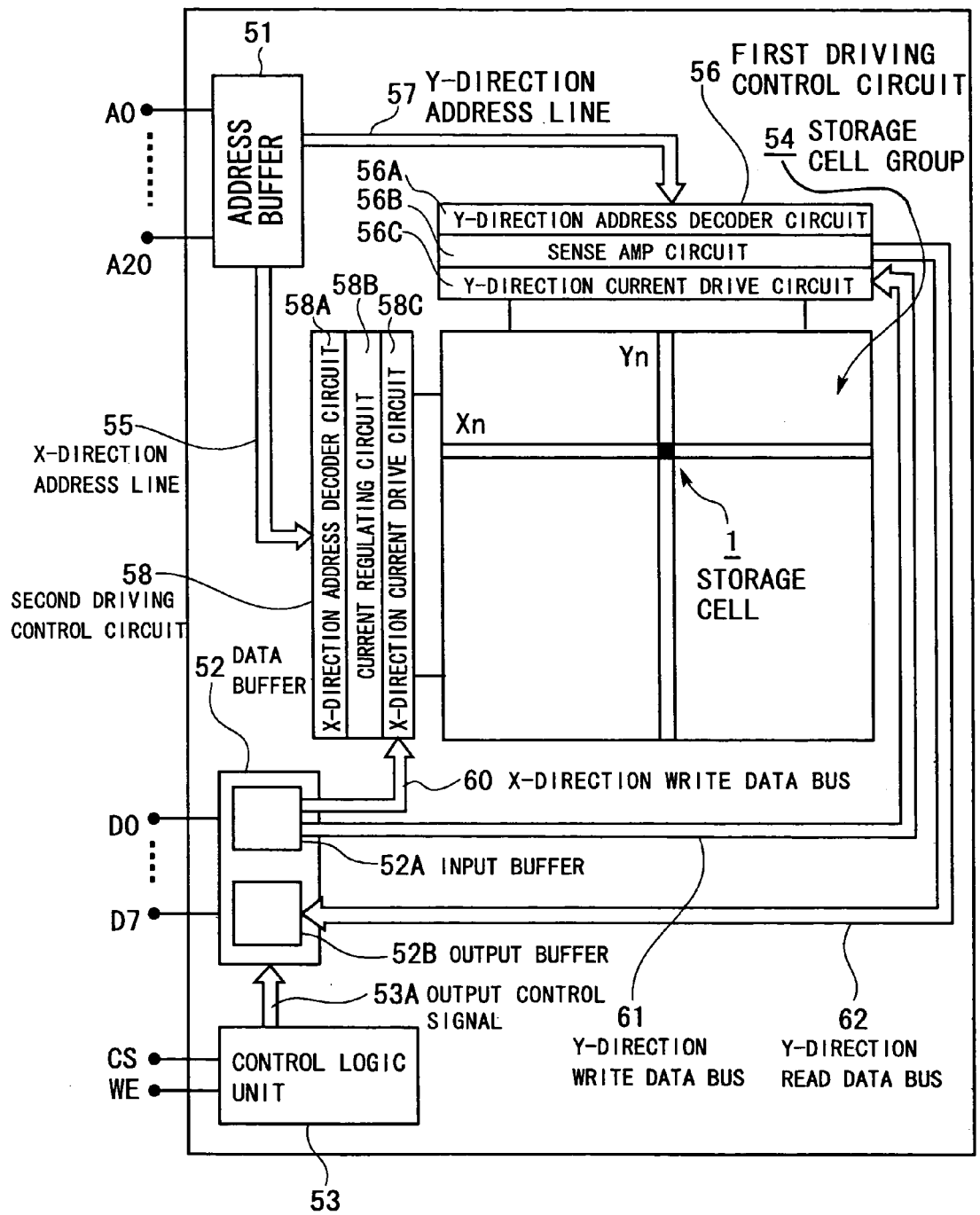
FIG. 1 is a block diagram schematically illustrating the whole configuration of a magnetic memory device according to a first embodiment of the present invention.

FIG. 1 is a block diagram schematically illustrating the whole configuration of a magnetic memory device according to a first embodiment of the present invention. The magnetic memory device according to the first embodiment comprises components illustrated in FIG. 1 mounted on a semiconductor chip to serve as MRAM.

The magnetic memory device according to the first embodiment comprises an address buffer 51, a data buffer 52, a control logic unit 53, a storage cell group 54, a first driving control circuit 56, a second driving control circuit 58, external address input terminals A0–A20, and external data terminals D0–D7.

The storage cell group 54 has a matrix structure in which a multiplicity of storage cells 1, each having two TMR elements (tunneling magneto-resistive elements), arranged in a word line direction (X-direction) and a bit line direction (Y-direction), orthogonal to each other. The storage cell 1 is a minimum unit for storing information (data) in the magnetic memory device, and represents a magnetic storage cell according to one embodiment of the present invention. The storage cell 1 will be described later in detail.

The first driving control circuit 56 has a Y-direction address decoder circuit 56A, a sense amp circuit 56B and a current drive circuit 56C, while the second driving control circuit 58 has an X-direction address decoder circuit 58A, a current regulating circuit 58B, and a current drive circuit 58C.

The address decoder circuits 56A, 58B select a word decode line 72 and a bit decode line 71, later described, in accordance with an inputted address signal. The sense amp circuit 56B and current regulating circuit 58B are driven when a read operation is performed, while the current drive circuits 56C, 58C are driven when a write operation is performed.

The sense amp circuit 56B and storage cell group 54 are connected through a plurality of bit decode lines 71 (later described) on which sense currents flow during a read operation. Similarly, the current regulating circuit 58B and storage cell group 54 are connected through a plurality of word decode lines 72 (later described) on which sense currents flow during a read operation.

The current drive circuit 56C and storage cell group 54 are connected through write bit lines 5 (later described) which are required during a write operation. Similarly, the current drive circuit 58C and storage cell group 54 are connected through write read lines 6 which are required during a write operation.

The address buffer 51 comprises external address input terminals A0–A20, and is connected to the Y-direction address decoder circuit 56A in the first driving control circuit 56 and to the X-direction address decoder circuit 58A in the second driving control circuit 58 through a Y-direction address line 57 and an X-direction address line 55, respectively. The address buffer 51 fetches an address signal from the outside through the external address input terminals A0–A20, and amplifies the address signal by a buffer amplifier (not shown) disposed therein to a voltage level which is required in the Y-direction address decoder circuit 56A and X-direction address decoder circuit 58A. Further, the address buffer 51 divides the amplified address signal into two, one of which is delivered to the Y-direction address decoder circuit 56A through the Y-direction address line 57, and the other of which is delivered to the X-direction address decoder circuit 58A through the X-direction address line 55.

The data buffer 52, which is comprised of an input buffer 52A and an output buffer 52B, comprises external data terminals D0–D7, and is connected to the control logic unit 53 such that the data buffer 52 operates in response to an output control signal 53A from the control logic unit 53. The input buffer 52A is connected to the Y-direction current drive circuit 56C in the first driving control circuit 56 and to the X-direction current drive circuit 58C in the second driving control circuit 58 through the Y-direction and X-direction write data buses 61, 60, respectively. For performing a write operation into the storage cell group 54, the input buffer 52A fetches signal voltages at the external data terminals D0–D7, amplifies the fetched signal voltages to required voltage levels by an internal buffer amplifier (not shown), and thereafter transmits the amplified signal voltages to the X-direction current drive circuit 58C and Y-direction current drive circuit 56C through the X-direction write data bus 60 and Y-direction write data bus 61, respectively. The output buffer 52B is connected to the sense amp circuit 56B through a Y-direction read data bus 62. For reading an information signal stored in the storage cell group 54, the output buffer 52B amplifies the information signal inputted from the sense amp circuit 56B by a buffer amplifier (not shown) disposed therein, and outputs the amplified information signal to the external data terminals D0–D7 at a low impedance.

The control logic unit 53, which comprises a chip select terminal CS and a write enable terminal WE, is connected to the data buffer 52. The control logic unit 53 fetches a signal voltage from the chip select terminal CS for selecting a plurality of storage cells intended for a read and a write from the storage cell group 54, and also fetches a signal voltage from the write enable terminal WE for outputting a write enable signal, and outputs the output control signal 53A to the data buffer 52.

Next, description will be made on the configuration involved in an information write operation in the magnetic memory device according to the first embodiment.

Figure 2:
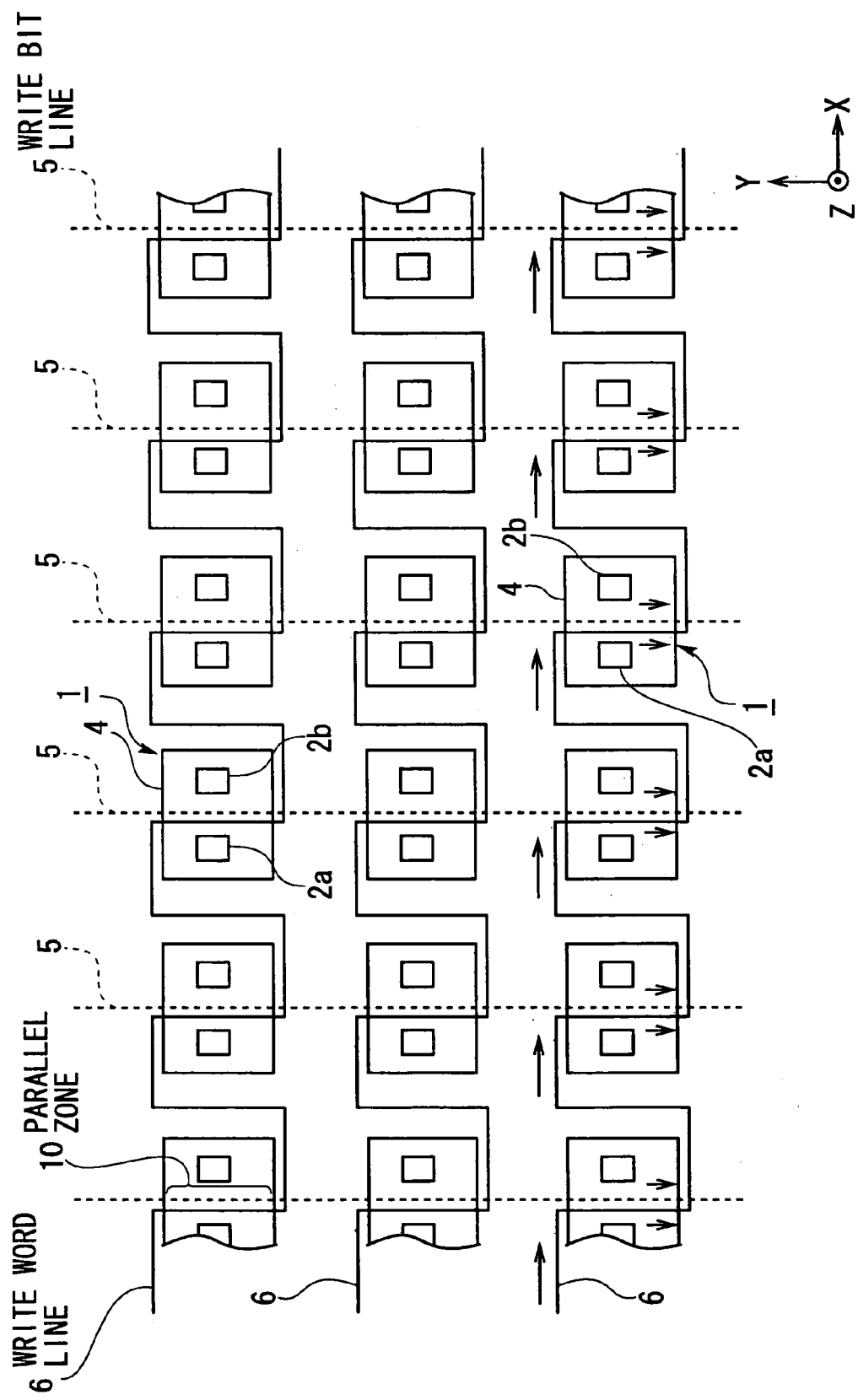
FIG. 2 is a diagram schematically showing the relationship between write lines and storage cells in the magnetic memory device illustrated in FIG. 1.

FIG. 2 is a conceptual diagram representing the configuration of a main portion, in a plan view, associated with a write operation in the storage cell group 54. As illustrated in FIG. 2, the magnetic memory device according to the first embodiment includes a plurality of write bit lines (conductors) 5, and a plurality of write word lines (conductors) 6 which intersect with the plurality of write bit lines 5, respectively. A parallel zone 10 is defined in each region in which a write bit line 5 intersects with a write word line 6. In the parallel zone 10, the write bit line 5 and write word line 6 extend in parallel with each other. Specifically, as illustrated in FIG. 2, each of the write word lines 6 extends along the X-direction in the shape of rectangular wave, while each of the write bit lines 5 extends along the Y-direction in a linear shape. Falling edges of the rectangular wave shape in the write word lines 6 form a plurality of parallel zones 10 together with the write bit lines 5. Each storage cell 1 is disposed near each parallel zone 10.

Each storage cell 1 has two TMR elements 2a, 2b and an annular magnetic layer 4. The two TMR elements 2a, 2b in one storage cell 1 are each comprised of a laminate, and are disposed in a direction along a laminating surface (in the X-direction in the first embodiment) with respect to each other. One write bit line 5 and one write word line 6, i.e., a total of two conductors (particularly, the parallel zone 10 thereof) are commonly provided for the two TMR elements 2a, 2b in one storage cell 1. The annular magnetic layer 4 is disposed on one surface side (on the lower side (−Z direction side) in the first embodiment) of the laminates which comprise the two TMR elements 2a, 2b, respectively. In the first embodiment, the annular magnetic layer 4 implements a first magnetic layer which forms a magnetic path for a current magnetic field generated by one write bit line 5 and one write word line 6 which are commonly provided for the two TMR elements 2a, 2b in one storage cell 1. However, in the present invention, such a magnetic layer is not limited to the annular magnetic layer 4, but may form a closed magnetic path, a portion of which is removed.

The write bit lines 5 and write word lines 6 are applied with currents from the Y-direction current drive circuit 56C and X-direction current drive circuit 58C, respectively. Exemplary directions of the currents flowing through the write bit lines 5 and write word lines 6 are indicated by arrows in FIG. 2.

Figure 3:
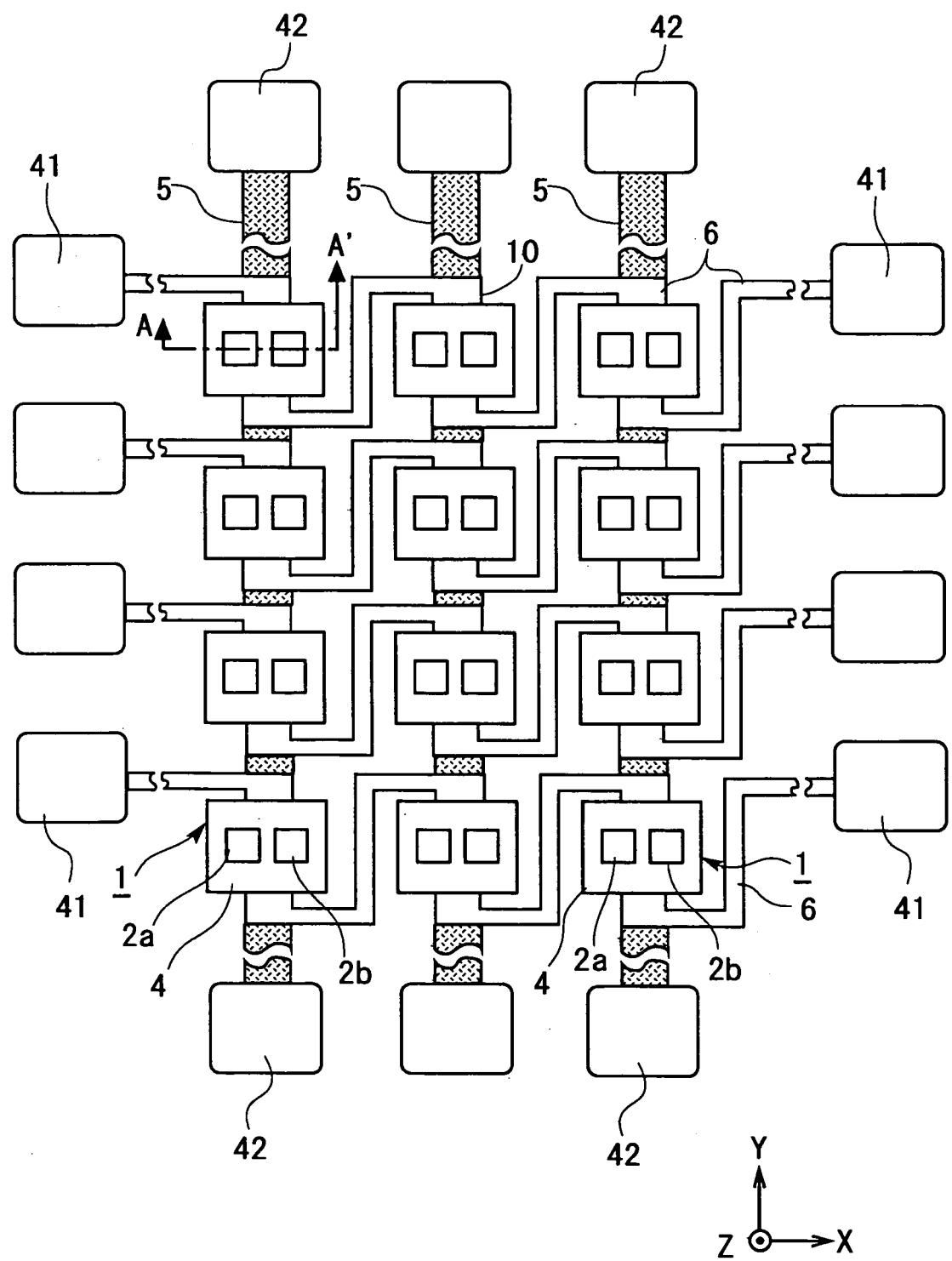
FIG. 3 is a partial plan view illustrating the structure of a main portion of the storage cell group in the magnetic memory device illustrated in FIG. 1.

FIG. 3 more specifically represents the structure of the main portion of the storage cell group 54 in a plan view. In FIG. 3, components identical to those in FIG. 1 are designated by the same reference numerals. As described above, each storage cell 1 is disposed near the parallel zone 10 defined by the write bit line 5 and write word line 6. A magnetic field (current magnetic field) generated by the currents flowing through both the write bit line 5 and write word line 6 in the parallel zone 10 passes through the annular magnetic layer 4, and the current magnetic field causes a change in magnetization direction of the annular magnetic layer 4. In this event, the write bit line 5 and write word line 6 in the parallel zone 10 are disposed at positions substantially matching on an XY-plane, but are disposed to define a certain spacing therebetween in the Z-direction so that they are electrically insulated from each other.

Each write bit line 5 is provided with write bit line lead-out electrodes 42 at both ends, respectively. The write bit line lead-out electrode 42 at one end of each write bit line 5 is connected to the Y-direction current drive circuit 56C, and The write bit line lead-out electrode 42 at the other end of each write bit line 5 is connected to be eventually grounded. Similarly, each write word line 6 is provided with write word line lead-out electrodes 41 at both ends, respectively. The write word lead-out electrode 41 at one end of each write word line 6 is connected to the X-direction current drive circuit 58C, and The write word lead-out electrode 41 at the other end of each write word line 6 is connected to be eventually grounded.

Figure 4A:
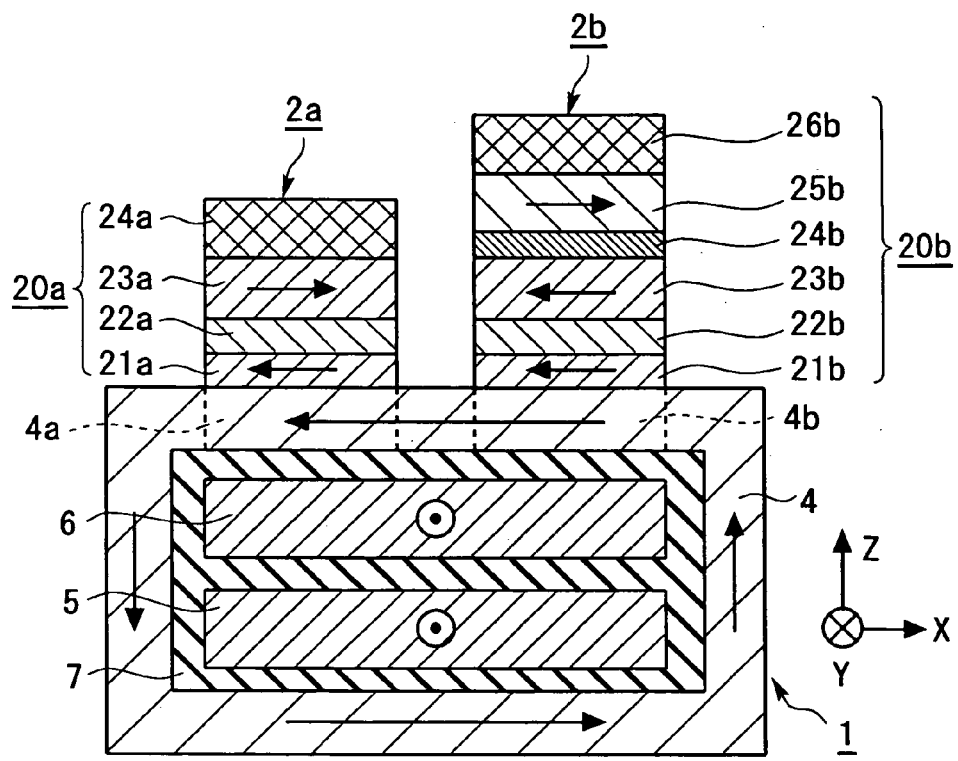
FIGS. 4A, 4B are cross-sectional views taken along a line A–A' in FIG. 3 in a direction indicated by arrows.
Figure 4B:
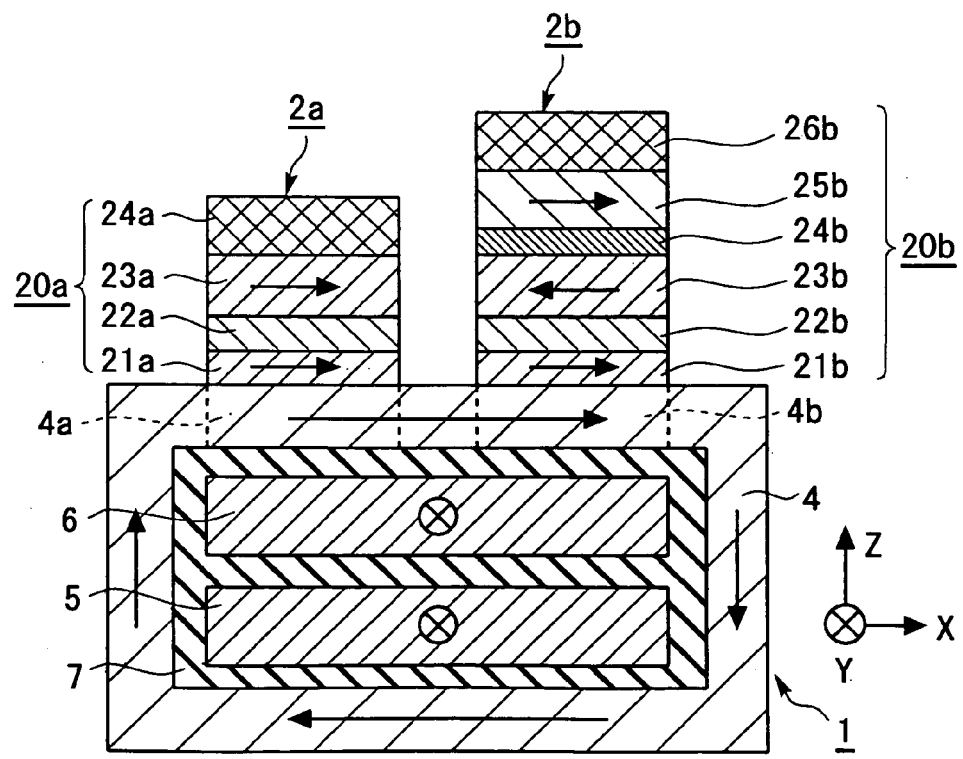

FIGS. 4A and 4B illustrate the structure of the storage cell 1 represented in FIG. 3 in a cross-sectional view taken along a section line A–A' in FIG. 3 and viewed in a direction indicated by arrows. FIG. 4A also shows the magnetization direction of each component when a write current flows through the write bit line 5 and write word line 6 in the −Y direction. FIG. 4B also shows the magnetization direction of each component when a write current flows through the write bit line 5 and write word line 6 in the +Y direction.

As illustrated in FIGS. 4A and 4B, the storage cell 1 comprises the two TMR elements 2a, 2b, and the annular magnetic layer 4 provided commonly for the TMR elements 2a, 2b. In the first embodiment, the TMR element 2a is comprised of a laminate made up of a laminated composite 20a laminated on the top surface (surface in the +Z-direction) of the annular magnetic layer 4. The TMR element 2b is comprised of a laminate made up of a laminated composite 20b laminated on the top surface (surface in the +Z-direction) of the annular magnetic layer 4. In this way, the annular magnetic layer 4 is disposed on the lower surface side (−Z-direction side) of the laminates which comprise the TMR elements 2a, 2b, respectively so as to be common to the TMR elements 2a, 2b. The annular magnetic layer 4 is disposed to have an axial direction (in the Y-direction in the first embodiment) defined in a direction along the laminating surface, and is passed through by a total of two conductors (write lines in the first embodiment), i.e., one write bit line 5 and one write word line 6 provided commonly for the two TMR elements 2a, 2b. In this way, the annular magnetic layer 4 forms a magnetic path for a current magnetic field generated by the write bit line 5 and write word line 6. The high/low states of the electric resistances of the TMR elements 2a, 2b change simultaneously based on the current magnetic field passing through the annular magnetic layer 4. It should be noted that the annular magnetic layer 4, write bit line 5 and write word line 6 are electrically insulated from one another by an insulating layer 7. For clarifying the film structure of the laminated composites 20a, 20b in FIGS. 4A and 4B, the laminated composites 20a, 20b are drawn at a higher scaling factor to appear larger relative to their surroundings for purposes of emphasis.

The laminates comprised of the laminated composites 20a, 20b which construct the TMR elements 2a, 2b, respectively, are disposed in a direction (in the X-direction in the first embodiment) along the laminating surface with respect to each other, such that a current flows through each of the laminates in a direction perpendicular to the laminating surface.

In the first embodiment, the laminated composite 20a comprises a magnetic layer (third magnetic layer) 21a, the magnetization direction of which changes in response to an external magnetic field; a tunnel barrier layer 22a; a magnetic layer (second magnetic layer) 23a, the magnetization direction of which is fixed in the +X-direction; and an antiferromagnetic layer 24a for fixing the magnetization direction of the magnetic layer 23a immediately therebelow in the +X-direction by an exchange coupling bias field. These layers are laminated in this order from the annular magnetic layer 4. The magnetic layers 21a, 23a are made of ferromagnetic materials, respectively. The TMR element 2a has an electric resistance which is high when the magnetization directions of the magnetic layers 21a, 23a are antiparallel with each other as illustrated in FIG. 4A, and which is low when the magnetization directions of the magnetic layers 21a, 23a are parallel with each other as illustrated in FIG. 4B.

The laminated composite 20b comprises a magnetic layer (third magnetic layer) 21b, the magnetization direction of which changes in response to an external magnetic field; a tunnel barrier layer 22b; a magnetic layer (second magnetic layer) 23b, the magnetization direction of which is fixed in the −X-direction; a bilayer film composed of a lower non-magnetic conductive layer 24b and an upper ferromagnetic layer 25b; and an antiferromagnetic layer 26b for fixing the magnetization direction of the ferromagnetic layer 25b immediately therebelow in the +X-direction by an exchange coupling bias field. These layers are laminated in this order from the annular magnetic layer 4. The magnetic layers 21b, 23b are made of ferromagnetic materials, respectively. The TMR element 2b has an electric resistance which is low when the magnetization directions of the magnetic layers 21b, 23b are parallel with each other as illustrated in FIG. 4A, and which is high when the magnetization directions of the magnetic layers 21b, 23b are antiparallel with each other as illustrated in FIG. 4B. The non-magnetic conductive layer 24b is designed to produce antiferromagnetic coupling between the layers 23b, 24b on both sides thereof in the laminating direction by selecting an appropriate material, thickness and the like therefor. Therefore, although the antiferromagnetic layer 26b fixes the magnetization direction of the ferromagnetic layer 25b immediately therebelow in the +X-direction (in the same direction in which the antiferromagnetic layer 24a fixes the magnetization direction of the magnetic field 23a immediately therebelow), the bilayer composed of the layer 24b, 25b is interposed between the magnetic layer 23b and antiferromagnetic layer 26b to cause antiferromagnetic coupling an odd number of times (once in the first embodiment) therebetween to set the magnetization direction of the magnetic layer 23b in the −X-direction.

In the first embodiment, with the employment of the foregoing layered structure, the magnetization directions of the magnetic layers 23a, 23b, which affect the high/low states of the electric resistances of the TMR elements 2a, 2b, respectively, are fixed in antiparallel (in opposite orientations) with each other.

The magnetic layers 21a, 21b are magnetically exchange-coupled to connection portions 4a, 4b, respectively, which are parts of the annular magnetic layer 4, directly in contact with the magnetic layers 21a, 21b, respectively. Therefore, the magnetic layers 21a, 21b have the same magnetization directions as the magnetization directions of the connection portions 4a, 4b, respectively. For this reason, the magnetization directions of the magnetic layers 21a, 21b change to be in parallel with each other (in the same orientation) in response to the directions of the magnetic fields passing through the connection portions 4a, 4b which are determined by the directions of the currents flowing through the write bit line 5 and write word line 6, as illustrated in FIGS. 4A and 4B.

The annular magnetic layer 4 is made of a material such as NiFe or the like, by way of example. The magnetic layers 21a, 23a, 21b, 23b, 25b are made of a material, for example, Fe, Co, Ni, FeCo, NiFe, CoZrNb, FeCoNi, or the like. The tunnel barrier layers 22a, 22b are made of a material, for example, $Al_2O_3$, NiO, GdO, MgO, $Ta_2O_5$, $MoO_2$, $TiO_2$, $WO_2$, or the like. The antiferromagnetic layers 24a, 26b are made of a material, for example, PtMn, IrMn, RuRhMn, FeMn, NiMn, PdPtMn, RhMn, CrMnPt, or the like. The non-magnetic conductive layer 24b is made of a material, for example, Ru, Cu, or the like. The magnetic layers 21a, 21b and magnetic layers 23a, 23b preferably have axes of easy magnetization in parallel in order to stabilize the magnetization directions of the magnetic layers 21a, 21b and magnetic layers 23a, 23b in parallel or in antiparallel with each other.

As illustrated in FIG. 4A, when write currents flow through the write bit line 5 and write word line 6 both in the −Y-direction, a current magnetic field is generated by the write bit line 5 and write word line 6 within the annular magnetic layer 4 in the counter-clockwise direction, causing the magnetization directions of the magnetic layers 21a, 21b to be both in the −X-direction. Therefore, since the magnetization directions of the magnetic layers 23a, 23b are fixed in the +X-direction and −X-direction, respectively, the magnetic layers 21a, 23a of the TMR element 2a have the magnetization directions which are antiparallel with each other to result in a higher electric resistance of the TMR element 2a, while the magnetic layers 21b, 23b of the TMR element 2b have the magnetization directions which are parallel with each other to result in a lower electric resistance of the TMR element 2b.

Also, as illustrated in FIG. 4B, when write currents flow through the write bit line 5 and write word line 6 both in the +Y-direction, a current magnetic field is generated by the write bit line 5 and write word line 6 within the annular magnetic layer 4 in the clockwise direction, causing the magnetic directions of the magnetic layers 21a, 21b to be both in the +X-direction. Therefore, since the magnetization directions of the magnetic layers 23a, 23b are fixed in the +X-direction and −X-direction, respectively, the magnetic layers 21a, 23a of the TMR element 2a have the magnetization directions which are parallel with each other to result in a lower electric resistance of the TMR element 2a, while the magnetic layers 21b, 23b of the TMR element 2b have the magnetization directions which are antiparallel with each other to result in a higher electric resistance of the TMR element 2b.

In such a complementary relationship of the high-low states of the electric resistances of the TMR elements 2a, 2b, information (for example, binary information which takes "1" or "0") can be stored. For example, information can be stored in the storage cell 1 by corresponding the state illustrated in FIG. 4A to "1" and the state illustrated in FIG. 4B to "0."

When write currents flow through the write bit line 5 and write word line 6 in opposite directions to each other, or when a write current flows only on one of the write bit line 5 and write word line 6, the magnetization direction of each magnetic layer 21a, 21b is not reversed, so that data is not rewritten.

Next, description will be made on the configuration involved in an information read operation in the magnetic memory device according to the first embodiment.

Figure 5:
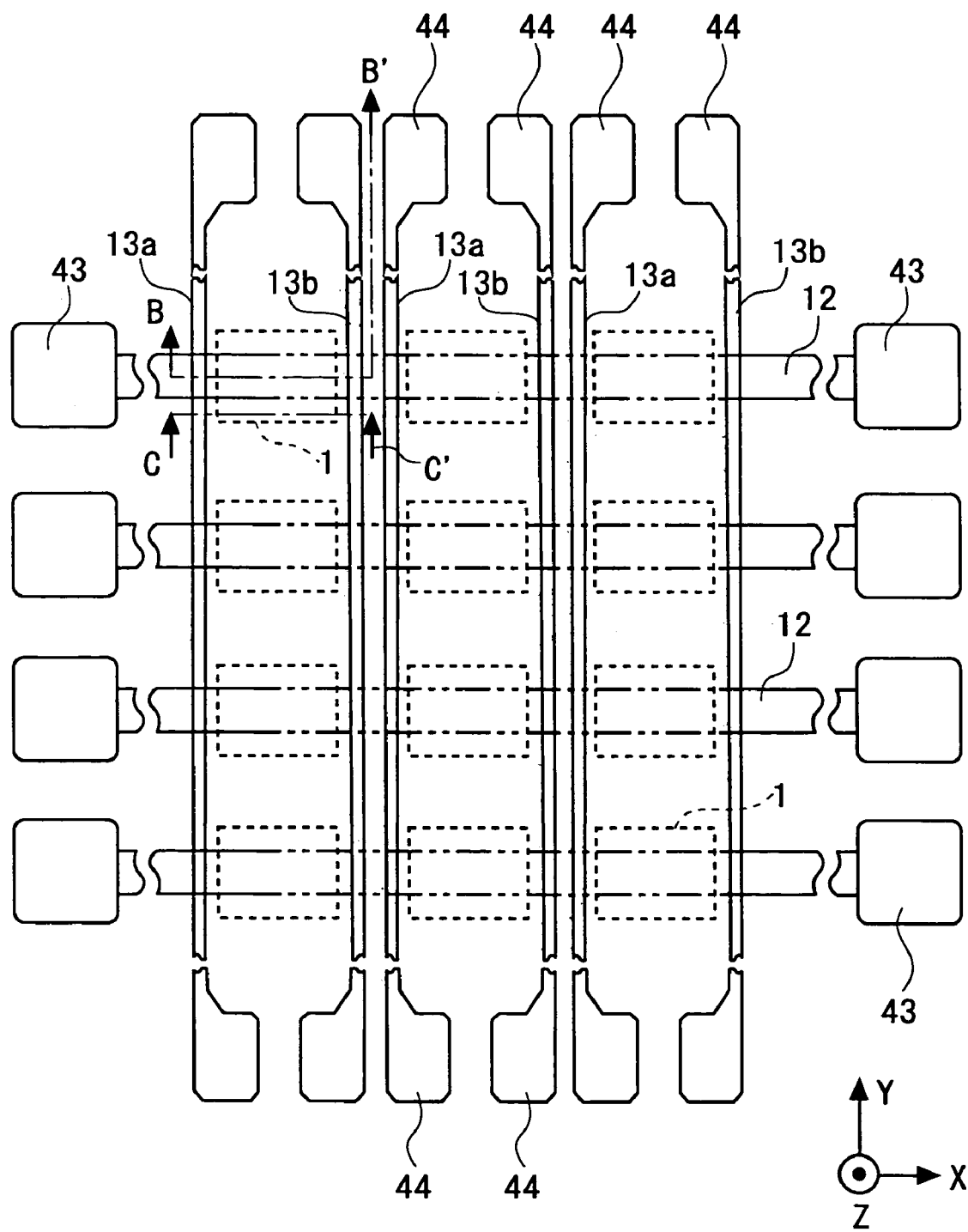
FIG. 5 is a another partial plan view illustrating the structure of a main portion of the storage cell group in the magnetic memory device illustrated in FIG. 1.

FIG. 5 illustrates the configuration of a main portion, in a plan view, associated with a read operation in the storage cell group 54, and corresponds to FIG. 3. For each storage cell 1, a plurality of read word lines 12 and a plurality of read bit lines 13 are disposed on the XY-plane in a positional relationship as illustrated in FIG. 5. Here, the laminated composites 20a, 20b of the TMR elements 2a, 2b in the storage cell 1 have their top surfaces (in the +Z-direction) electrically connected to a pair of read bit lines 13a, 13b through a pair of Schottky diodes 75a, 75b, while the laminated composites 20a, 20b of the TMR elements 2a, 2b have their lower surfaces (in the −Z-direction) electrically connected to the read word line 12 through the annular magnetic layer 4. Each of the read bit lines 13a, 13b supplies a read current to each of the two TMR elements 2a, 2b in each storage cell 1, and the read word line 12 leads the read current which has flowed through each of the TMR elements 2a, 2b to the ground. Each bit line 13 is provided with read bit line lead-out electrodes 44 at both ends, respectively. On the other hand, each read word line 12 is provided with read word line lead-out electrodes 43 at both ends, respectively.

Figure 6A:
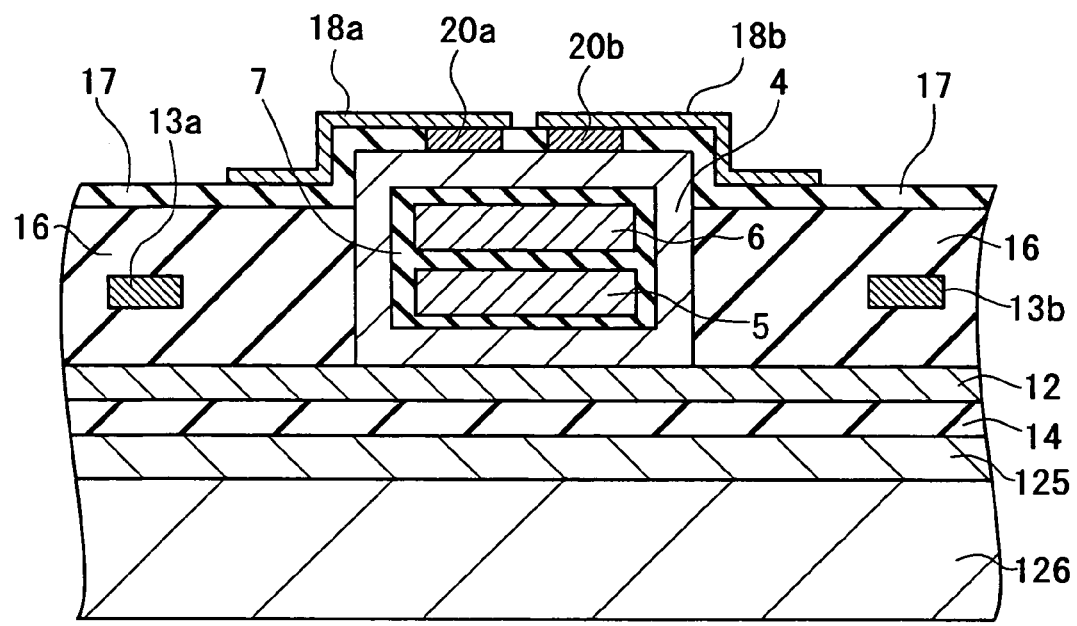
FIGS. 6A, 6B are cross-sectional views generally illustrating a storage cell in the magnetic memory device illustrated in FIG. 1.
Figure 6B:
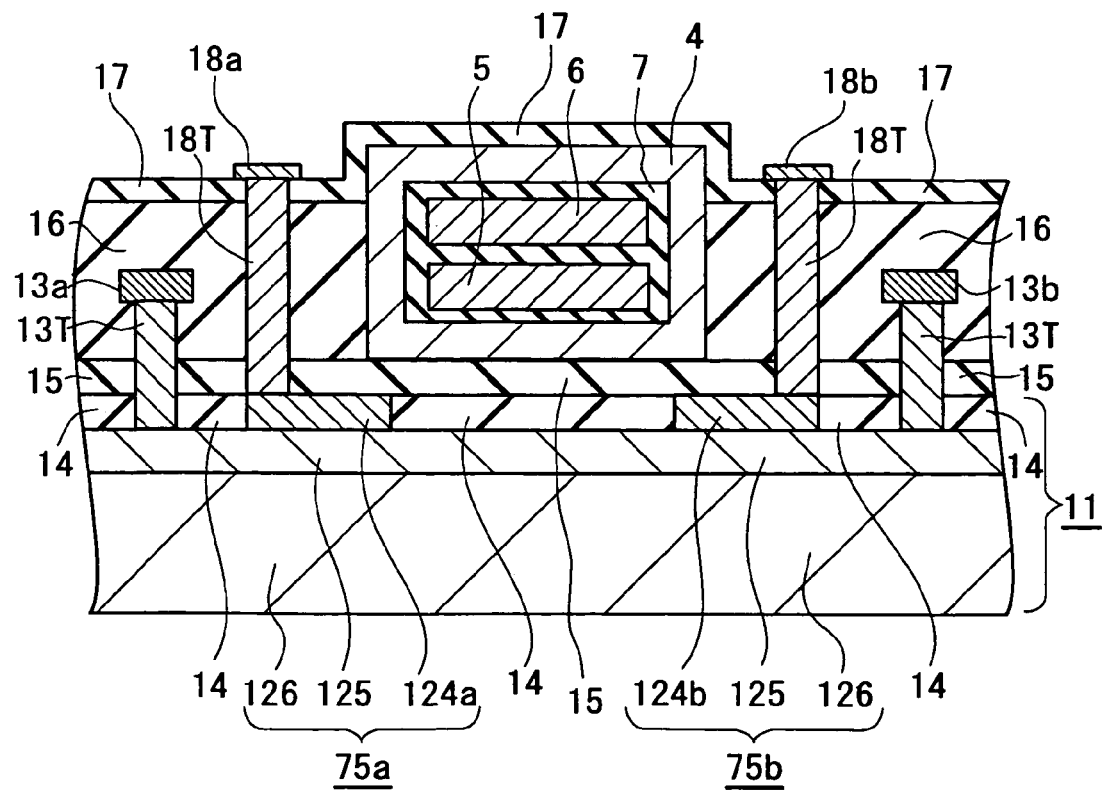

FIG. 6A illustrates the structure of the storage cell 1 in a cross-sectional view taken along a section line B–B' in FIG. 5 and viewed in a direction indicated by arrows. FIG. 6B illustrates the structure of the storage cell 1 in a cross-sectional sectional view taken along a section line C–C' in FIG. 5 and viewed in a direction indicated by arrows. As illustrated in FIGS. 6A and 6B, the magnetic memory device according to the first embodiment comprises the annular magnetic layer 4 and the two laminated composites 20a, 20b formed in order on a base 11 which is provided with a pair of Schottky diodes 75a, 75b (hereinafter simply called the "diodes 75a, 75b"), which function as rectifier elements, in a region near the storage cell 1.

The pair of diodes 75a, 75b have conductive layers 124a, 124b, an epitaxial layer 125, and a substrate 126 in order from the annular magnetic layer 4, and have a Schottky barrier formed between the conductive layers 124a, 124b and epitaxial layer 125. The diodes 75a, 75b are configured not to have an electric connection to each other except that they are connected to the annular magnetic layer 4 through an interlayer connection layer 18T, connection layers 18a, 18b, and laminated composites 20a, 20b. The substrate 126 is an n-type silicon wafer. Generally, an n-type silicon wafer is diffused with phosphor (P) impurities, and the substrate 126 used herein is diffused with phosphor in a high concentration to exhibit a $n^{++}$-type. On the other hand, the epitaxial layer 125 is diffused with phosphor in a low concentration to exhibit an $n^{-}$-type. The epitaxial layer 125 made of an $n^{-}$-type semiconductor is brought into contact with the conductive layers 24a, 24b made of metal to produce a band gap and form a Schottky barrier. Further, the pair of diodes 75a, 75b are connected to the read bit lines 13a, 13b through the interlayer connection layers 13T, respectively. In FIGS. 6A, 6B, the reference numerals 14–17 denote insulating layers.

Referring next to FIG. 7, description will be made on a circuit configuration involved in a read operation in the magnetic memory device according to the first embodiment.

FIG. 7 is a diagram illustrating the circuit configuration of a circuit system which comprises the storage cell group 54 and a read circuit associated therewith. This read circuit system is a differential amplification type system in which the storage cell 1 is comprised of two TMR elements 2a, 2b. Here, information in each storage cell 1 is read by outputting a differential value of read currents respectively applied to the TMR elements 2a, 2b (currents flowing from the read bit lines 13a, 13b into the TMR elements 2a, 2b, respectively, and exit from the common read word line 12).

In FIG. 7, the storage cells 1 per bit column of the storage cell group 54, and a portion of a read circuit including the sense amp circuit 56B make up a unit read circuit 80 ( . . . , 80n, 80n+1, . . . ) which is a repetitive unit of the read circuit. Such unit read circuits 80n are arranged in parallel in the bit column direction. Each of the unit read circuits 80 is connected to the Y-direction address decoder circuit 56A through the bit decode line 71 ( . . . , 71n, 71n+1, . . . ), and connected to the output buffer 52B through the Y-direction read data bus 62.

The storage cell group 54 is wired in the form of matrix by read word lines 12 ( . . . , 12m, 12m+1, . . . ) arranged in the X-direction, and a pair of read bit lines 13a, 13b arranged in the Y-direction. Each storage cell 1 is disposed at an intersection with the read word line 12 in a region sandwiched by the pair of read bit lines 13a, 13b. Each of the TMR elements 2a, 2b in each storage cell 1 has one end connected to the read bit lines 13a, 13b through a pair of diodes 75a, 75b, and the other end connected to a common read word line 12.

Each of the word lines 12 has one end connected to each read switch 83 ( . . . , 83m, 83m+1, . . . ) through a read word line lead-out electrode 43, and further connected to a common current regulating circuit 58B. Each read switch 83 is connected to the X-direction address decoder circuit 58A through the word decode line 72 ( . . . , 72m, 72m+1, . . . ), and is configured to become conductive when a selection signal is applied from the X-direction address decoder circuit 58A. The current regulating circuit 58B has a function of making constant a current which flows through the read word line 12.

Each of the bit lines 13a, 13b has one end connected to the sense amp circuit 56B through the read bit line lead-out electrode 44, and the other end eventually grounded. The sense amp circuits 56B are provided one for each unit read circuit 80, and each has a function of fetching a potential difference between the pair of read bit lines 13a, 13b in each unit read circuit 80, and amplifying the potential difference. Each sense amp circuit 56B is connected to an associated output line 82 ( . . . , 82n, 82n+1, . . . ).

Referring next to FIGS. 1, 7 and 8, description will be made on a read operation in the magnetic memory device according to the first embodiment.

First, the Y-direction address decoder circuit 56A in the first driving control circuit 56 selects one of the plurality of bit decode lines 71, and transmits a control signal to an associated sense amp circuit 56B. As a result, a read current flows through the read bit lines 13a, 13b to provide a positive potential to the +Z-direction side of the TMR elements 2a, 2b. Similarly, the X-direction address decoder circuit 58A in the second driving control circuit 58 selects one of the plurality of word decode lines 72, and drives the read switch 83 at a corresponding location. The selected read switch 83 becomes conductive, causing a read current to flow through an associated read word line 12 to provide a negative potential to the –Z-direction side of the TMR elements 2a, 2b. Therefore, a read current required for reading can be applied to one storage cell 1 selected by the Y-direction address decoder circuit 56A and X-direction address decoder circuit 58A. Based on the read current, the magnetization directions of the magnetic layers 21a, 21b can be detected to read stored information. Here, the read currents from the read bit lines 13a, 13b flow into the storage cell 1 after they pass through the diodes 75a, 75b, respectively. In this way, unwanted introduction of currents from storage cells 1, not intended for reading, is blocked by the pair of diodes 75a, 75b between the pair of read bit lines 13a, 13b and the pair of TMR elements 2a, 2b on the respective current paths of the read currents supplied to the two TMR elements 2a, 2b. Each of the Schottky diodes 75a, 75b may be replaced with another rectifier element such as a PN junction diode, a bipolar transistor, a MOS transistor, or the like, in which case similar advantages can be provided. However, in the present invention, such a rectifier element is need not be necessarily required is not necessarily limited to the examples need not be necessarily required.

Figure 8A:
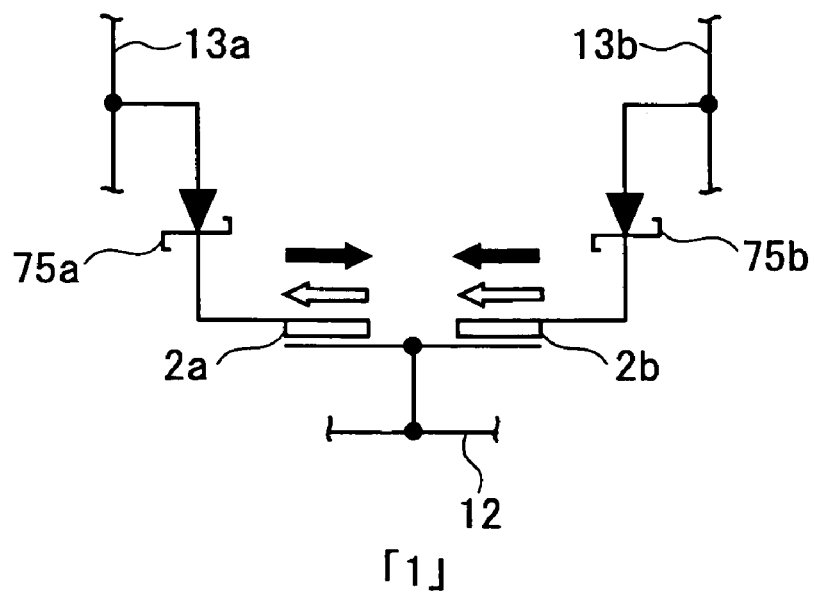
FIGS. 8A, 8B are partially enlarged views in the circuit configuration illustrated in FIG. 7.
Figure 8B:
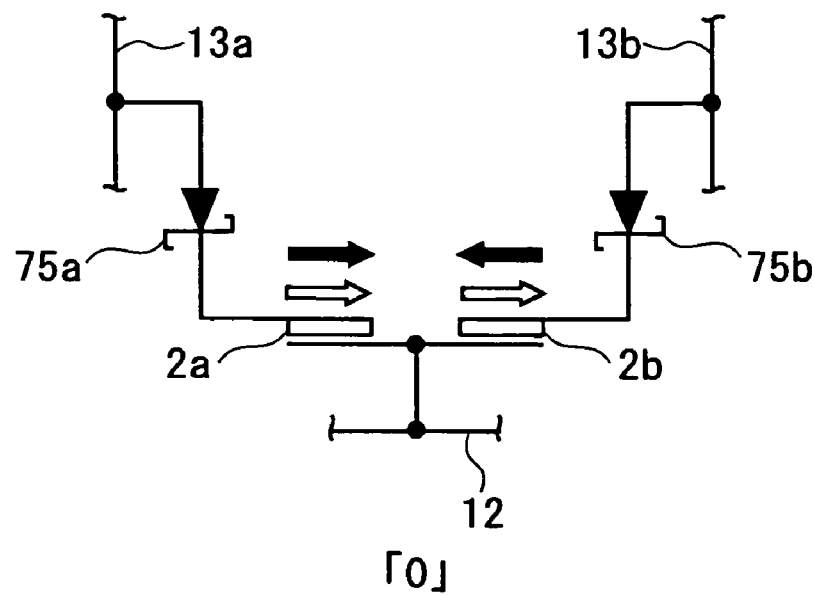

FIGS. 8A and 8B are circuit diagrams each illustrating a peripheral portion of the storage cell 1. White arrows indicate the magnetization directions of the respective magnetic layers 21a, 21b of the TMR elements 2a, 2b, and black arrows indicate the magnetization directions of the magnetic layers 23a, 23b. In the state illustrated either in FIG. 8A or in FIG. 8B, the magnetization direction of the magnetic layer 23a is fixed in the right-hand direction, and the magnetization direction of the magnetic layer 23b is fixed in the left-hand direction. In FIG. 8A, the magnetization directions of the magnetic layers 21a, 23a are antiparallel with each other in the TMR element 2a, while the magnetization directions of the magnetic layers 21b, 23b are in parallel with each other in the TMR element 2b. In this event, the TMR element 2a has a higher resistance, while the TMR element 2b has a lower resistance, corresponding, for example, to information "1." On the other hand, in the state illustrated in FIG. 8B, reverse to the state illustrated in FIG. 8A, the TMR element 2a has a lower resistance, while the TMR element 2b has a higher resistance, corresponding, for example, to information "0." Such binary information can be read by detecting a difference between currents respectively flowing through the TMR elements 2a, 2b, taking advantage of the high/low resistances of the TMR elements 2a, 2b.

Referring next to FIGS. 9 to 36, description will be made on an exemplary method of manufacturing the magnetic memory device according to the first embodiment, particularly, the storage cell 1. FIGS. 9 to 36 are cross-sectional views illustrating steps in the manufacturing method. FIGS. 9A, 10A, and 11 to 36 correspond to FIG. 6A, while FIGS. 9B and 10B correspond to FIG. 6B. Each of FIGS. 27 to 35 illustrates a main portion in enlarged view. FIG. 9C is a cross-sectional view taken along a line D–D' in FIG. 9A. FIG. 10C is a cross-sectional view taken along a line E–E' in FIG. 10A, and corresponds to FIG. 9C.

In the following description, steps for forming interlayer connection layers 13T, 18T, read bit lines 13a, 13b, and the like in FIG. 6 are omitted.

Figure 9A:
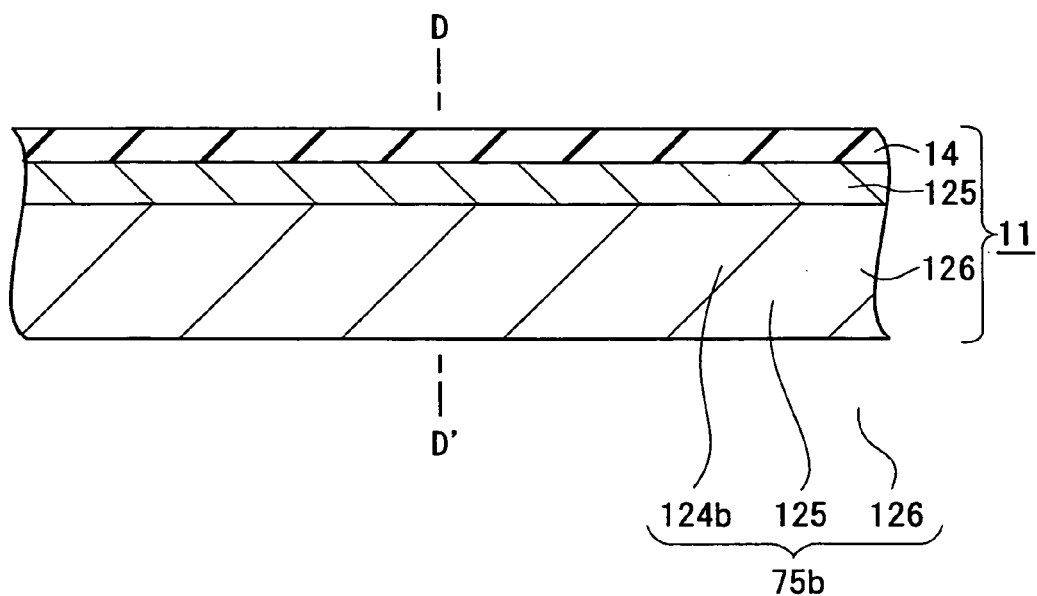
FIGS. 9A–9C are partially enlarged cross-sectional views illustrating a step in a method of manufacturing the magnetic memory device illustrated in FIG. 1.
Figure 9B:
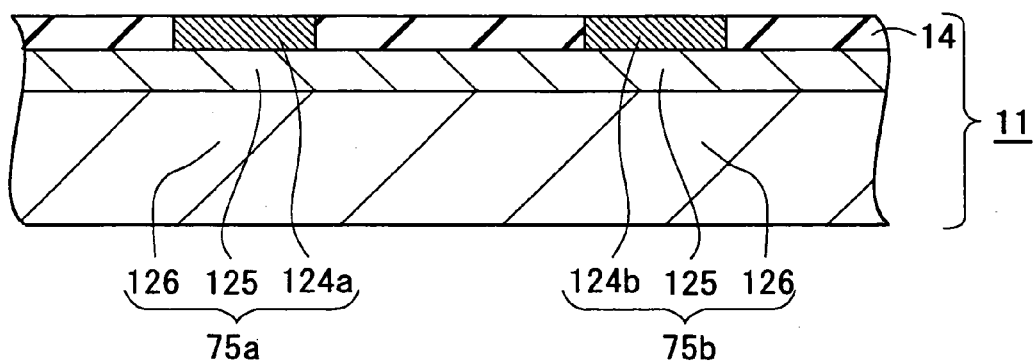
Figure 9C:
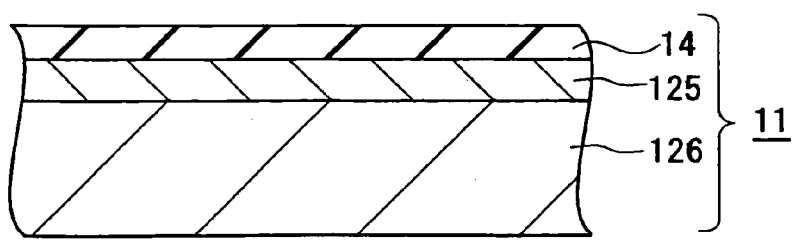
Figure 10A:
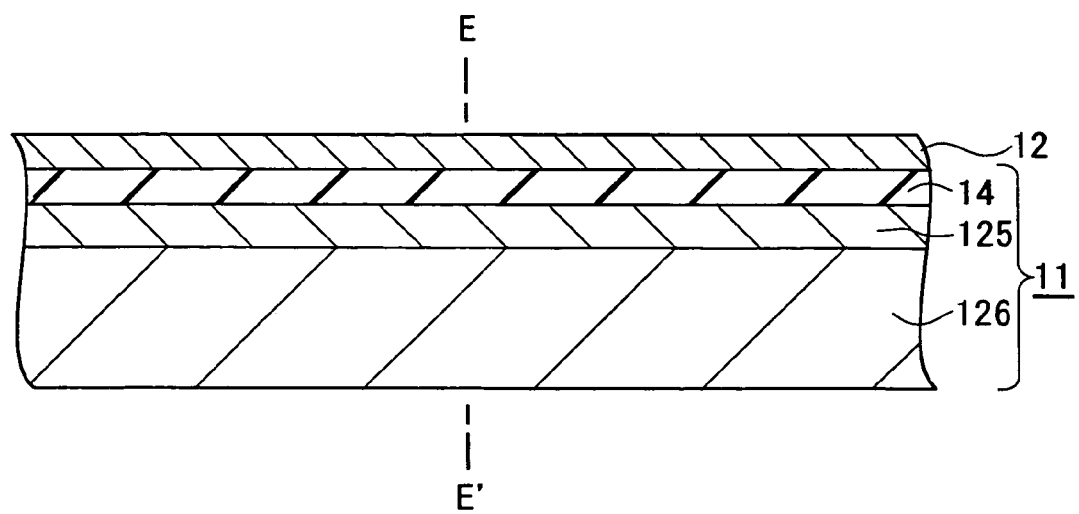
FIGS. 10A–10C are partially enlarged cross-sectional views illustrating a step subsequent to the step of FIGS. 9A–9C.
Figure 10B:
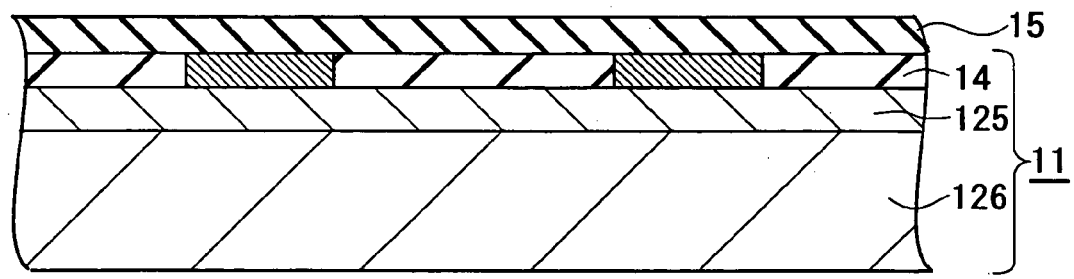
Figure 10C:
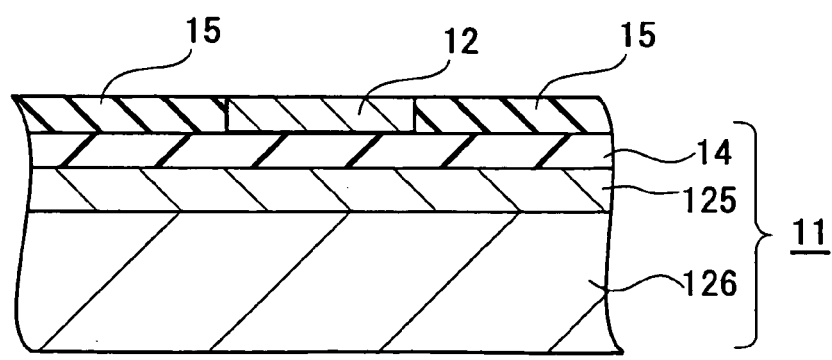

First, a base 11 embedded with Schottky diodes 75a, 75b is provided (FIGS. 9A, 9B, 9C). Next, a read word line 12 is selectively formed on the base 11, and an insulating layer 15 is formed around the read word line 12 (FIGS. 10A, 10B, 10C). Specifically, a metal layer made of Ti or the like is selectively formed by a lift-off method or the like to form the read word line 12. Next, a CVD apparatus is used to form the insulating layer 15 made of $SiO_2$ or the like such that the read word line 12 is entirely covered with the insulating layer 15. Subsequently, the surface is polished for planarization by a CMP apparatus so that the surface of the read word line 12 is exposed.

Figure 11:
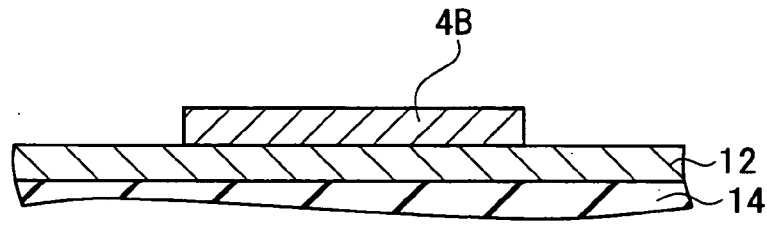
FIG. 11 is a partially enlarged cross-sectional view illustrating a step subsequent to the step of FIGS. 10A–10C.
Figure 12:
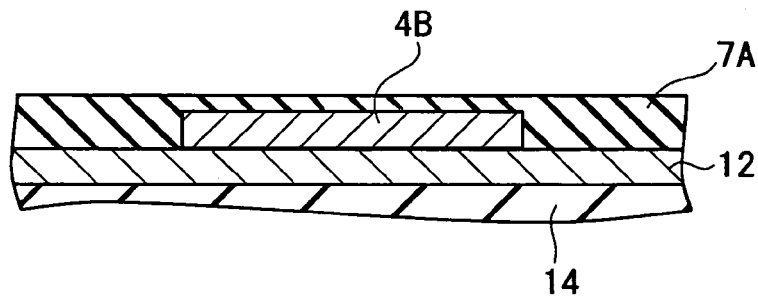
FIG. 12 is a partially enlarged cross-sectional view illustrating a step subsequent to the step of FIG. 11.

Next, a lower magnetic layer 4B is selectively formed on the base 11 as illustrated in FIG. 10 (FIG. 11). In this event, after a resist frame (not shown) is selectively formed using photolithography or the like, an NiFe layer, for example, which will serve as the lower magnetic layer 4B, is formed in an unprotected region, and the resist frame is removed. After the formation of the lower magnetic layer 4B, an insulating layer 7A made, for example, of $SiO_2$ is formed to cover the entirety using a CVD apparatus (FIG. 12).

Figure 13:
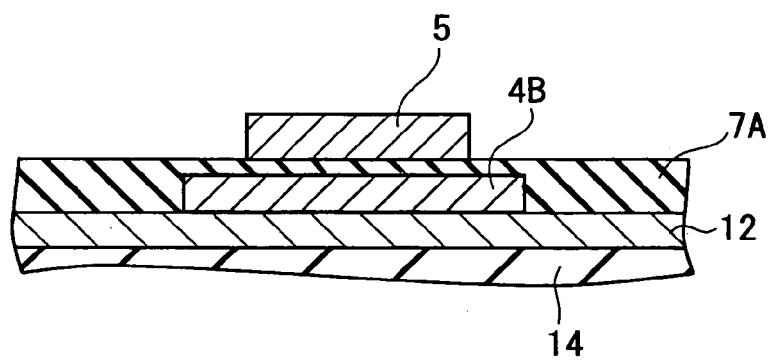
FIG. 13 is a partially enlarged cross-sectional view illustrating a step subsequent to the step of FIG. 12.

Next, a metal layer made, for example, of Ti is formed on the insulating layer 7A by sputtering or the like. Subsequently, a write bit line 5 is selectively formed on the metal layer (FIG. 13). Specifically, after a resist pattern (not shown) in a predetermined shape is formed on the insulating layer 7A, the resulting product is immersed in a plating bath for plating with the metal layer used as an electrode to form, for example, Cu plating layer. After removing the resist pattern, the unnecessary metal layer is removed by ion milling.

Figure 14:
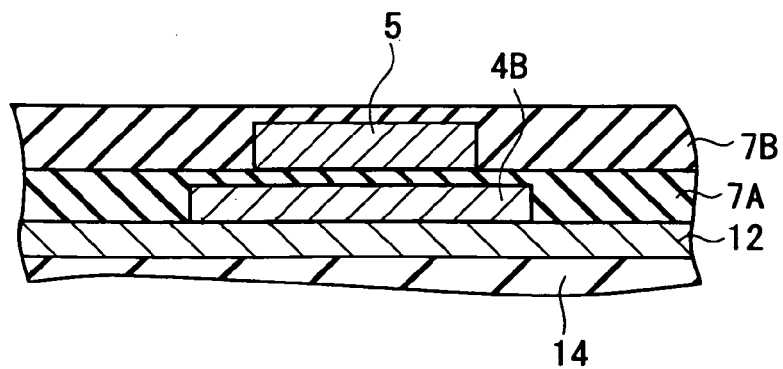
FIG. 14 is a partially enlarged cross-sectional view illustrating a step subsequent to the step of FIG. 13.

Next, an insulating film 7B made, for example, of $SiO_2$ is formed to cover the entirety using a CVD apparatus (FIG. 14). Subsequently, the insulating film 7B is planarized by a CMP apparatus.

Figure 15:
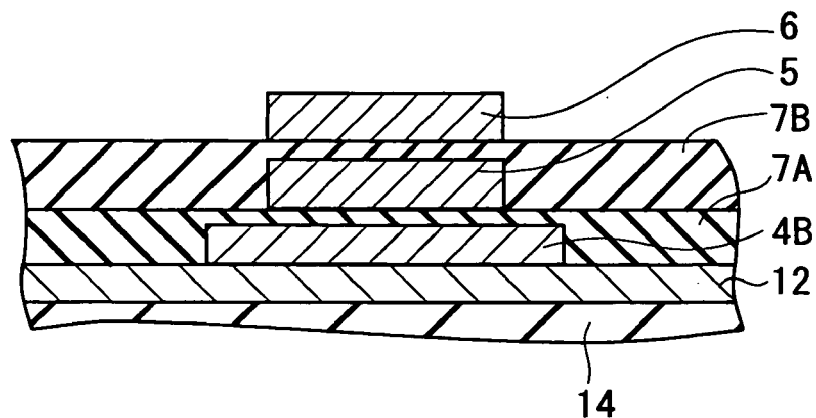
FIG. 15 is a partially enlarged cross-sectional view illustrating a step subsequent to the step of FIG. 14.

Subsequently, a metal layer made, for example, of Ti is formed on the insulating film 7B by sputtering or the like. Then, a write word line 6 is selectively formed to cover a region of the metal layer corresponding to the write bit line 5 (FIG. 15). Specifically, after a resist pattern (not shown) in a predetermined shape is formed on the insulating film 7B, the resulting product is immersed in a plating bath for plating with the metal layer used as an electrode to form, for example, a Cu plating layer. After removing the resist pattern, the unnecessary metal layer is removed by ion milling.

Figure 16:
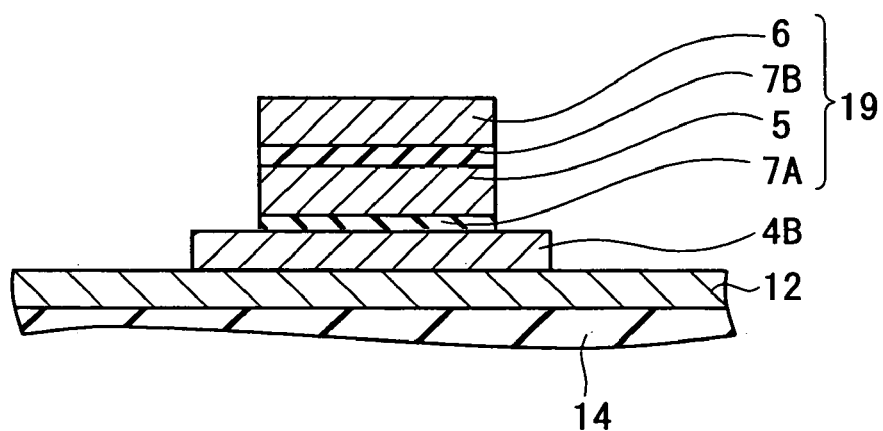
FIG. 16 is a partially enlarged cross-sectional view illustrating a step subsequent to the step of FIG. 15.
Figure 17:
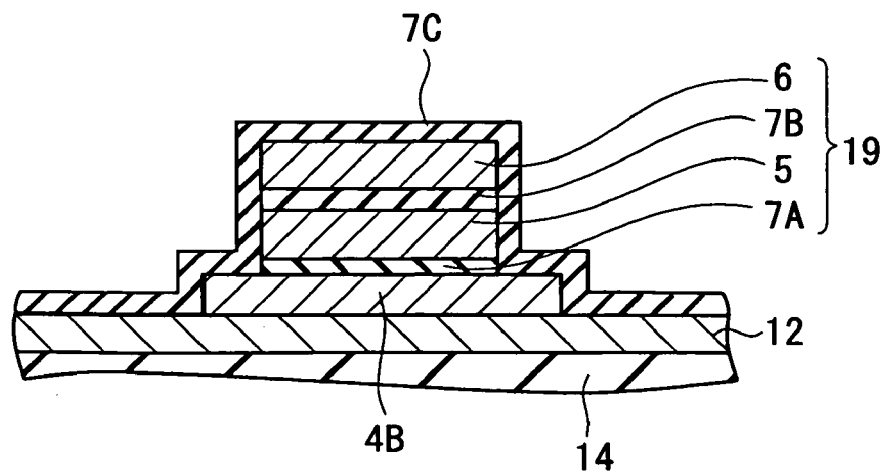
FIG. 17 is a partially enlarged cross-sectional view illustrating a step subsequent to the step of FIG. 16.
Figure 18:
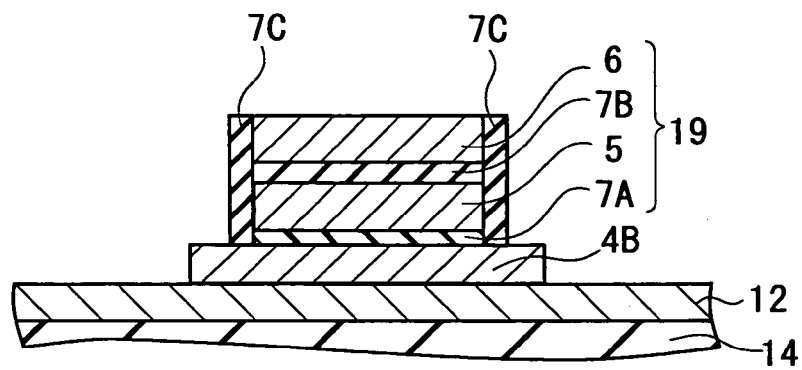
FIG. 18 is a partially enlarged cross-sectional view illustrating a step subsequent to the step of FIG. 17.

Next, the write word line 6 is used as a mask to form a laminate pattern 19 in a self-aligned manner (FIG. 16). Specifically, the insulating film 7B, insulating layer 7A and write bit line 5 in a region not protected by the write word line 6 are removed by RIE using $C_4F_8$ as a reactive gas and ion milling to form the laminate pattern 19. Here, the insulating layer 7A is removed until the lower magnetic layer 4B exposes.

In this way, by forming the laminate pattern 19 in a self-aligned manner with the write word line 6 used as a mask, the write bit line 5 can be highly accurately formed to have the same width as the write word line 6. In addition, it is possible to omit a step for forming a resist pattern and a step for removing the resist pattern, thereby simplifying the manufacturing process.

After forming the laminate pattern 19 in the parallel zone 10 of the write bit line 5 and write word line 6, an insulating layer 7C made, for example, of $SiO_2$ is formed to cover the entirety by a CVD apparatus or the like.

Figure 19:
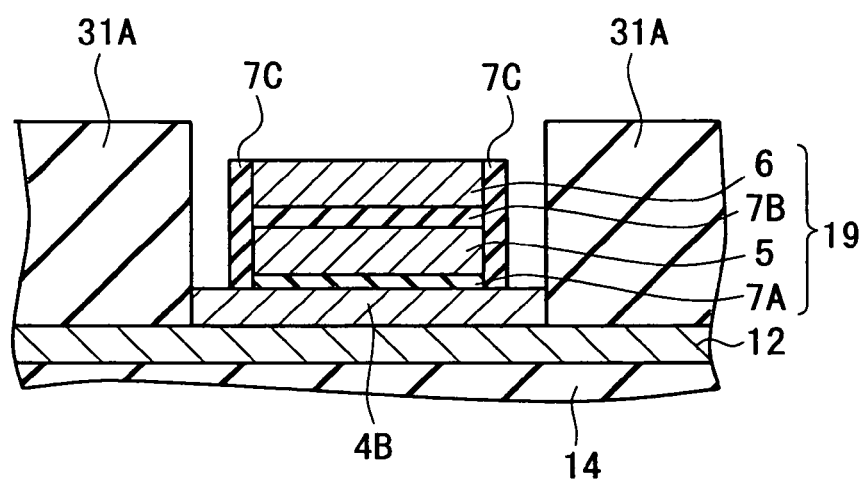
FIG. 19 is a partially enlarged cross-sectional view illustrating a step subsequent to the step of FIG. 18.

Next, after the insulating layer 7C is completely removed by ion milling or the like except for the insulating layer 7C formed on the side surface of the laminate pattern 19 (FIG. 18), a metal layer made, for example, of NiFe is formed in a small thickness over the entire surface by sputtering or the like. Subsequently, a photoresist layer 31A is formed by photolithography or the like on the metal layer in a region in which the lower magnetic layer 4B is not formed (FIG. 19).

Figure 20:
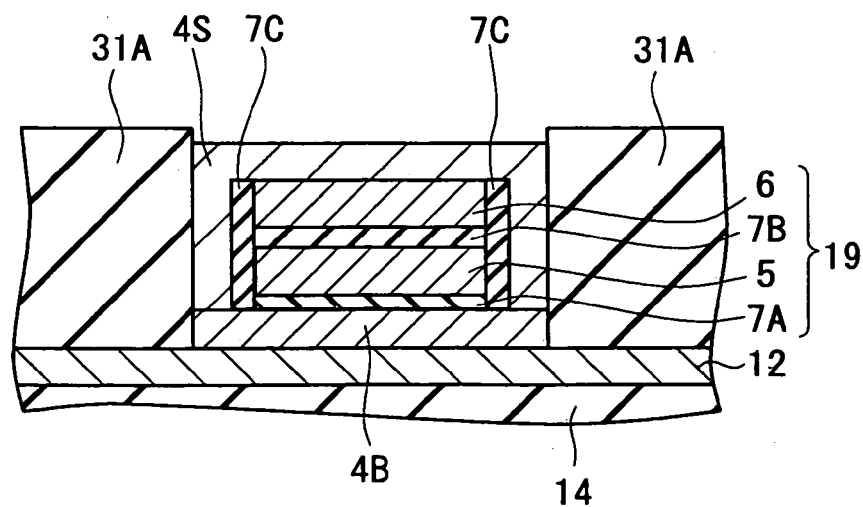
FIG. 20 is a partially enlarged cross-sectional view illustrating a step subsequent to the step of FIG. 19.
Figure 21:
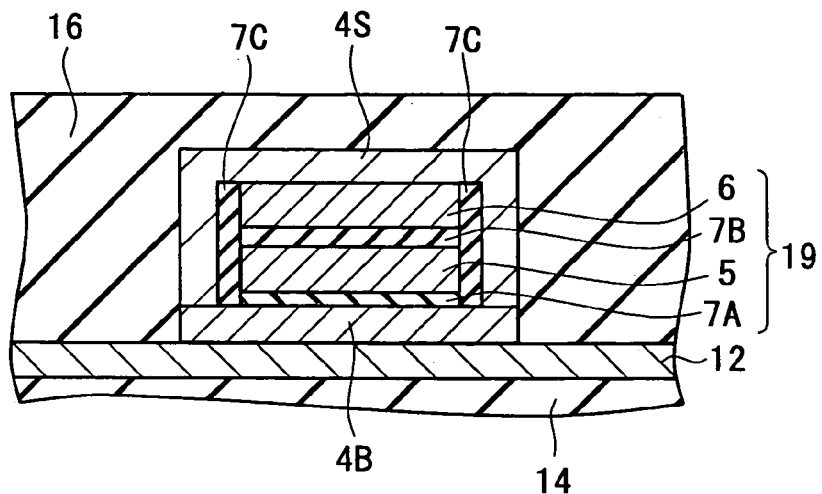
FIG. 21 is a partially enlarged cross-sectional view illustrating a step subsequent to the step of FIG. 20.

After forming the photoresist layer 31, the resulting product is immersed in a plating bath for plating with the metal layer used as an electrode to form an intermediate magnetic layer 4S made, for example, of NiFe (FIG. 20). Subsequently, an insulating layer 16 made, for example, of $SiO_2$ is formed by a CVD apparatus or the like to cover the entirety (FIG. 21).

Figure 22:
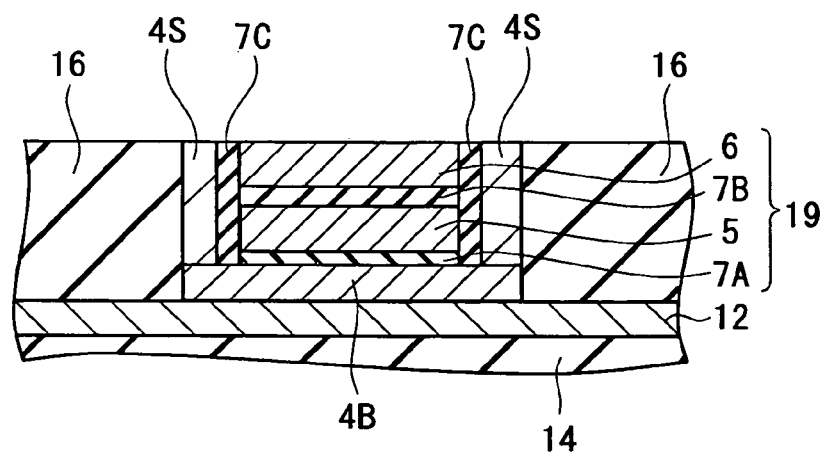
FIG. 22 is a partially enlarged cross-sectional view illustrating a step subsequent to the step of FIG. 21.
Figure 23:
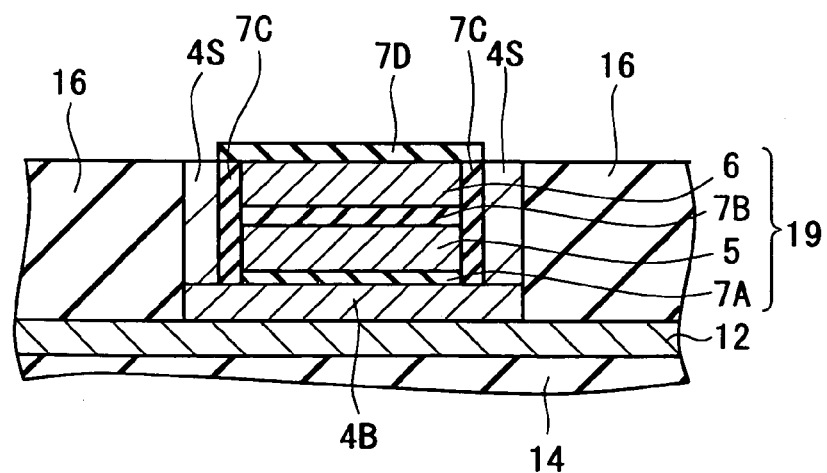
FIG. 23 is a partially enlarged cross-sectional view illustrating a step subsequent to the step of FIG. 22.
Figure 24:
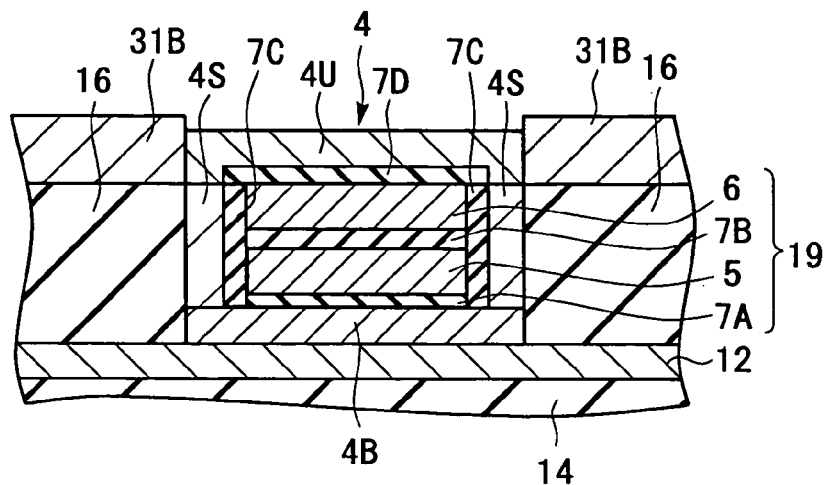
FIG. 24 is a partially enlarged cross-sectional view illustrating a step subsequent to the step of FIG. 23.
Figure 25:
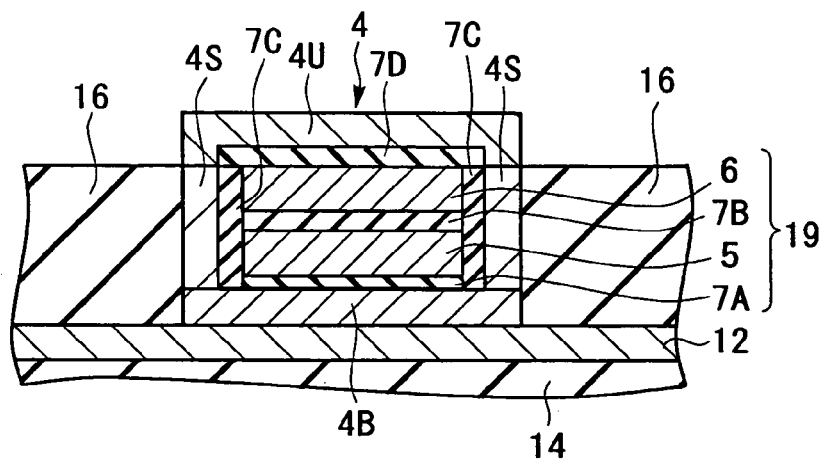
FIG. 25 is a partially enlarged cross-sectional view illustrating a step subsequent to the step of FIG. 24.

Next, the insulating layer 16 is polished using a CMP apparatus until the write word line 6 is eventually exposed (FIG. 22). Subsequently, an insulating layer 7D is selectively formed by photolithography or the like to cover the exposed surface of the write word line 6 (FIG. 23). Further, a metal layer made, for example, of NiFe is formed in a small thickness by sputtering or the like. Next, a photoresist layer 31B is formed on the metal layer in a region corresponding to the insulating layer 16 by photolithography or the like. Subsequently, the resulting product is immersed in a plating bath for plating with the metal layer used as an electrode to form an upper magnetic layer 4U made, for example, of NiFe (FIG. 24). By now, the formation of the annular magnetic layer 4 made up of the lower magnetic layer 4B, intermediate magnetic layer 4S, and upper magnetic layer 4U is completed. Next, the photoresist layer 31B is removed (FIG. 25). This causes the upper magnetic layer 4U to expose.

Figure 26:
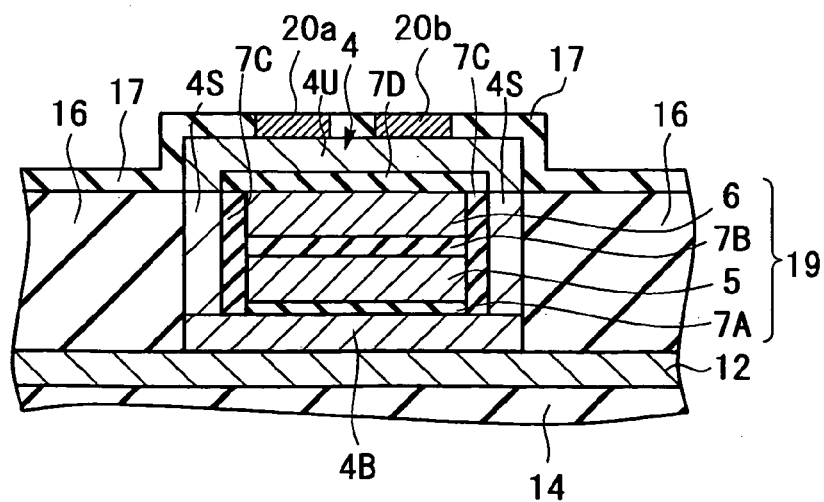
FIG. 26 is another partially enlarged cross-sectional view illustrating the same step as the step of FIG. 34.

Subsequently, the laminated composites 20a, 20b constituting the TMR elements 2a, 2b are formed, and then an insulating layer 17 is formed therearound (FIG. 26). This step will be described in detail with reference to FIGS. 27 to 34.

Figure 27:
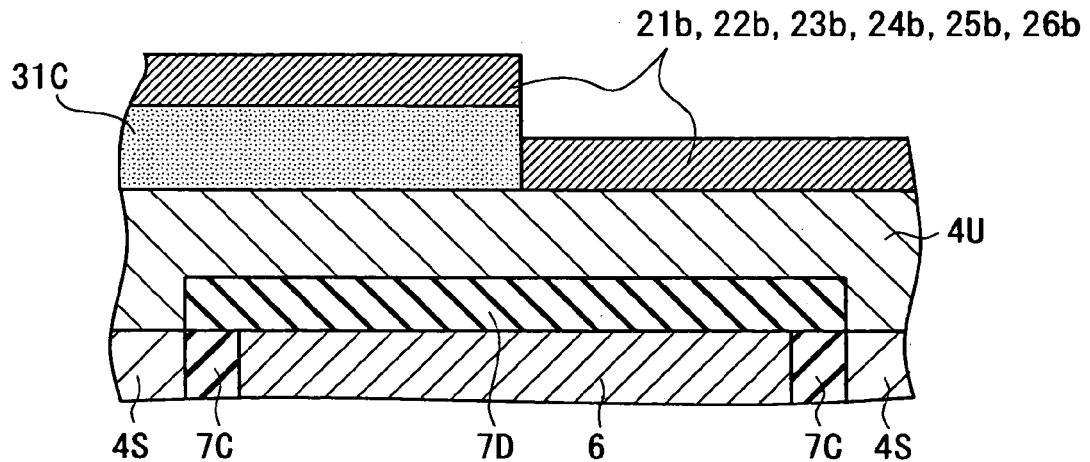
FIG. 27 is a partially enlarged cross-sectional view illustrating a step subsequent to the step of FIG. 25.

First, a photoresist layer 31C is selectively formed by photolithography or the like in a region which includes an area in which the laminated composite 20a is to be formed but does not include an area in which the laminated composite 20b is to be formed. Next, respective layers 21b, 22b, 23b, 24b, 25b, 26b, which are to make up the laminated composite 20b, are sequentially formed over the entire surface (FIG. 27). Specifically, first, the magnetic layer 21b made, for example, of CoFe and an Al layer are formed in sequence by sputtering or the like. The Al layer is oxidized to form the tunnel barrier layer 22b. Subsequently, the magnetic layer 23b made, for example, of CoFe, the non-magnetic conductive layer 24b made, for example, of Ru, the ferromagnetic layer 25b made, for example, of CoFe, and the antiferromagnetic layer 26b made, for example, of PtMn are formed in sequence on the tunnel barrier layer 22b by sputtering or the like. Further, for preventing deteriorations of these layers during the processing, a cap layer (protection layer) made of Ta or the like may be provided.

Figure 28:
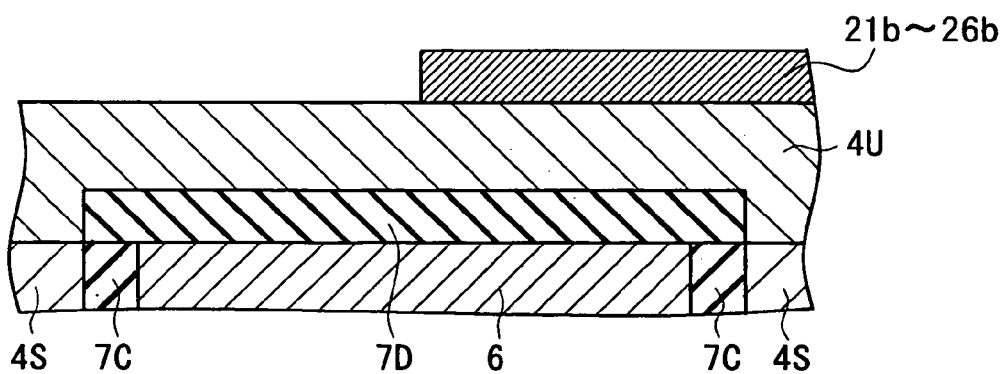
FIG. 28 is a partially enlarged cross-sectional view illustrating a step subsequent to the step of FIG. 27.

Next, the photoresist layer 31C and layers 21b–21b are removed by lift-off in a region which includes the area in which the laminated composite 20a is to be formed (FIG. 28).

Figure 29:
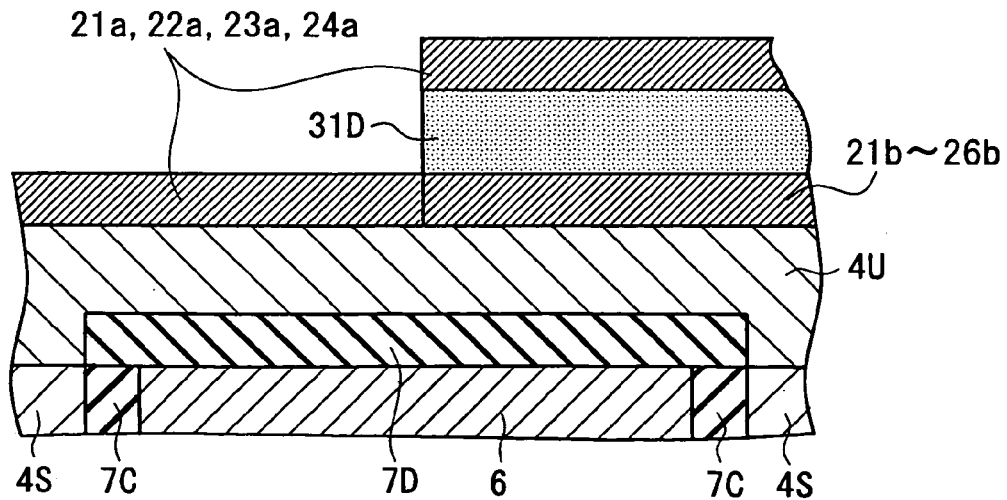
FIG. 29 is a partially enlarged cross-sectional view illustrating a step subsequent to the step of FIG. 28.

Subsequently, a photoresist layer 31D is formed on the layers 21b–26b by photolithography or the like. Next, the respective layers 21a, 22a, 23a, 24a which are to make up the laminated composite 20a, are formed in sequence over the entire surface (FIG. 29). Specifically, first, the magnetic layer 21a made, for example, of CoFe and an Al layer are formed in sequence by sputtering or the like. The Al layer is oxidized to form the tunnel barrier layer 22a. Subsequently, the magnetic layer 23a made, for example, of CoFe, and the antiferromagnetic layer 24a made, for example, of PtMn are formed in sequence on the tunnel barrier layer 22a by sputtering or the like. Further, for preventing deteriorations of these layers during the processing, a cap layer (protection layer) made of Ta or the like may be provided.

Figure 30:
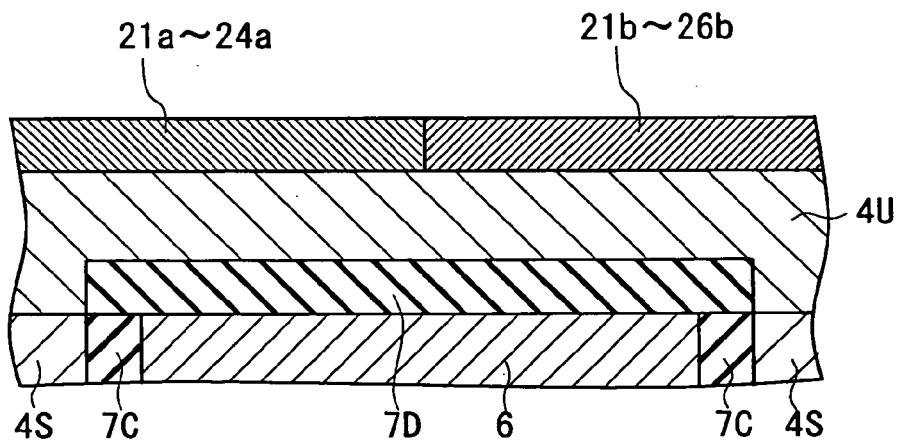
FIG. 30 is a partially enlarged cross-sectional view illustrating a step subsequent to the step of FIG. 29.

Next, the photoresist layer 31D and layers 21a–24a are removed on the layers 21b–26b by lift-off (FIG. 30). Subsequently, the resulting product is annealed at a predetermined temperature which exceeds a blocking temperature of the materials of the antiferromagnetic layers 24a, 26b in a predetermined magnetic field to fix the magnetization directions of the layers 23a, 25b in the aforementioned directions.

Figure 31:
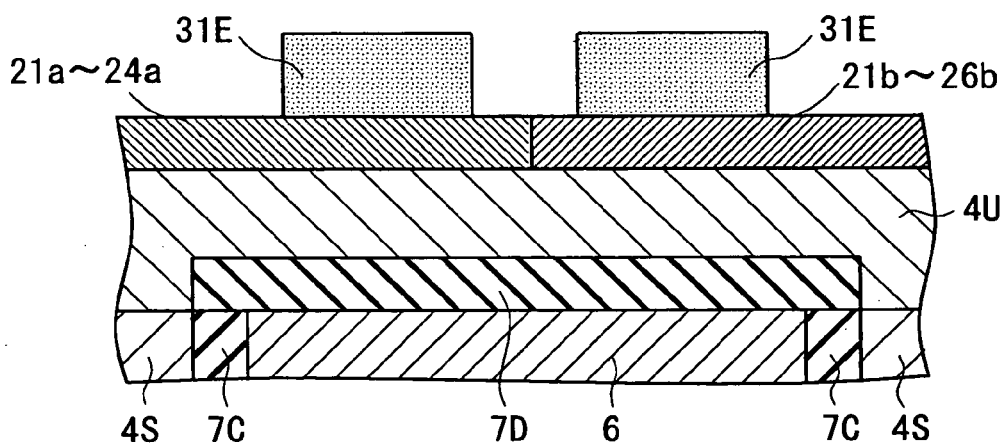
FIG. 31 is a partially enlarged cross-sectional view illustrating a step subsequent to the step of FIG. 30.
Figure 32:
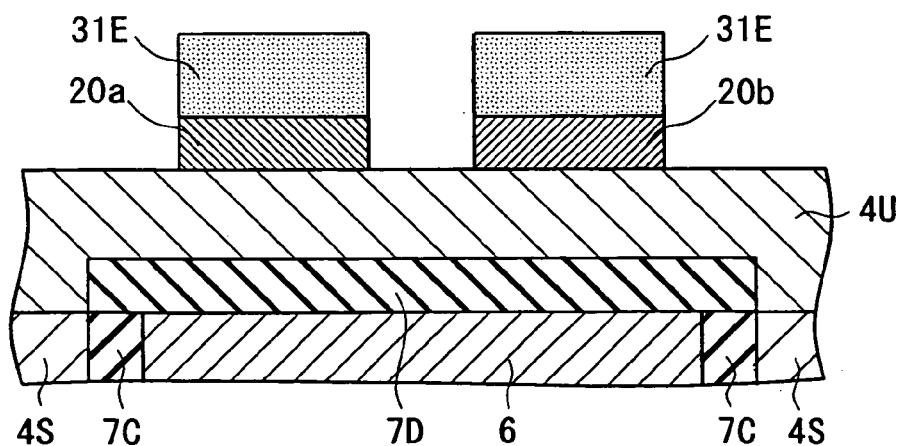
FIG. 32 is a partially enlarged cross-sectional view illustrating a step subsequent to the step of FIG. 31.

Subsequently, a photoresist layer 31E is selectively formed by photolithography or the like in regions corresponding to the laminated composites 20a, 20b (FIG. 31). Next, ion milling is performed with the photoresist layer 31E used as a mask to pattern the layers 21a–24a and layers 21b–26b into the laminated composites 20a, 20b, respectively (FIG. 32).

Figure 33:
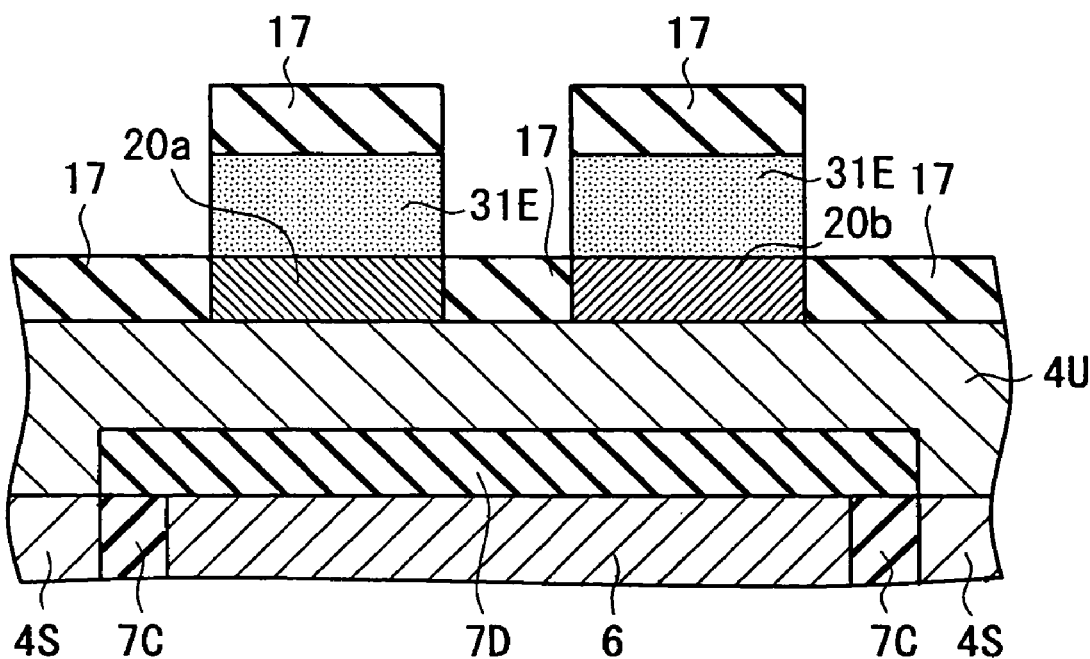
FIG. 33 is a partially enlarged cross-sectional view illustrating a step subsequent to the step of FIG. 32.
Figure 34:
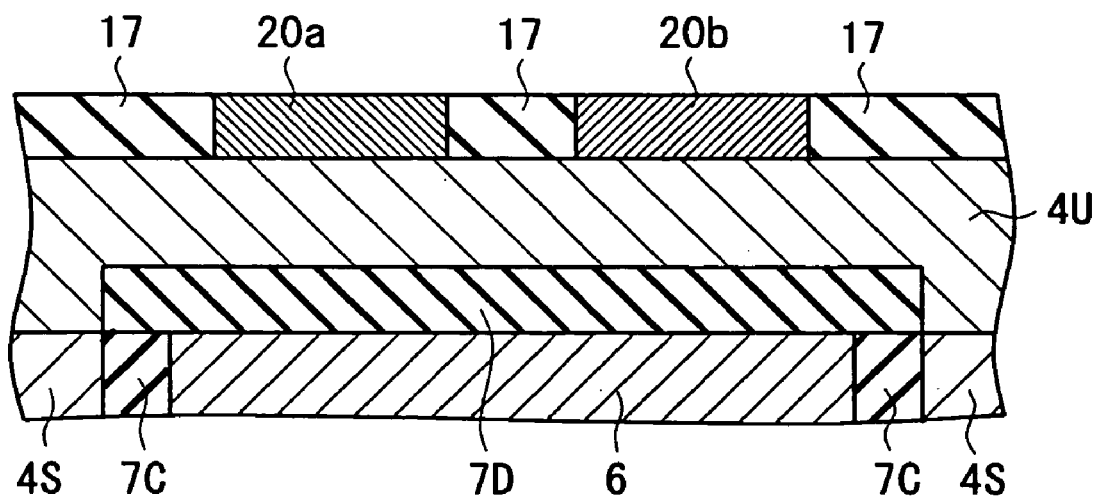
FIG. 34 is a partially enlarged cross-sectional view illustrating a step subsequent to the step of FIG. 33.

Next, an insulating layer 17 made, for example, of $SiO_2$ is formed by ion beam deposition or the like to cover the entirety (FIG. 33). Next, the photoresist layer 31E and insulating layer 17 are removed on the laminated composites 20a, 20b by lift-off (FIG. 34). FIG. 34 illustrates the same state as that illustrated in FIG. 26.

Figure 35:
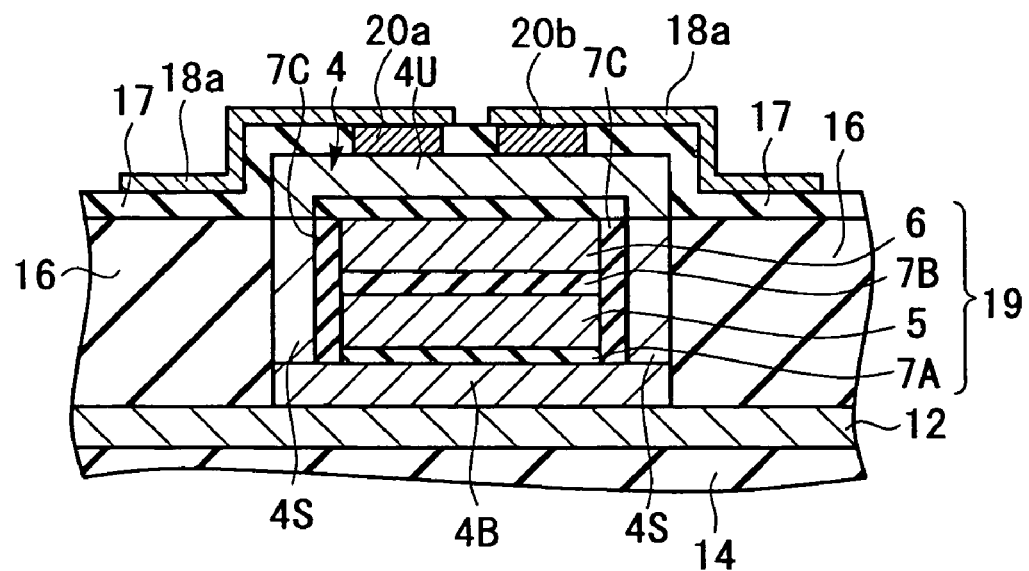
FIG. 35 is a partially enlarged cross-sectional view illustrating a step subsequent to the step of FIG. 34.

Subsequently, a layer made, for example, of Al, which is to serve as connection layers 18a, 18b, is formed by sputtering or the like, and patterned into the shape of the connection layers 18a, 18b by a phtolitho-etching method or the like (FIG. 35).

Figure 36:
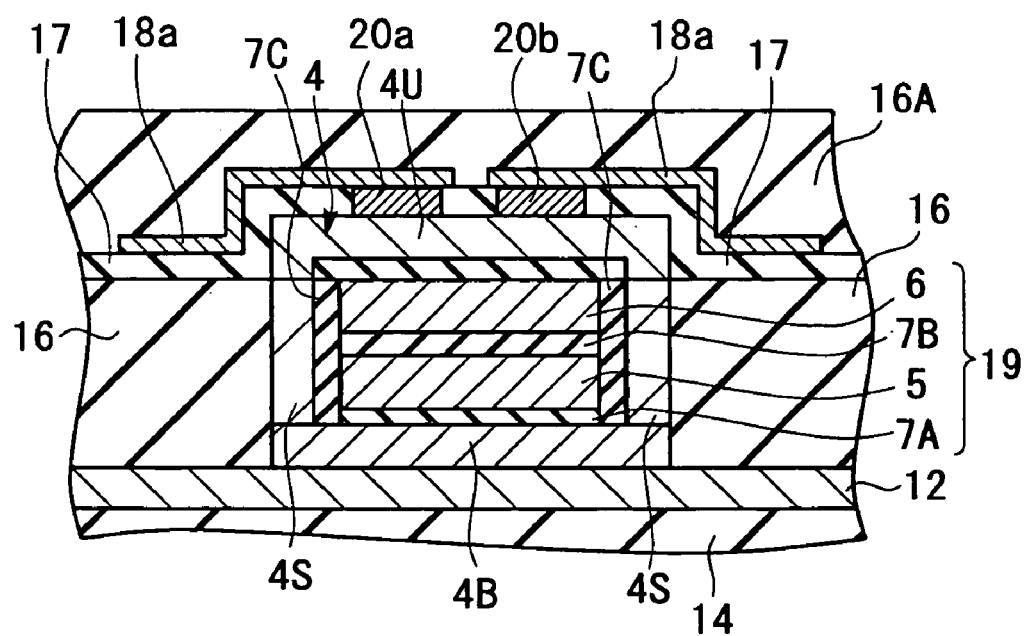
FIG. 36 is a partially enlarged cross-sectional view illustrating a step subsequent to the step of FIG. 35.

Subsequently, after an insulating layer 16A made of $SiO_2$ or the like is formed over the entire surface by a CVD apparatus or the like, the surface of the insulating layer 16A is polished by a CMP apparatus or the like for planarization (FIG. 36).

Next, a write word line lead-out electrode 41 is formed at each of both ends of the write word line 6, a write bit line lead-out electrode 42 is formed at each of both ends of the write bit line 5, a read word line lead-out electrode 43 is formed at each of both ends of the read word line 12, and a read bit line lead-out electrode 44 is formed at each of both ends of the read bit line 13.

By the foregoing steps, the formation of the storage cell group 54 including the storage cells 1 is completed for the present.

Subsequently, the manufacturing of the magnetic memory device according to the first embodiment is completed through a step for forming a protection film made of $SiO_2$, $Al_2O_3$, or the like by a sputtering apparatus, a CVD apparatus or the like, and a step for polishing the protection layer to expose the respective lead-out electrodes 41–44.

In the magnetic memory device according to the first embodiment, since the storage cell 1 is comprised of the two TMR elements 2a, 2b, in-phase noise in the read output is removed by reading differentially amplified outputs of the TMR elements 2a, 2b, to improve the S/N ratio.

Also, in the first embodiment, the magnetic memory device has the annular magnetic layer 4 which forms a magnetic path for a current magnetic field generated by the write bit line 5 and write word line 6, and the high/low states of the electric resistances of the two TMR elements 2a, 2b change based on the current magnetic field passing through the annular magnetic field 4, so that a loss of the current magnetic field can be reduced by the annular magnetic layer 4, thereby efficiently performing the magnetization reversal when information is written.

Further, in the first embodiment, the write bit line 5 and write word line 6 for generating the current magnetic field are commonly provided for the two TMR elements 2a, 2b, and the high/low states of the electric resistances of the two TMR elements 2a, 2b simultaneously change based on the current magnetic field, thus resulting in a reduction in the number of write lines for one storage cell. This results in a simplified structure, a facilitated manufacturing process, a limited area occupied by the storage cell 1, and a resulting increase in the storage capacity.

Furthermore, in the first embodiment, the two TMR elements 2a, 2b are disposed in a direction along the laminating surface with respect to each other, and the annular magnetic layer 4 is disposed on the same side (−Z-direction side in the first embodiment) of the TMR elements 2a, 2b so as to be common to the two TMR elements 2a, 2b, thus resulting in a simplified structure of the annular magnetic layer 4, a facilitated manufacturing process therefor, a limited area occupied by the storage cell 1, and a resulting increase in the storage capacity, as compared with the annular magnetic layers 4 provided separately for the two TMR elements 2a, 2b, respectively.

Figure 53:
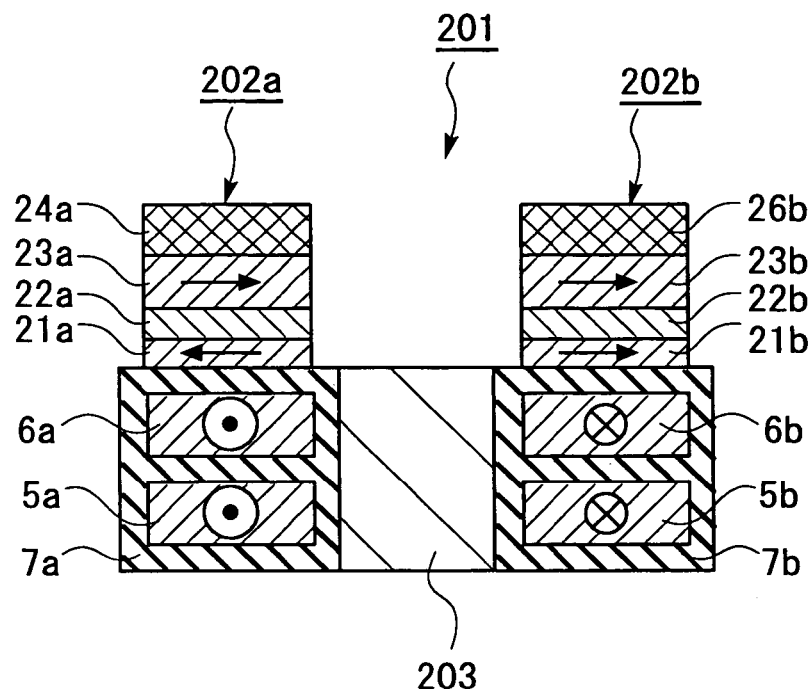
FIG. 53 is a general cross-sectional view schematically illustrating a storage cell of a magnetic memory device according to a comparative example.
Figure 54:
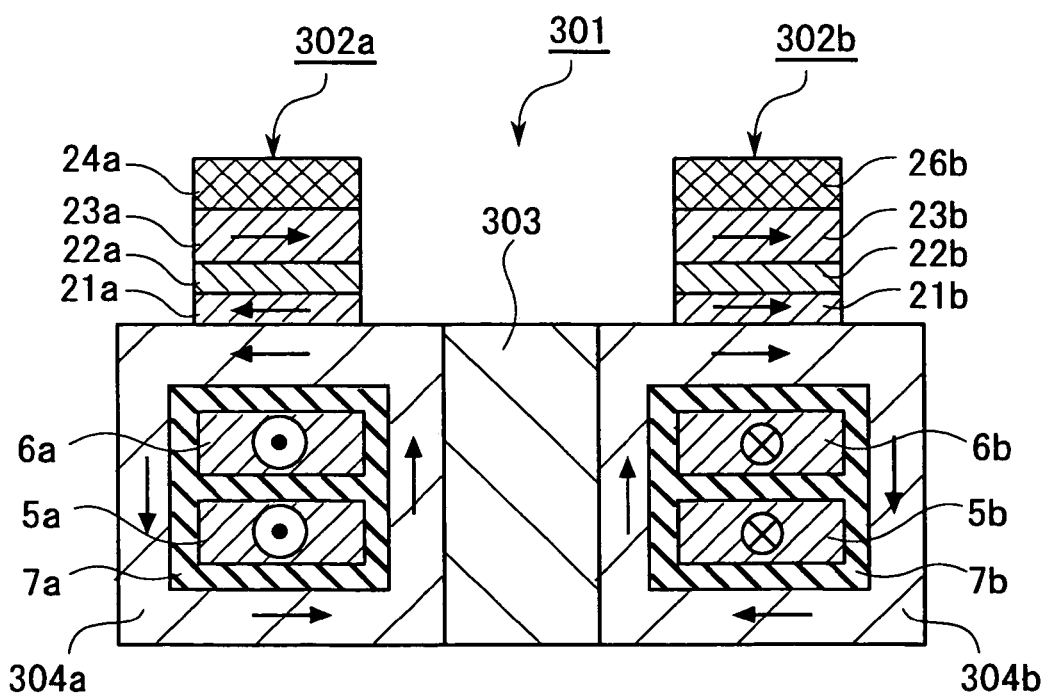
FIG. 54 is a general cross-sectional view schematically illustrating a storage cell of a magnetic memory device according to another comparative example.

Now, the first embodiment will be compared with some comparative examples. FIGS. 53 and 54 are cross-sectional views generally illustrating storage cells 201, 301, respectively, each of which is a component of a magnetic memory device according to each comparative example, and correspond to FIGS. 4A and 4B. In FIGS. 53 and 54, components identical to or corresponding to those in FIGS. 4A and 4B are designated by the same reference numerals, and repetitive description thereon is omitted.

In the storage cell 201 illustrated in FIG. 53, two TMR elements 202a, 202b have the structure completely identical to each other. Specifically, the TMR element 202a has the same structure as the TMR element 2a in FIGS. 4A and 4B, while the TMR element 202b excludes the non-magnetic conductive layer 23b and ferromagnetic layer 24b from the TMR element 2b in FIGS. 4A and 4B. In FIG. 53, the reference numerals 7a, 203 denote insulating layers (non-magnetic layers).

In the storage cell 201, two write lines are separately provided for each of the TMR elements 202a, 202b. Specifically, the TMR element 202a is provided with a write bit line 5a and a write word line 6a, while the TMR element 202b is provided with a write bit line 5b and a write word line 6b. While the write bit lines 5a, 5b are electrically insulated as well, the write word lines 6a, 6b are connected deep in the sheet of the drawing to form a single line. Also, the storage cell 201 is not provided with an annular magnetic layer which would otherwise form a magnetic path for a current magnetic field generated by the write lines 5a, 5b.

Since the storage cell 201 is not provided with a component 4 corresponding to the annular magnetic layer in FIGS. 4A and 4B as in the first to third prior art examples described above, the storage cell 201 suffers from a large loss of a current magnetic field generated by the write lines 5a, 5b, 6a, 6b, and cannot efficiently perform the magnetization reversal of the magnetic layers 21a, 21b. Also, in the storage cell 201, the magnetic field generated by the write lines 5a, 5b, 6a, 6b can affect adjacent storage cells and therefore can cause information to erroneously written thereinto. Further, the storage cell 201 requires an increased number of write lines because two write lines are separately provided for each of the TMR elements 202a, 202b, and an attempt to increase the density in the horizontal direction in FIG. 53 for a larger storage capacity will result in difficulties in a write line forming process.

In contrast, in the magnetic memory device according to the first embodiment in which the storage cell 1 has the annular magnetic layer 4, the magnetization reversal of the magnetic layers 21a, 21b can be efficiently performed, and since a current magnetic field generated by the write lines is magnetically shielded by the annular magnetic layer 4, the current magnetic field will not affect adjacent storage cells. Also, in the first embodiment, since the write bit line 5 and write word line 6 are provided commonly for the two TMR elements 2a, 2b, the number of write lines is reduced. Therefore, according to the first embodiment, it is possible to increase the recording capacity and facilitate the manufacturing process.

In the storage cell 301 illustrated in FIG. 54, two TMR elements 302a, 302b have the structure completely identical to each other. Specifically, the TMR element 302a has the same structure as the TMR element 2a in FIGS. 4A and 4B, while the TMR element 302b excludes the non-magnetic conductive layer 23b and ferromagnetic layer 24b from the TMR element 2b in FIGS. 4A and 4B. In FIG. 54, the reference numerals 7a, 303 denote insulating layers (non-magnetic layers).

In the storage cell 301, two write lines are separately provided for each of the TMR elements 302a, 302b, and annular magnetic layers 304a, 304b are provided one by one for the respective TMR elements 302a, 302b. Specifically, the TMR element 302a is provided with a write bit line 5a and a write word line 6a as well as an annular magnetic layer 304a which surrounds them, while the TMR element 303a is provided with a write bit line 5b and a write word line 6b as well as an annular magnetic layer 304b which surrounds them. While the write bit lines 5a, 5b are electrically insulated as well, the write word lines 6a, 6b are connected deep in the sheet of the drawing to form a single line.

In the storage cell 310, since each of the TMR elements 202a, 202b is provided separately with a set of two write lines and an annular magnetic layer, resulting in increased numbers of the write lines and the annular magnetic layer. Therefore, an attempt to increase the density in the horizontal direction in FIG. 54 for a larger storage capacity will result in difficulties in a write line forming process and an annular magnetic field forming process.

In contract, in the first embodiment, since the write bit line 5 and write word line 6 as well as the annular magnetic layer 4 are provided commonly for the two TMR elements 2a, 2b, the number of write lines and the number of annular magnetic layers are reduced. Thus, according to the first embodiment, it is possible to increase the recording capacity and facilitate the manufacturing process.

Next, a magnetic memory device according to a second embodiment of the present invention will be described with reference FIGS. 37A and 37B.

Figure 37A:
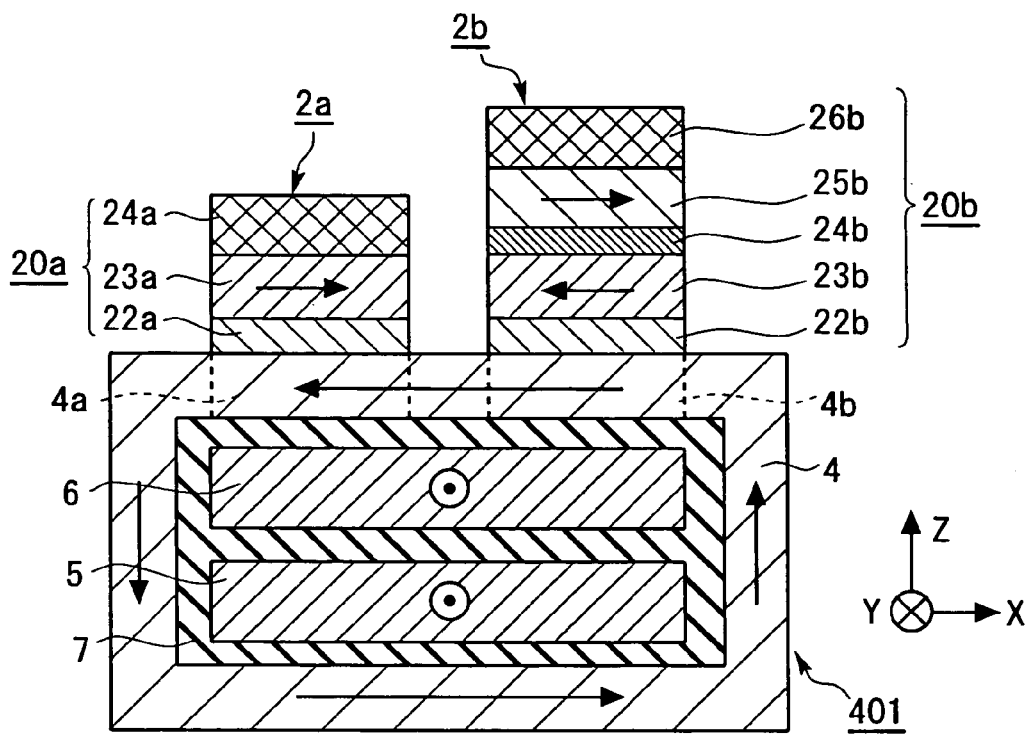
FIGS. 37A, 37B are general cross-sectional views schematically illustrating a storage cell of a magnetic memory device according to a second embodiment of the present invention.
Figure 37B:
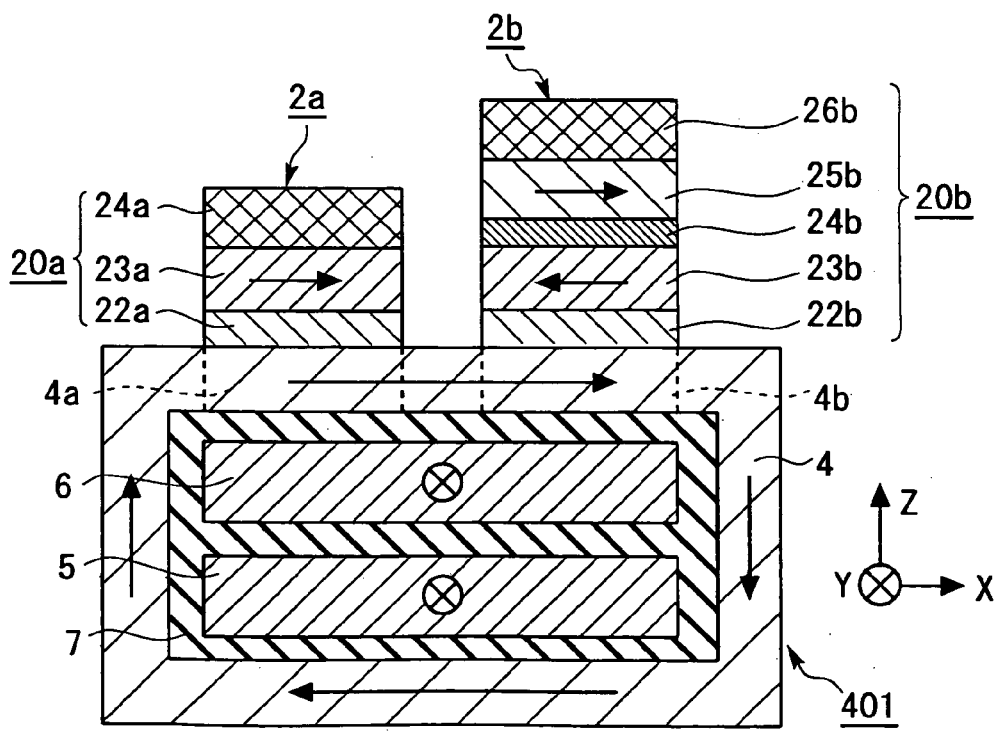

FIGS. 37A and 37B are general cross-sectional views schematically illustrating a storage cell 401 of a magnetic memory device according to a second embodiment of the present invention, and correspond to FIGS. 4A and 4B. In FIGS. 37A and 37B, components identical to or corresponding to those in FIGS. 4A and 4B are designated by the same reference numerals, and repetitive description thereon is omitted. This applies to FIGS. 38 to 41, later described.

The magnetic memory device according to the second embodiment differs from the magnetic memory device according to the first embodiment only in that the storage cell 401 illustrated in FIGS. 37A and 37B is used instead of the storage cell 1 illustrated in FIGS. 4A and 4B.

The storage cell 401 differs from the storage cell 1 only in that the magnetic layers 21a, 21b are removed from the laminated composites 20a, 20b, respectively, and the connection portions 4a, 4b, which form part of the annular magnetic layer 4, are used as equivalent to the magnetic layers 21a, 21b (so-called effective free layers). In other words, in the second embodiment, the TMR element 2a is comprised of a laminate made up of the connection portion 4a and laminated composite 20a, while the TMR element 2b is comprised of a laminate made up of the connection portion 4b and laminated composite 20b.

The magnetic memory device according to the second embodiment can also be manufactured by a method similar to that for manufacturing the magnetic memory device according to the first embodiment.

According to the second embodiment, the resulting magnetic memory device provides similar advantages to those of the first embodiment. Also, according to the second embodiment, since the magnetic memory device does not include the magnetic layers 21a, 21b, the resulting layered structure is advantageously simpler than that of the first embodiment.

Next, a magnetic memory device according to a third embodiment of the present invention will be described with reference FIGS. 38A and 38B.

Figure 38A:
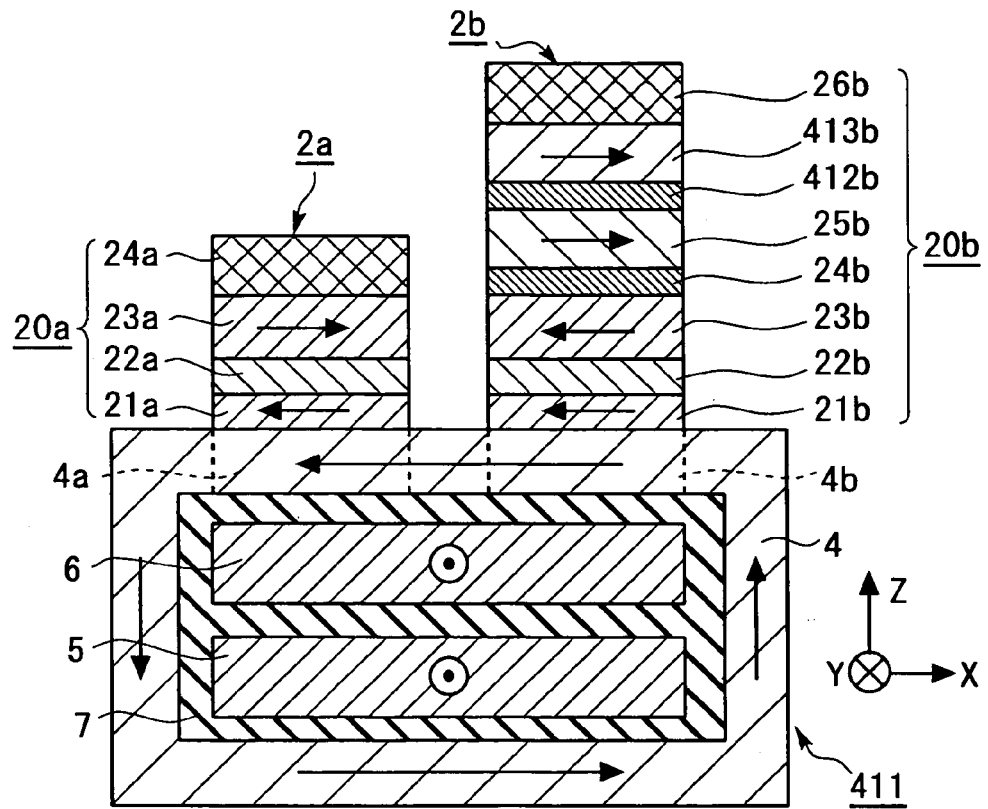
FIGS. 38A, 38B are general cross-sectional views schematically illustrating a storage cell of a magnetic memory device according to a third embodiment of the present invention.
Figure 38B:
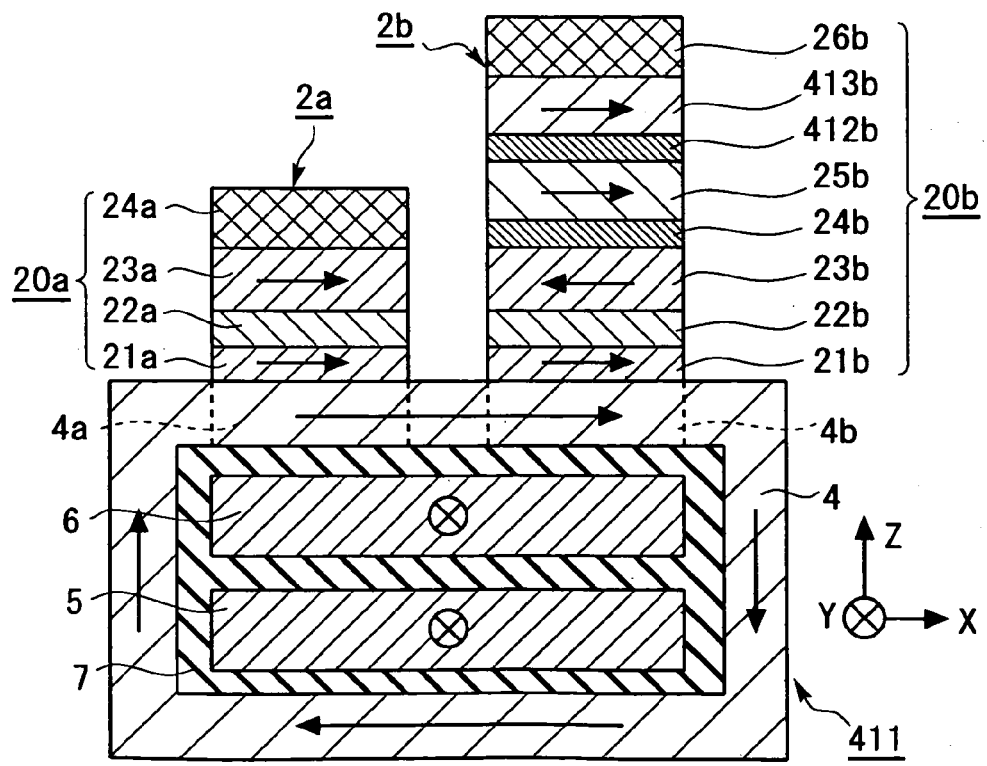

FIGS. 38A and 38B are general cross-sectional views schematically illustrating a storage cell 411 of a magnetic memory device according to a third embodiment of the present invention, and correspond to FIGS. 4A and 4B.

The magnetic memory device according to the third embodiment differs from the magnetic memory device according to the first embodiment only in that the storage cell 411 illustrated in FIGS. 38A and 38B is used instead of the storage cell 1 illustrated in FIGS. 4A and 4B.

The storage cell 411 differs from the storage cell 1 only in that a bilayer film composed of a lower non-magnetic conductive layer 412b and an upper ferromagnetic layer 413b are added between the ferromagnetic layer 25b and antiferromagnetic layer 26b in the TMR element 2b. The non-magnetic conductive layer 412b can be made of a similar material to that of the non-magnetic conductive layer 24b, while the ferromagnetic layer 413b can be made of a similar material to that of the ferromagnetic layer 23b. In the third embodiment, the non-magnetic conductive layer 24b is designed to produce antiferromagnetic coupling between the layers 23b and 25b on both sides thereof in the laminating direction by selecting the thickness, material and the like therefor, while the non-magnetic conductive layer 412b is designed to produce ferromagnetic coupling, rather than antiferromagnetic coupling, between the layers 25b and 413b on both sides thereof in the laminating direction by selecting the thickness, material and the like therefor.

Thus, in the third embodiment, the two bilayer films (bilayer films, each of which is composed of the lower non-magnetic conductive layer and upper ferromagnetic layer) are formed between the magnetic layer 23b and antiferromagnetic layer 26b, but the number of times of the antiferromagnetic coupling produced between the magnetic layer 23b and antiferromagnetic layer 26b is an odd number (one in the third embodiment). As such, in the third embodiment, the magnetization direction of the magnetic layer 23b is also set in the −X-direction, as is the case with the first embodiment.

According to the third embodiment, the resulting magnetic memory device provides similar advantages to those of the first embodiment. The magnetic memory device according to the third embodiment can also be manufactured by a method similar to that for manufacturing the magnetic memory device according to the first embodiment.

Next, a magnetic memory device according to a fourth embodiment of the present invention will be described with reference FIGS. 39A and 39B.

Figure 39A:
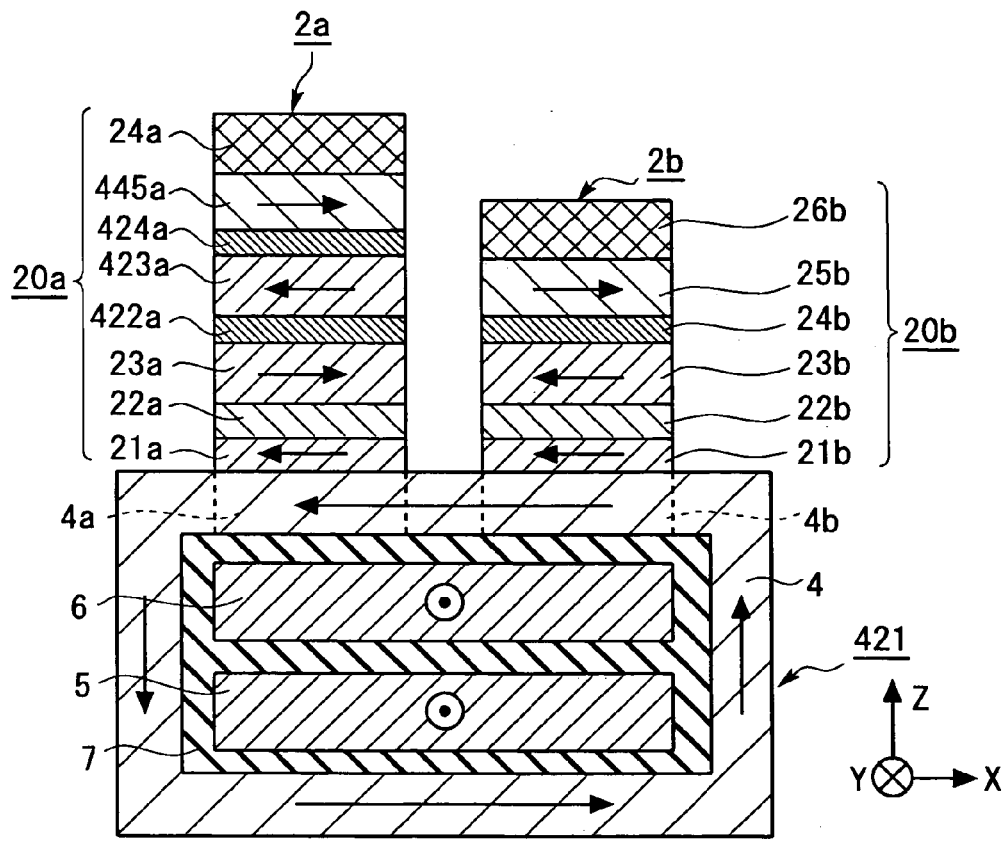
FIGS. 39A, 39B are general cross-sectional views schematically illustrating a storage cell of a magnetic memory device according to a fourth embodiment of the present invention.
Figure 39B:
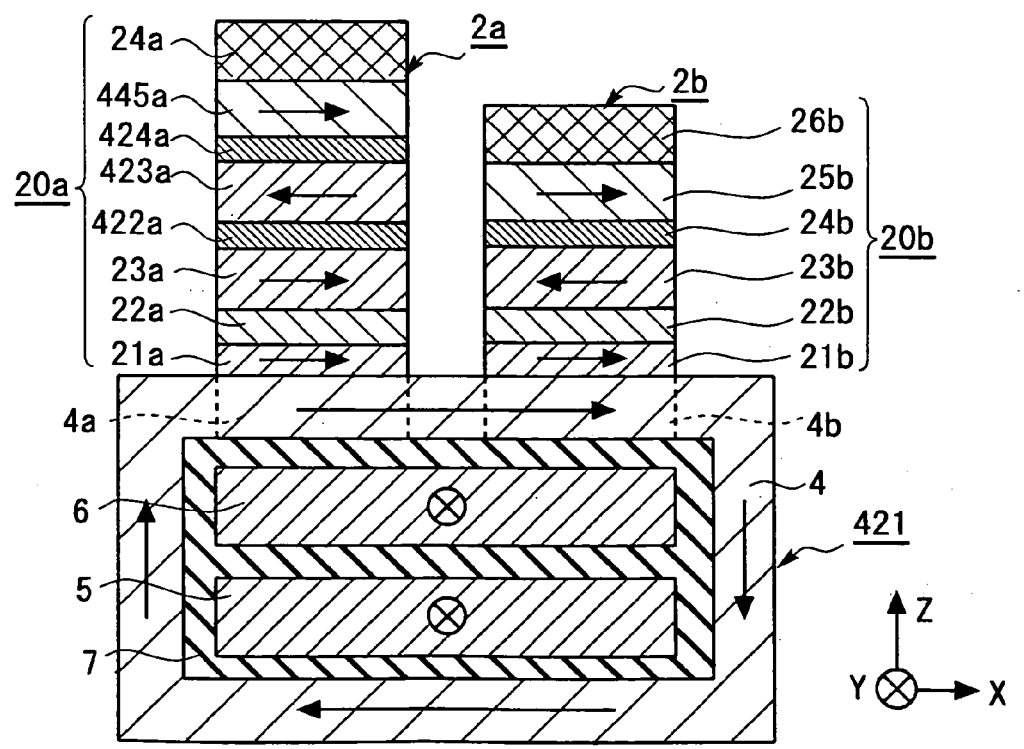

FIGS. 39A and 39B are general cross-sectional views schematically illustrating a storage cell 412 of a magnetic memory device according to a fourth embodiment of the present invention, and correspond to FIGS. 4A and 4B.

The magnetic memory device according to the fourth embodiment differs from the magnetic memory device according to the first embodiment only in that the storage cell 421 illustrated in FIGS. 39A and 39B is used instead of the storage cell 1 illustrated in FIGS. 4A and 4B.

The storage cell 421 differs from the storage cell 1 only in that a bilayer film composed of a lower non-magnetic conductive layer 422a and an upper ferromagnetic layer 423a, and another bilayer film composed of a lower non-magnetic conductive layer 424a and an upper ferromagnetic layer 425a are added between the magnetic layer 23a and antiferromagnetic layer 24a. The non-magnetic conductive layers 422a, 424a can be made of a similar material to that of the non-magnetic conductive layer 24b, while the ferromagnetic layers 423a, 425a can be made of a similar material to that of the ferromagnetic layer 23b. In the fourth embodiment, the non-magnetic conductive layers 422a, 424a are designed to produce antiferromagnetic coupling between the layers on both sides thereof in the laminating direction by selecting the thickness, material and the like therefor.

Therefore, in the fourth embodiment, the two bilayer films (bilayer films, each of which is composed of the lower non-magnetic conductive layer and upper ferromagnetic layer) are formed between the magnetic layer 23a and antiferromagnetic layer 24a, but the number of times of the antiferromagnetic coupling produced between the magnetic layer 23a and antiferromagnetic layer 24a is an even number (two in the fourth embodiment). As such, in the fourth embodiment, the magnetization direction of the magnetic layer 23a is also set in the +X-direction, as is the case with the first embodiment.

According to the fourth embodiment, the resulting magnetic memory device provides similar advantages to those of the first embodiment. The magnetic memory device according to the fourth embodiment can also be manufactured by a method similar to that for manufacturing the magnetic memory device according to the first embodiment.

Next, a magnetic memory device according to a fifth embodiment of the present invention will be described with reference FIGS. 40A and 40B.

Figure 40A:
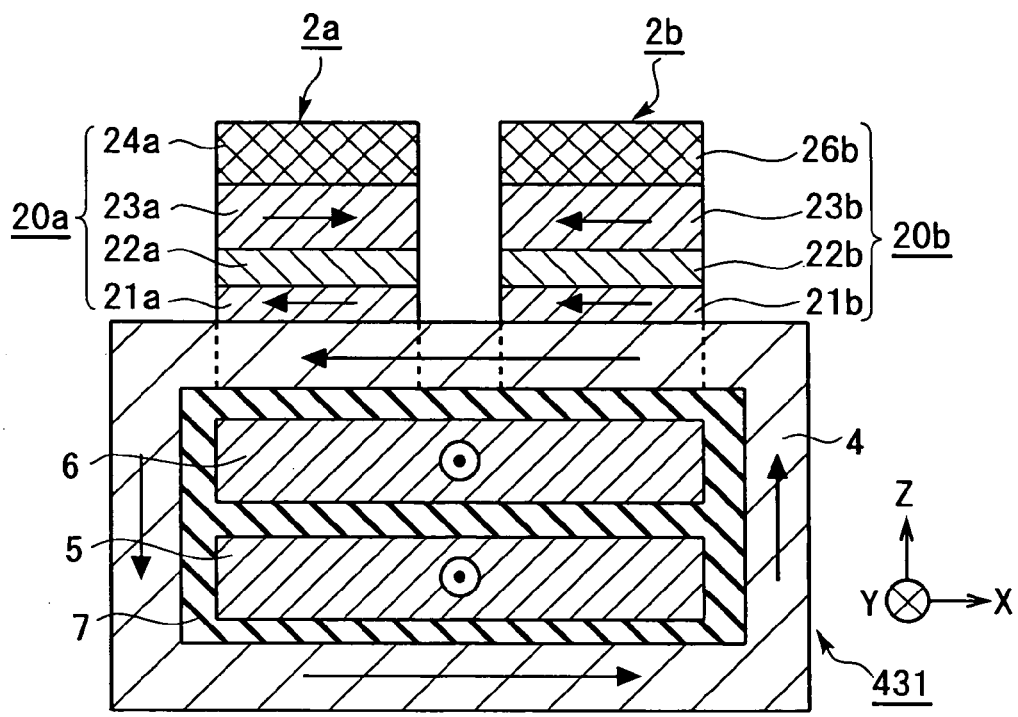
FIGS. 40A, 40B are general cross-sectional views schematically illustrating a storage cell of a magnetic memory device according to a fifth embodiment of the present invention.
Figure 40B:
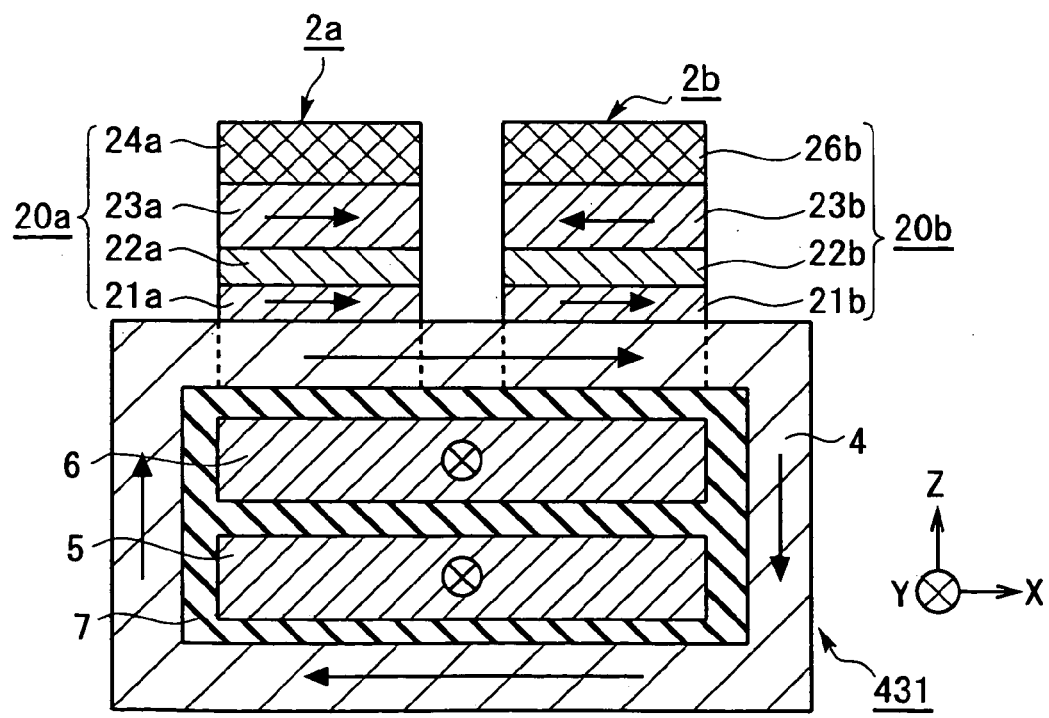

FIGS. 40A and 40B are general cross-sectional views schematically illustrates a storage cell 431 of a magnetic memory device according to a fifth embodiment of the present invention, and correspond to FIGS. 4A and 4B.

The magnetic memory device according to the fifth embodiment differs from the magnetic memory device according to the first embodiment only in that the storage cell 431 illustrated in FIGS. 40A and 40B is used instead of the storage cell 1 illustrated in FIGS. 4A and 4B.

The storage cell 431 differs from the storage cell 1 only in that the non-magnetic conductive layer 24b and ferromagnetic layer 25b between the ferromagnetic layer 23b and antiferromagnetic layer 26b are removed in the TMR element 2b so that the TMR element 2a is comprised of the same number of layers of the same kinds as the TMR element 2b; the antiferromagnetic layers 24a, 26a are made of antiferromagnetic materials which are different in blocking temperature from each other, respectively; annealing is performed separately at two steps for setting the magnetization directions of the magnetic layers 23a, 23b by the antiferromagnetic layers 24a, 26b such that the magnetization directions of the magnetic layers 23a, 23b are antiparallel with each other. For example, one of the antiferromagnetic layers 24a, 26b is made of PtMn, while the other is made of IrMn. PtMn has a blocking temperature higher than that of IrMn.

The magnetic memory device according to the fifth embodiment can be basically manufactured by a method similar to that for manufacturing the magnetic memory device according to the first embodiment. However, the annealing step is performed twice separately after a step corresponding to the step illustrated in FIG. 30. Specifically, assuming, for example, that the antiferromagnetic layer 24a is made of a material, the blocking temperature of which is T1, and the antiferromagnetic layer 26b is made of a material, the blocking temperature of which is T2, where T1>T2, the first annealing is performed at a temperature higher than T1 in a magnetic field for setting the magnetization direction of the magnetic layer 23a in the +X-direction. Next, the second annealing is performed at a temperature lower than T1 and higher than T2 in a magnetic field for setting the magnetization direction of the magnetic layer 23b in the −X-direction. By doing so, the magnetization direction of the magnetic layer 23a can be fixed in the +X-direction, while the magnetization direction of the magnetic layer 23b can be fixed in the −X-direction.

According to the fifth embodiment, the resulting magnetic memory device provides similar advantages to those of the first embodiment.

Next, a magnetic memory device according to a sixth embodiment of the present invention will be described with reference FIGS. 41A and 41B.

Figure 41A:
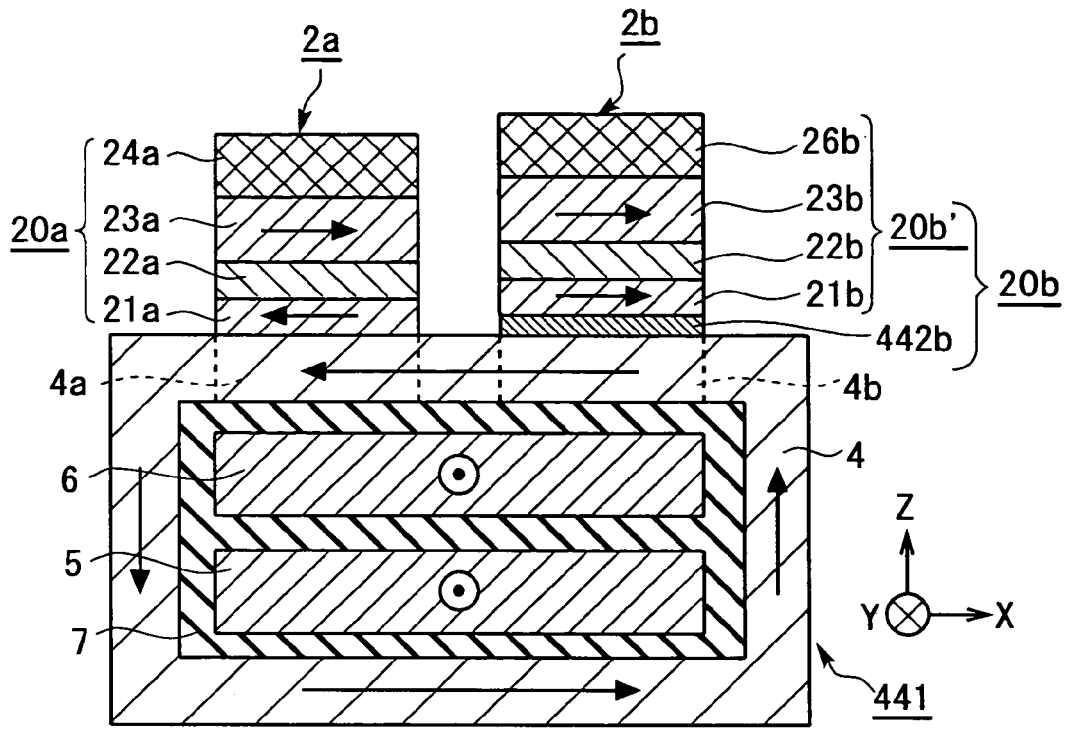
FIGS. 41A, 41B are general cross-sectional views schematically illustrating a storage cell of a magnetic memory device according to a sixth embodiment of the present invention.
Figure 41B:
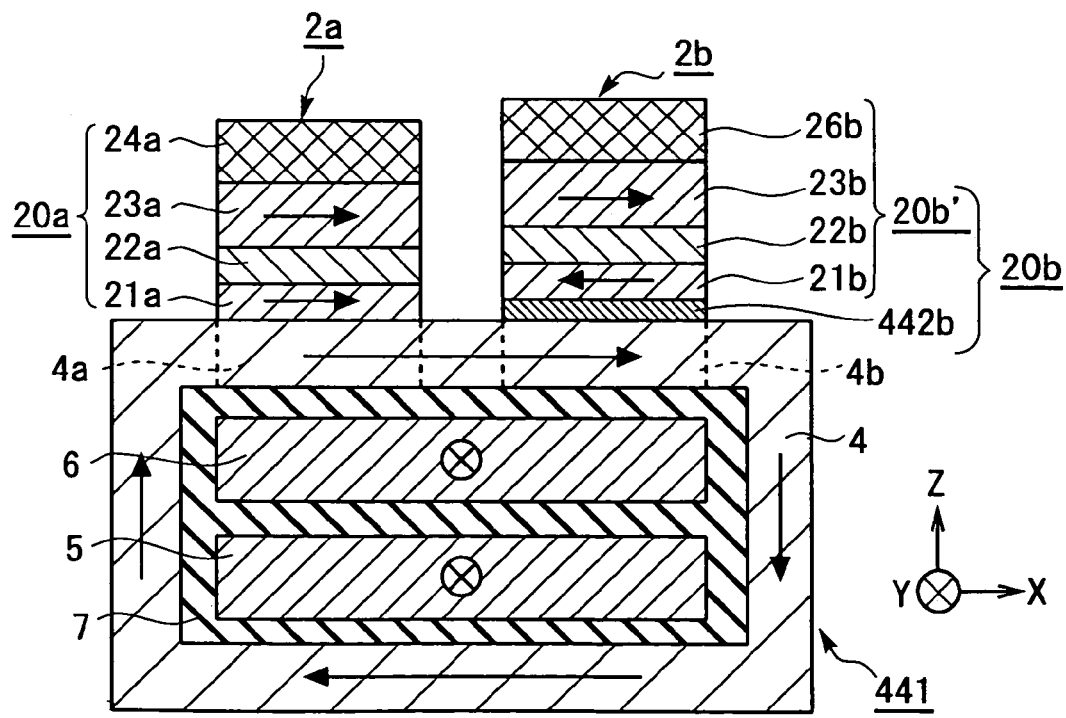

FIGS. 41A and 41B are general cross-sectional views schematically illustrating a storage cell 441 of a magnetic memory device according to a sixth embodiment of the present invention, and correspond to FIGS. 4A and 4B.

The magnetic memory device according to the sixth embodiment differs from the magnetic memory device according to the first embodiment only in that the storage cell 441 illustrated in FIGS. 41A and 41B is used instead of the storage cell 1 illustrated in FIGS. 4A and 4B.

The storage cell 441 differs from the storage cell 1 only in that the non-magnetic conductive layer 24b and ferromagnetic layer 25b between the ferromagnetic layer 23b and antiferromagnetic layer 26b are removed in the TMR element 2b; and a non-magnetic conductive layer 442b is added between the magnetic layer 21b and annular magnetic layer 4. The non-magnetic conductive layer 442b is designed to produce antiferromagnetic coupling between the layers 21b and 4b on the both sides thereof in the laminating direction by selecting thickness, material and the like therefor.

In the sixth embodiment, a laminated composite 20b' from the layer 21b to the layer 26b in the TMR element 2b have the same number of layers of the same kinds made of the same materials as the laminated composite 20a of the TMR element 2b. However, when the storage cell 441 is manufactured by a method similar to that for manufacturing the magnetic memory device according to the first embodiment, corresponding layers in the laminated composite 20b' and laminated composite 20a need not be necessarily made of the same materials.

The storage cells 1, 401, 411, 421, 431 according to the first to fifth embodiments are exemplary storage cells which have such a structure that the magnetization directions of the magnetic layers (layers of which magnetizations are fixed: pinned layers) 23a, 23b, which affect the high/low states of the electric resistances of the TMR elements 2a, 2b, respectively, are set in antiparallel (in opposite orientations) with each other, and the magnetization directions of the magnetic layers (layers of which magnetizations are changeable: free layers) 21a, 21b, which affect the high/low states of the electric resistances of the TMR elements 2a, 2b, respectively, change to be in parallel with each other.

In contrast, the storage cells 441, 451, 461, 471 according to the sixth embodiment and a seventh to a ninth embodiment, later described, are exemplary storage cells which have such a structure that the magnetization directions of the magnetic layers (layers of which magnetizations are fixed: pinned layers) 23a, 23b are set in parallel (in the same orientation) with each other, and the magnetization directions of the magnetic layers (layers of which magnetizations are changeable: free layers) 21a, 21b change to be in antiparallel (in opposite orientations) with each other.

According to the sixth embodiment, the resulting magnetic memory device provides similar advantages to those of the first embodiment.

Here, an exemplary method of manufacturing the magnetic memory device according to the sixth embodiment, particularly, the storage cell 441 will be described with reference to FIGS. 42 to 48. FIGS. 42 to 48 are cross-sectional views illustrating steps in the manufacturing method, and correspond to FIG. 6A. Note that FIGS. 42 to 48 illustrate a main portion in enlarged views in a manner similar to FIGS. 27 to 35.

First, the steps from FIG. 9 to FIG. 25 are performed as described in connection with the first embodiment.

Figure 42:
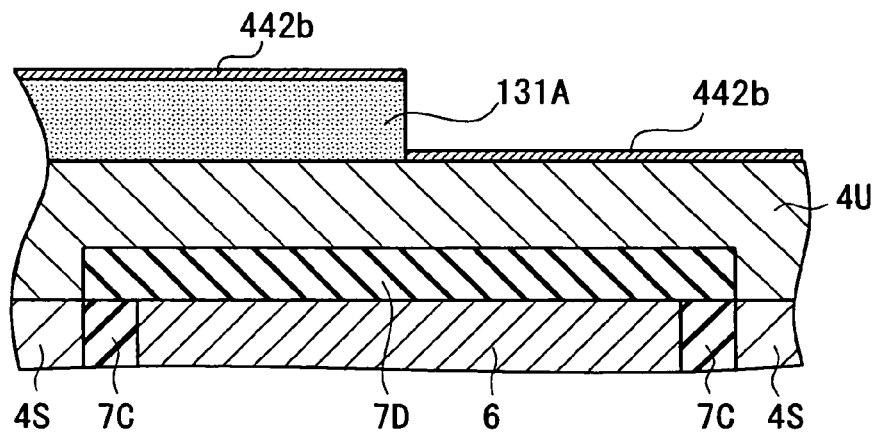
FIG. 42 is a partially enlarged cross-sectional view illustrating a step in a method of manufacturing the magnetic memory device according to the sixth embodiment of the present invention.

Next, a photoresist layer 131A is selectively formed by photolithography or the like in a region which includes an area in which the laminated composite 20a is to be formed but does not include an area in which the laminated composite 20b is to be formed. Next, a non-magnetic conductive layer 442b made, for example, of Ru is formed over the entire surface by sputtering or the like (FIG. 42).

Figure 43:
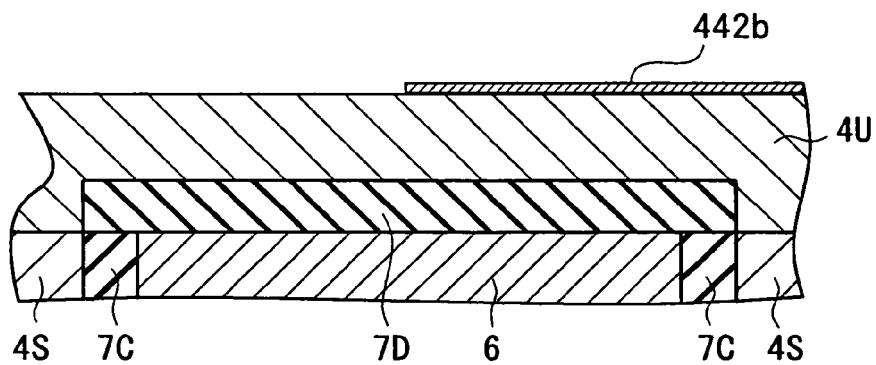
FIG. 43 is a partially enlarged cross-sectional view illustrating a step subsequent to the step of FIG. 42.

Next, the photoresist layer 131A and non-magnetic conductive layer 442b are removed by lift-off in a region which includes the area in which the laminated composite 20a is to be formed (FIG. 43).

Figure 44:
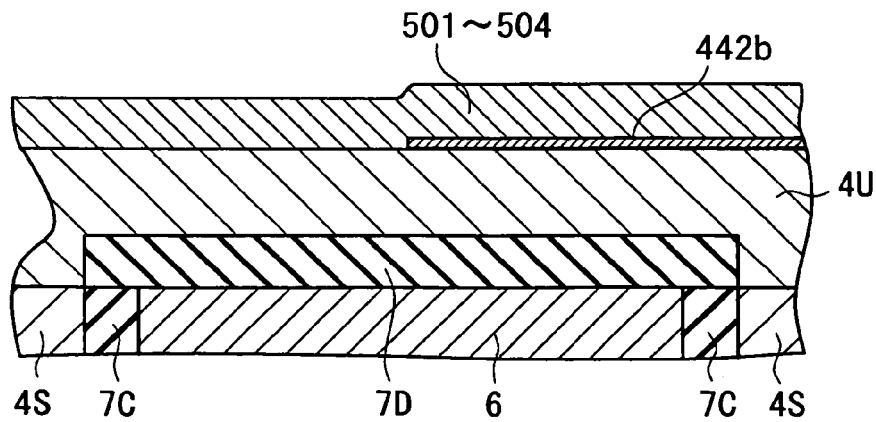
FIG. 44 is a partially enlarged cross-sectional view illustrating a step subsequent to the step of FIG. 43.

Subsequently, a magnetic layer 501 (eventually formed into the layers 21a, 21b); a tunnel barrier layer 502 (eventually formed into the layers 22a, 22b); a magnetic layer 503 (eventually formed into the layers 23a, 23b); and an antiferromagnetic layer 504 (eventually formed into the layers 24a, 26b) are formed in sequence over the entire surface (FIG. 44). These layers will serve as the laminated composites 20a, 20b'. Specifically, first, the magnetic layer 501 made, for example, of CoFe and an Al layer are formed in sequence by sputtering or the like. The Al layer is oxidized to form the tunnel barrier layer 502. Subsequently, the magnetic layer 503 made, for example, of CoFe and the antiferromagnetic layer 504 made, for example, of PtMn are formed in sequence on the tunnel barrier layer 502 by sputtering or the like. Further, for preventing deteriorations of these layers during the processing, a cap layer (protection layer) made of Ta or the like may be provided.

Figure 45:
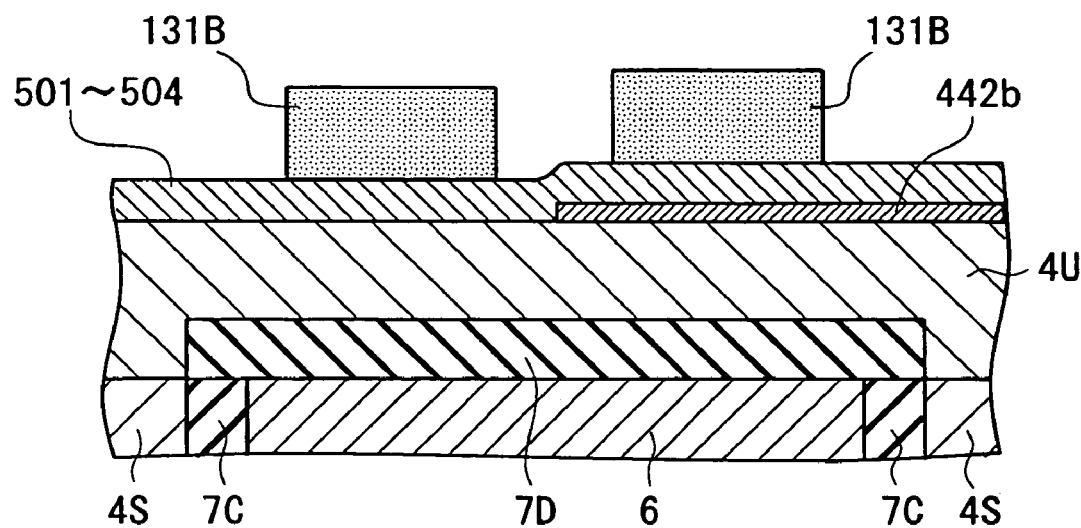
FIG. 45 is a partially enlarged cross-sectional view illustrating a step subsequent to the step of FIG. 44.
Figure 46:
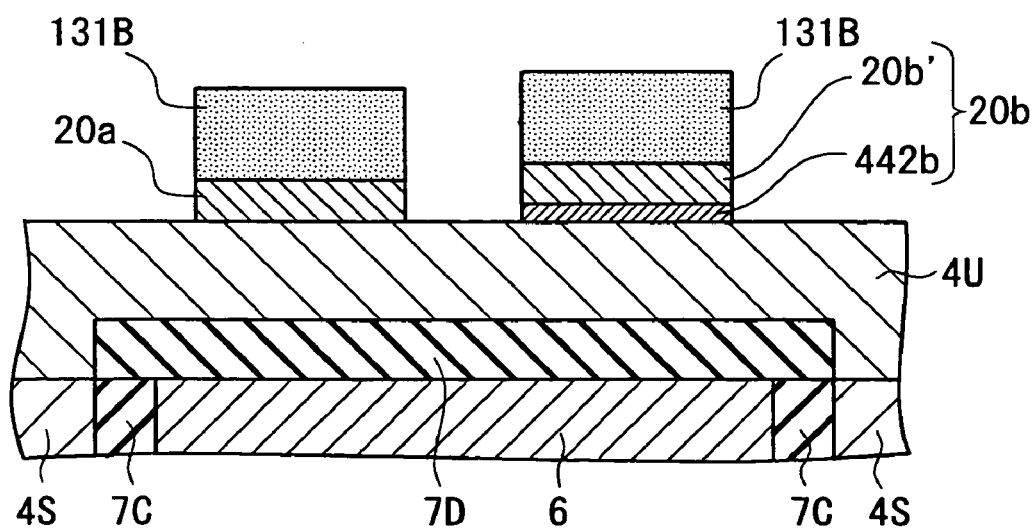
FIG. 46 is a partially enlarged cross-sectional view illustrating a step subsequent to the step of FIG. 45.

Subsequently, a photoresist layer 131B is selectively formed by photolithography or the like in the regions corresponding to the laminated composites 20a, 20b (FIG. 45). Next, ion milling is performed with the photoresist layer 131B used as a mask to pattern the layers 501–504 and non-magnetic conductive layer 442b into the laminated composites 20a, 20b, respectively (FIG. 46). The ion milling may be stopped to such a point that the non-magnetic conductive layer 442b remains, so that the non-magnetic conductive layer 442b is eventually left.

Figure 47:
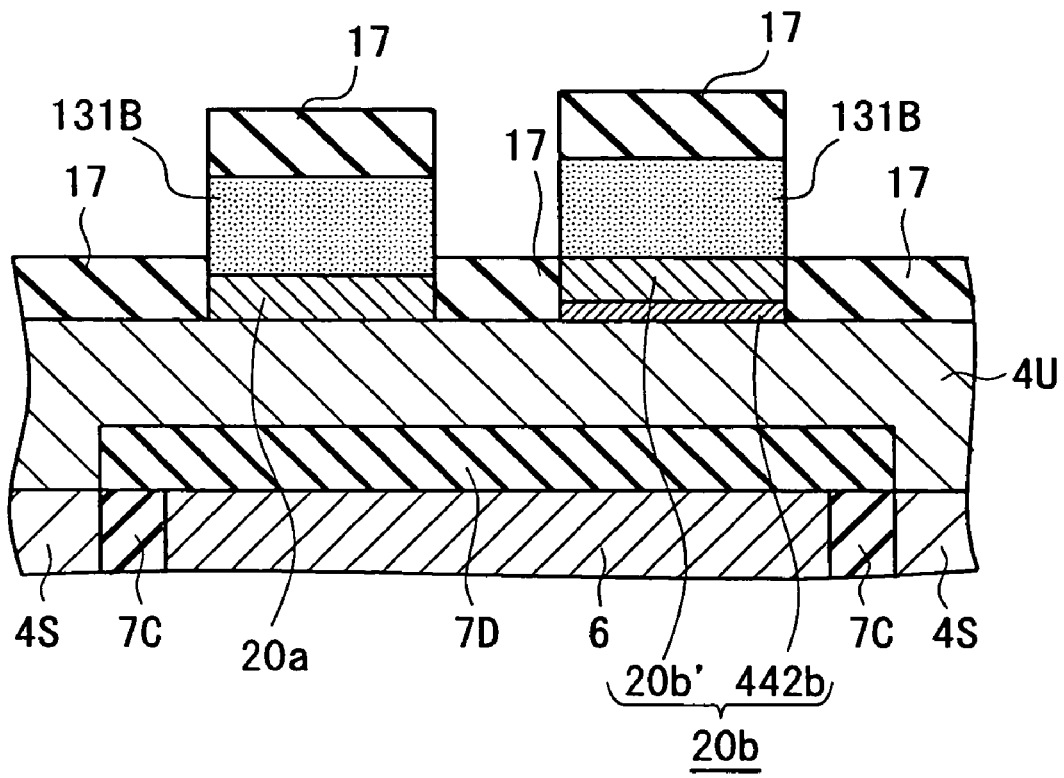
FIG. 47 is a partially enlarged cross-sectional view illustrating a step subsequent to the step of FIG. 46.
Figure 48:
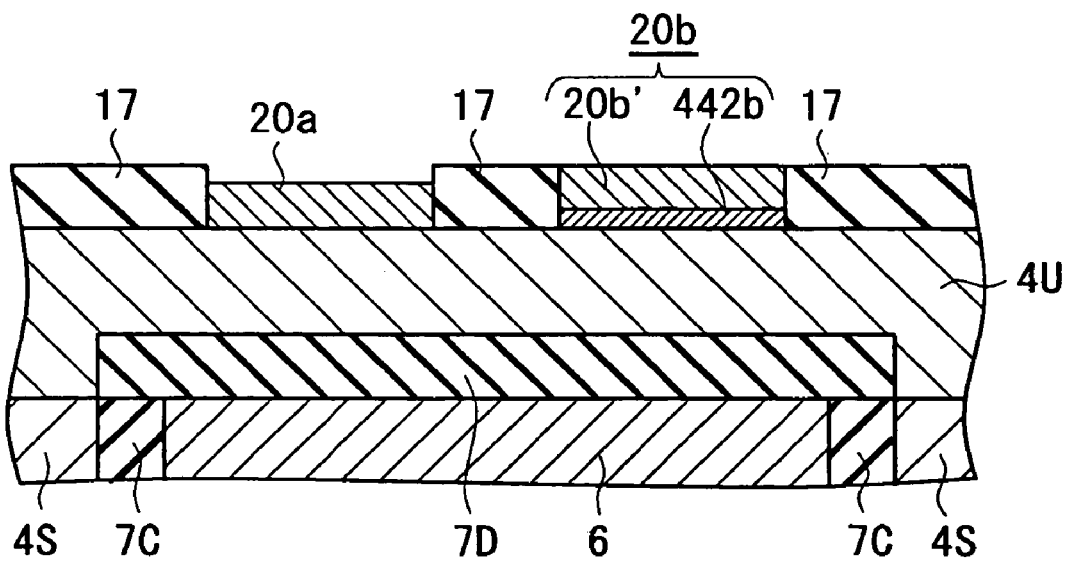
FIG. 48 is a partially enlarged cross-sectional view illustrating a step subsequent to the step of FIG. 47.

Next, an insulating layer 17 made, for example, of SiO$_2$ is formed by a CVD apparatus or the like to cover the entirety (FIG. 47). Next, the photoresist layer 131B and insulating layer 17 are removed on the laminated composites 20a, 20b by lift-off (FIG. 48). FIG. 47 illustrates a similar state to that illustrated in FIG. 26.

Subsequently, the manufacturing of the magnetic memory device according to the sixth embodiment is completed by performing similar steps to those of the manufacturing method described in connection with the first embodiment.

According to the foregoing manufacturing method, a majority (the laminated composite 20a and laminated composite 20b' in the foregoing example) of the laminates of the TMR elements 2a, 2b can be made up of the layers 501–504 deposited in the same processes, thereby substantially eliminating differences in characteristics between the TMR element 2a and TMR element 2b in one storage cell 441. This is quite preferred when the outputs of the two TMR elements 2a, 2b are differentially amplified for outputting.

Next, a magnetic memory device according to a seventh embodiment of the present invention will be described with reference FIGS. 49A and 49B.

Figure 49A:
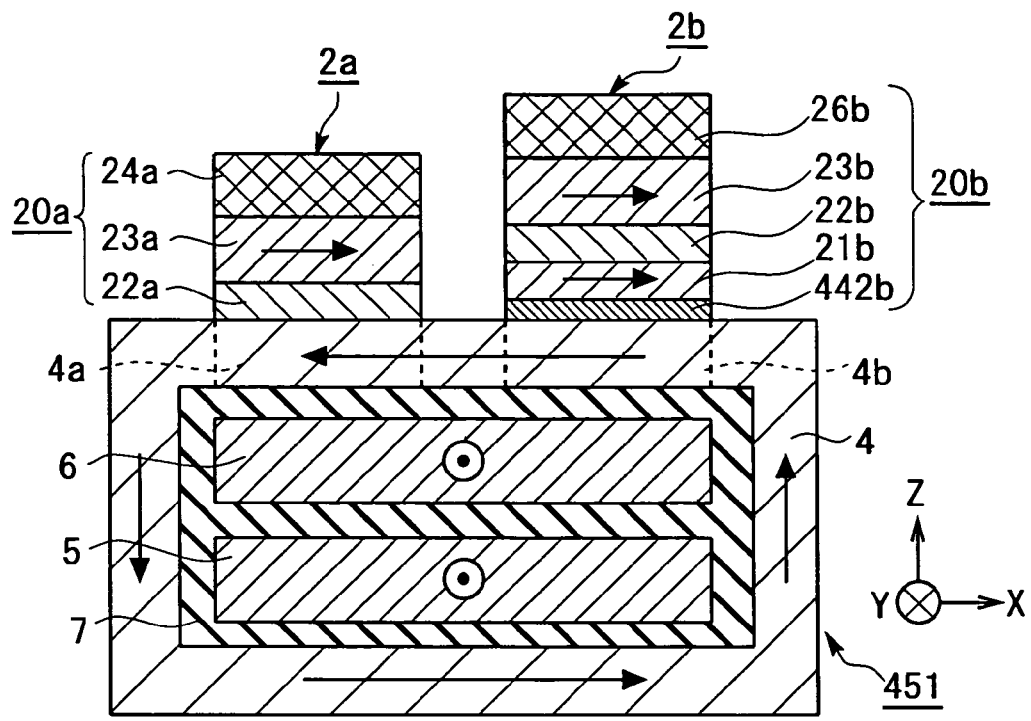
FIGS. 49A, 49B are general cross-sectional views schematically illustrating a storage cell of a magnetic memory device according to a seventh embodiment of the present invention.
Figure 49B:
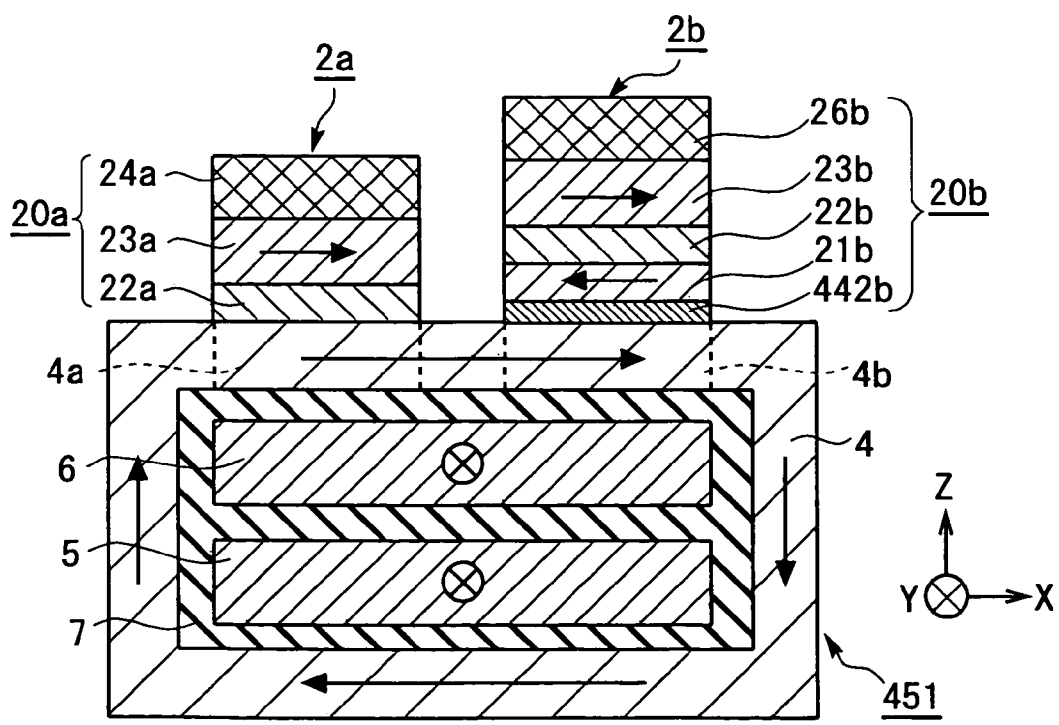

FIGS. 49A and 49B are general cross-sectional views schematically illustrating a storage cell 451 of a magnetic memory device according to a seventh embodiment of the present invention, and correspond to FIGS. 4A, 4B and FIGS. 41A, 41B. In FIGS. 49A and 49B, components identical or corresponding to those in FIGS. 4A, 4B and FIGS. 41A, 41B are designated by the same reference numerals, and repetitive description thereon is omitted. This applies to FIGS. 50A, 50B and FIGS. 51A, 51B, later described.

The magnetic memory device according to the seventh embodiment differs from the magnetic memory device according to the first embodiment only in that the storage cell 451 illustrated in FIGS. 49A and 49B is used instead of the storage cell 1 illustrated in FIGS. 4A and 4B.

The storage cell 451 differs from the storage cell 441 illustrated in FIGS. 41A and 41B only in that the magnetic layer 21a is removed from the laminated composite 20a, and the connection portion 4a, which forms part of the annular magnetic layer 4, is used as equivalent to the magnetic layer 21a (so-called effective free layer). In other words, in the seventh embodiment, the TMR element 2a is comprised of a laminate made up of the connection portion 4a and laminated composite 20a.

The magnetic memory device according to the seventh embodiment can also be manufactured by a manufacturing method similar to that for manufacturing the magnetic memory device according to the sixth embodiment.

According to the seventh embodiment, the resulting magnetic storage cell provides similar advantages to those of the magnetic memory device according to the sixth embodiment. Also, according to the seventh embodiment, since the magnetic memory device does not include the magnetic layer 21a, the resulting layered structure is advantageously simpler than that of the sixth embodiment.

Next, a magnetic memory device according to a eighth embodiment of the present invention will be described with reference FIGS. 50A and 50B.

Figure 50A:
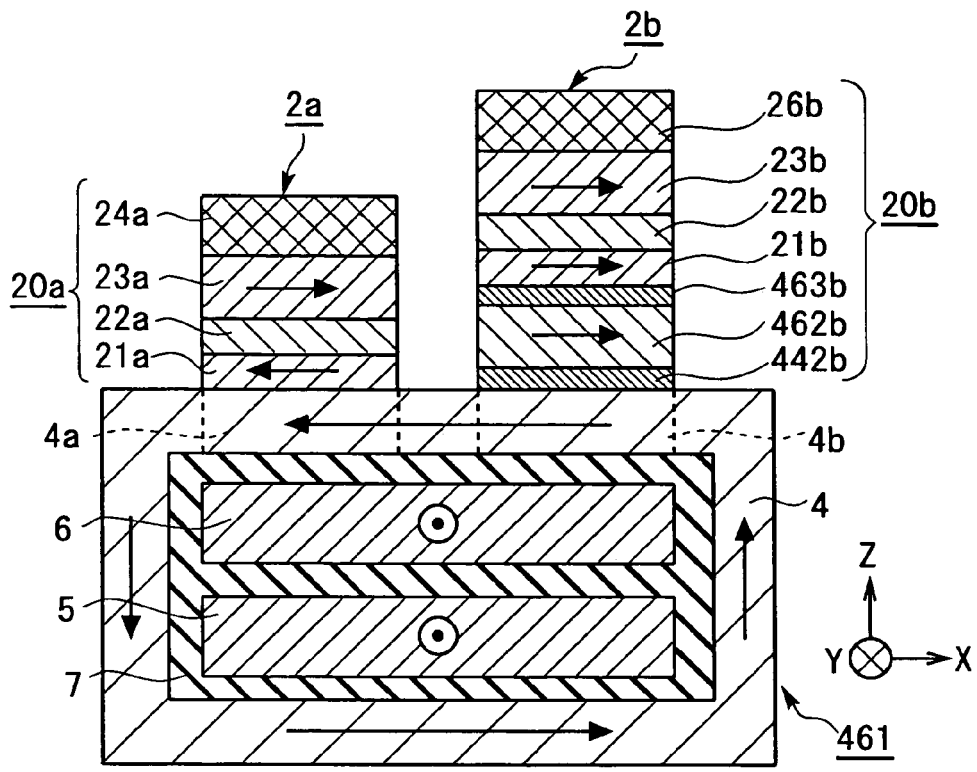
FIGS. 50A, 50B are general cross-sectional views schematically illustrating a storage cell of a magnetic memory device according to an eighth embodiment of the present invention.
Figure 50B:
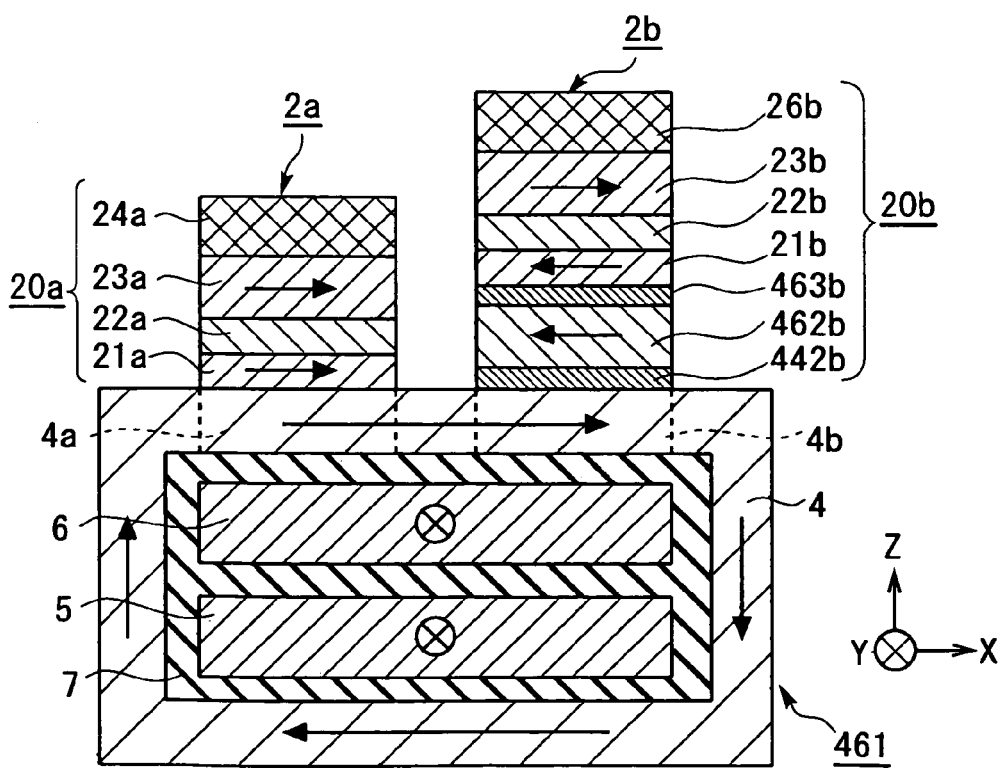

FIGS. 50A and 50B are general cross-sectional views schematically illustrating a storage cell 461 of a magnetic memory device according to an eighth embodiment of the present invention, and correspond to FIGS. 4A, 4B and FIGS. 41A, 41B.

The magnetic memory device according to the eighth embodiment differs from the magnetic memory device according to the first embodiment only in that the storage cell 461 illustrated in FIGS. 50A and 50B is used instead of the storage cell 1 illustrated in FIGS. 4A and 4B.

The storage cell 461 differs from the storage cell 441 illustrated in FIGS. 41A and 41B only in that a lower ferromagnetic layer 462b and an upper non-magnetic conductive layer 463b are added between the non-magnetic conductive layer 442b and magnetic layer 21b in the TMR element 2b. The non-magnetic conductive layer 463b can be made of a material similar to that of the non-magnetic conductive layer 24b in FIGS. 4A and 4B, while the ferromagnetic layer 463b can be made of a similar material to that of the ferromagnetic layer 23b. In the eighth embodiment, the non-magnetic conductive layer 442b is designed to produce antiferromagnetic coupling between the layers 4b and 462b on both sides thereof in the laminating direction by selecting the thickness, material and the like therefor, while the non-magnetic conductive layer 463b are designed to produce exchange coupling based on an RKKY action between the layers 462b and 21b on both sides thereof in the laminating direction, rather than the antiferromagnetic coupling, by selecting the thickness, material and the like therefor.

Therefore, in the eighth embodiment, the two non-magnetic conductive layers 442b, 463b are formed between the connection portion 4b of the annular magnetic layer 4 and the magnetic layer 21b, but the number of times of the antiferromagnetic coupling produced between the connection portion 4b and the magnetic layer 21b is an odd number (one in the eighth embodiment). As such, in the eighth embodiment, the magnetization directions of the magnetic layers 21a, 21b also change to be in antiparallel (in opposite orientations) with each other, as is the case with the sixth embodiment.

According to the eighth embodiment, the resulting magnetic memory device provides similar advantages to those of the sixth embodiment. The magnetic memory device according to the eighth embodiment can also be manufactured by a method similar to that for manufacturing the magnetic memory device according to the sixth embodiment.

Next, a magnetic memory device according to a ninth embodiment of the present invention will be described with reference FIGS. 51A and 51B.

Figure 51A:
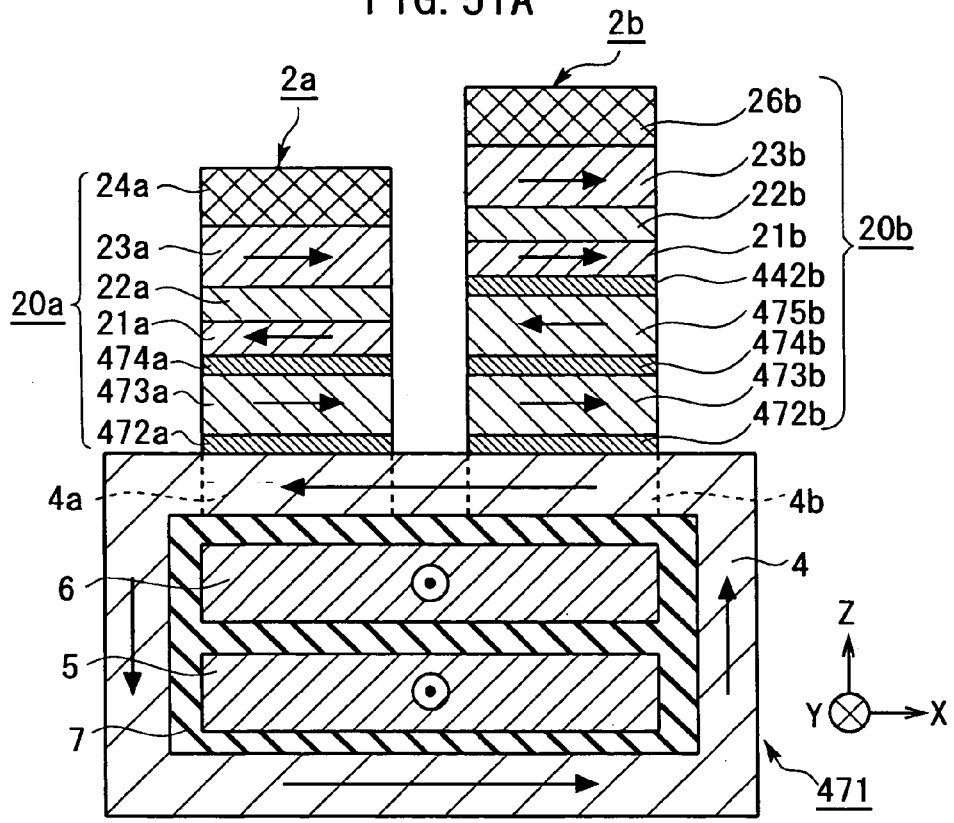
FIGS. 51A, 51B are general cross-sectional views schematically illustrating a storage cell of a magnetic memory device according to a ninth embodiment of the present invention.
Figure 51B:
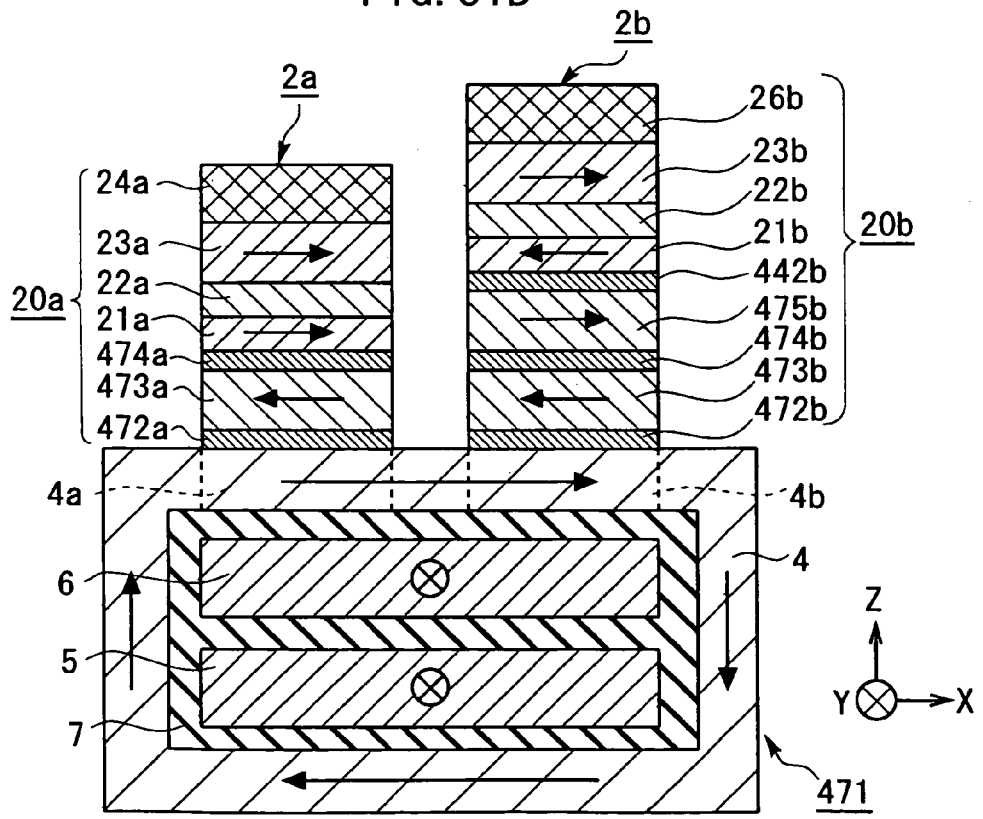

FIGS. 51A and 51B are general cross-sectional views schematically illustrating a storage cell 471 of a magnetic memory device according to a ninth embodiment of the present invention, and correspond to FIGS. 4A, 4B and FIGS. 41A, 41B.

The magnetic memory device according to the ninth embodiment differs from the magnetic memory device according to the first embodiment only in that the storage cell 471 illustrated in FIGS. 51A and 51B is used instead of the storage cell 1 illustrated in FIGS. 4A and 4B.

The storage cell 471 differs from the storage cell 441 illustrated in FIGS. 41A and 41B only in the following. In the storage cell 471, a non-magnetic conductive layer 472a, a ferromagnetic layer 473a, and a non-magnetic conductive layer 474a are added in order from below between the connection portion 4a of the annular magnetic layer 4 and the magnetic layer 21a in the TMR element 2a.

Also, in the storage cell 471, a non-magnetic conductive layer 472b, a ferromagnetic layer 473b, a non-magnetic conductive layer 474b, and ferromagnetic layer 475b are added in order from below between the connection portion 4b of the annular magnetic layer 4 and the non-magnetic conductive layer 442b. Any of the non-magnetic conductive layers 472a, 474a, 472b, 474b, 442b is designed to produce antiferromagnetic coupling between the layers on both sides thereof in the laminating direction by selecting the thickness, material and the like therefor.

Therefore, the number of times of the antiferromagnetic coupling produced between the magnetic layer 21a and annular magnetic layer 4 in the TMR element 2a is an even number (two in the ninth embodiment), while the number of times of the antiferromagnetic coupling produced between the magnetic layer 21b and annular magnetic layer 4 in the TMR element 2b is an odd (three in the ninth embodiment). As such, in the ninth embodiment, the magnetization directions of the magnetic layers 21a, 21b also change to be in antiparallel (in opposite orientations) with each other, as is the case with the sixth embodiment.

According to the ninth embodiment, the resulting magnetic memory device provides similar advantages to those of the sixth embodiment. The magnetic memory device according to the ninth embodiment can also be manufactured by a similar manufacturing method to that for manufacturing the magnetic memory device according to the sixth embodiment.

In the magnetic memory devices according to the first to ninth embodiments described above, the storage cell has the TMR elements 2a, 2b (i.e., laminated composites 20a, 20b) are disposed on one surface side (upper side) of the annular magnetic layer 4 opposite to the substrate 126. However, in the present invention, the magnetic memory devices according to the foregoing embodiments may be modified such that the TMR elements 2a, 2b are disposed on the other surface side (lower side) of the annular magnetic layer 4 closer to the substrate 126.

Figure 52:
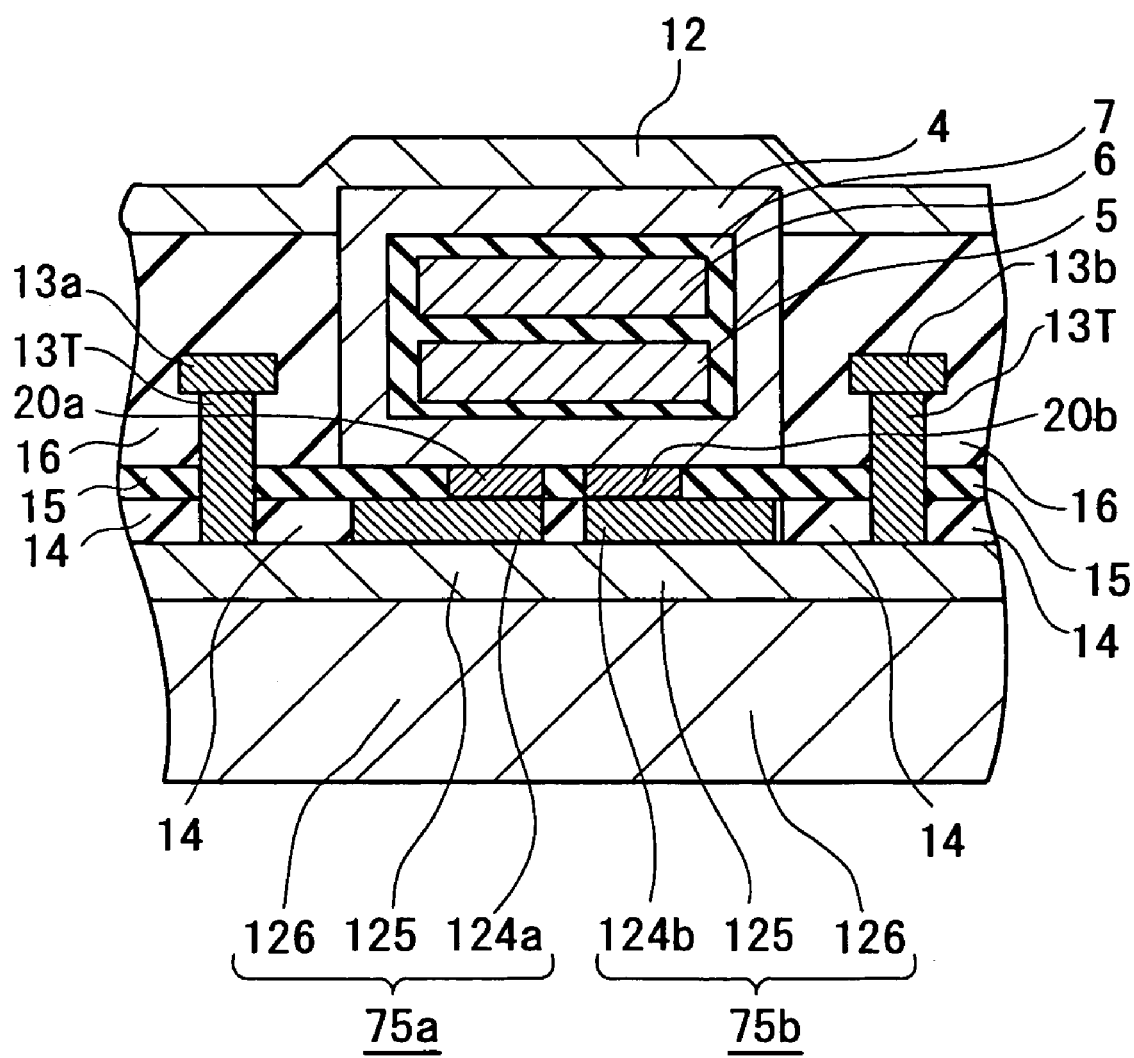
FIG. 52 is a general cross-sectional view schematically illustrating a main portion of a magnetic memory device according to an exemplary modification in the present invention.

FIG. 52 illustrates an exemplary modification of the foregoing. FIG. 52 is a general cross-sectional view schematically illustrating a main portion of the magnetic memory device according to the exemplary modification in the present invention, and corresponds to FIG. 6A. In FIG. 52, components identical to or corresponding to those in FIGS. 6A and 6B are designated by the same reference numerals, and repetitive description thereon is omitted. In this exemplary modification, a read word line 12 is disposed on the upper side of the annular magnetic layer 4, the interlayer connection layer 18T and connection layers 18a, 18b are removed to connect the laminated composites 20a, 20b directly to the conductive layers 124a, 124b, respectively, thus resulting in a simple wiring structure. The respective layers in the laminated composites 20a, 20b are laminated in the order reverse to that of the respective embodiments described above.

As described above, although the explanation has been made as to the respective embodiments according to the present invention and the exemplary modification, the present invention is not limited those embodiments and exemplary modification.

For example, each of the embodiments described above employs the antiferromagnetic layers 24a, 26b for fixing the magnetization direction of the magnetic layers 23a, 23b in the TMR elements 2a, 2b, thereby employing the structure referred to as "exchange biasing type" in the TMR elements 2a, 2b. However, the present invention is not limited to the exchange biasing type structure, but may employ a structure referred to as "coercivity differential type" which comprises a pinned layer having a larger coercive force than a free layer. For employing this structure, for example, in the foregoing sixth to ninth embodiments, the antiferromagnetic layers 24a, 24b may be removed, and the magnetic layers 23a, 23b may be made of a material having a larger coercive force than the material of the magnetic layers 21a, 21b.

Also, while each of the embodiments described above employs TMR elements for magneto-resistive elements, the present invention may employ other magneto-resistive elements such as CPP-based magneto-resistive elements as represented by CPP-GMR, and others.

As described above, the present invention can provide a magnetic storage cell made up of two magneto-resistive elements in a simple structure, which is capable of removing in-phase noise in a read output, reducing a loss of current magnetic field when information is written thereinto to accomplish efficient magnetization reversal, offering a large storage capacity by reducing the area occupied by the magnetic storage cell, and facilitating the manufacturing. Further, the present invention can provide a magnetic memory device which uses the foregoing magnetic storage cell.

What is claimed is:

1. A magnetic storage cell comprising:
a first and a second magneto-resistive element each comprised of a laminate, and disposed in a direction along a laminating surface with respect to each other; and
a first magnetic layer disposed on one surface side of said laminates so as to be common to said first and second magneto-resistive elements, said first magnetic layer forming a magnetic path for a current magnetic field generated by a plurality of conductors commonly provided for said first and second magneto-resistive elements,
wherein said first and second magneto-resistive elements have electric resistances of which high/low states change simultaneously based on the current magnetic field passing through said first magnetic layer.

2. A magnetic storage cell according to claim 1, wherein said first magnetic layer comprises an annular magnetic layer disposed to have an axial direction defined in the direction along the laminating surface and passed through by said plurality of conductors.

3. A magnetic storage cell according to claim 1, wherein each of said first and second magneto-resistive elements is electrically connected to said first magnetic layer.

4. A magnetic storage cell according to claim 1, wherein said plurality of conductors extend in parallel with one another in a region in which said conductors pass through said annular magnetic layer.

5. A magnetic storage cell according to claim 1, wherein each of said first and second magneto-resistive elements is configured such that a current flows in a direction perpendicular to the laminating surface.

6. A magnetic storage cell according to claim 1, wherein said magnetic storage cell takes one of a first state wherein the electric resistance of said first magneto-resistive element is relatively low and the electric resistance of said second magneto-resistive element is relatively high, and a second state wherein the electric resistance of said first magneto-resistive element is relatively high and the electric resistance of said second magneto-resistive element is relatively low, and said magnetic storage cell stores information corresponding to the first and second states.

7. A magnetic storage cell according to claim 1, wherein:
  each of said first and second magneto-resistive elements includes a second magnetic layer, the magnetization direction of which is fixed, and a third magnetic layer, the magnetization direction of which changes in response to an external magnetic field, said second magnetic layer and said third magnetic layer being laminated in the same laminating order in said first magneto-resistive element as in said second magneto-resistive element,
  the high/low state of the electric resistance of each of said first and second magneto-resistive elements is determined in accordance with a relative relationship between the magnetization directions of said second and third magnetic layers included in the associated magneto-resistive element, and
  the magnetization directions of said third magnetic layers included in said first and second magneto-resistive elements simultaneously change based on the current magnetic field.

8. A magneto-resistive cell according to claim 7, wherein each of said first and second magneto-resistive elements includes a tunnel barrier layer between said second and third magnetic layers.

9. A magnetic storage cell according to claim 7, wherein said magnetic storage cell takes one of a first state wherein the magnetization directions of said second and third magnetic layers included in said first magneto-resistive element are substantially in parallel with each other, and the magnetization directions of said second and third magnetic layers included in said second magneto-resistive element are substantially in antiparallel with each other, and a second state wherein the magnetization directions of said second and third magnetic layers included in said first magneto-resistive element are substantially in antiparallel with each other, and the magnetization directions of said second and third magnetic layers included in said second magneto-resistive element are substantially in parallel with each other, and said magnetic storage cell stores information corresponding to the first and second states.

10. A magnetic storage cell according to claim 7, wherein said third magnetic layer included in at least one of said first and second magneto-resistive elements constitutes a part of said first magnetic layer.

11. A magnetic storage cell according to claim 7, wherein:
  the magnetization direction of said second magnetic layer included in said first magneto-resistive element and the magnetization direction of said second magnetic layer included in said second magneto-resistive element are set to be substantially in antiparallel with each other, and
  the magnetization direction of said third magnetic layer included in said first magneto-resistive element and the magnetization direction of said third magnetic layer included in said second magneto-resistive element change based on the current magnetic field to be substantially in parallel with each other.

12. A magnetic storage cell according to claim 11, wherein:
  each of said first and second magneto-resistive elements includes an antiferromagnetic layer laminated on one surface side of said second magnetic layer included in the associated magneto-resistive element opposite to said third magnetic layer included in the associated magneto-resistive element,
  said antiferromagnetic layer included in one of said first and second magneto-resistive elements is laminated on a surface of said second magnetic layer included in the associated magneto-resistive element to produce exchange coupling with the associated second magnetic layer,
  the other of said first and second magneto-resistive elements includes one or more bilayer films laminated in sequence between said second magnetic layer and said antiferromagnetic layer included in the associated magneto-resistive element,
  each of said one or more bilayer films included in said other magneto-resistive element comprises a non-magnetic conductive layer disposed on one side closer to said second magnetic layer included in the associated magneto-resistive element, and a ferromagnetic layer disposed on the opposite side thereto,
  said antiferromagnetic layer included in said other magneto-resistive element produces exchange coupling with one of said ferromagnetic layer or layers forming part of said one or more bilayer films included in the associated magneto-resistive element, said one ferromagnetic layer being adjacent in the laminating direction to said antiferromagnetic layer included in the associated magneto-resistive element,
  said non-magnetic conductive layer included in at least one of said one or more bilayer films produces antiferromagnetic coupling between two layers adjacent to the associated non-magnetic conductive layer on both sides in the laminating direction, and
  the number of times of the antiferromagnetic coupling produced between said second magnetic layer and said antiferromagnetic layer in said other magneto-resistive element is an odd number.

13. A magnetic storage cell according to claim 11, wherein:
  each of said first and second magneto-resistive elements includes an antiferromagnetic layer laminated on one surface side of said second magnetic layer included in the associated magneto-resistive element opposite to said third magnetic layer included in the associated magneto-resistive element,
  each of said first and second magneto-resistive elements includes one or more bilayer films laminated in sequence between said second magnetic layer and said antiferromagnetic layer included in the associated magneto-resistive element,
  each of said one or more bilayer films included in said first and second magneto-resistive elements comprises a non-magnetic conductive layer disposed on one side closer to said second magnetic layer included in the associated magneto-resistive element, and a ferromagnetic layer disposed on the opposite side thereto, each of said antiferromagnetic layers included in said first and second magneto-resistive elements produces exchange coupling with one of said ferromagnetic layer or layers forming part of said one or more bilayer films included in the associated magneto-resistive element, said one ferromagnetic layer being adjacent in the laminating direction to said antiferromagnetic layer included in the associated magneto-resistive element, said non-magnetic conductive layer included in at least one of said one or more bilayer films included in said first magneto-resistive element produces antiferromagnetic coupling between two layers adjacent to the associated non-magnetic conductive layer on both sides in the laminating direction, said non-magnetic conductive layer included in at least one of said one or more bilayer films included in said second magneto-resistive element produces antiferromagnetic coupling between two layers adjacent to the associated non-magnetic conductive layer on both sides in the laminating direction, and one of the number of times of the antiferromagnetic coupling produced between said second magnetic layer and said antiferromagnetic layer in said first magneto-resistive element, and the number of times of the antiferromagnetic coupling produced between said second magnetic layer and said antiferromagnetic layer in said second magneto-resistive element is an odd number, and the other is an even number.

14. A magnetic storage cell according to claim 11, wherein:

each of said first and second magneto-resistive elements includes an antiferromagnetic layer laminated on a surface of said second magnetic layer included in the associated magneto-resistive element opposite to said third magnetic layer included in the associated magneto-resistive element, and involved in the exchange coupling with said second magnetic layer included in the associated magneto-resistive element, and said antiferromagnetic layer include in said first magneto-resistive element, and said antiferromagnetic layer included in said second magneto-resistive element are made of antiferromagnetic materials which are different in blocking temperature from each other, respectively.

15. A magnetic storage cell according to claim 7, wherein:

the magnetization direction of said second magnetic layer included in said first magneto-resistive element and the magnetization direction of said second magnetic layer included in said second magneto-resistive element are set to be substantially in parallel with each other, and the magnetization direction of said third magnetic layer included in said first magneto-resistive element and the magnetization direction of said third magnetic layer included in said second magneto-resistive element change based on the current magnetic field to be substantially in antiparallel with each other.

16. A magnetic storage cell according to claim 15, wherein:

said third magnetic layer included in one of said first and second magneto-resistive elements constitutes a part of said first magnetic layer, or is directly in contact with said first magnetic layer, and the other of said first and second magneto-resistive elements includes a non-magnetic conductive layer laminated between said third magnetic layer included in the associated magneto-resistive element and said first magnetic layer for producing antiferromagnetic coupling therebetween.

17. A magnetic storage cell according to claim 15, wherein:

said third magnetic layer included in one of said first and second magneto-resistive elements constitutes a part of said first magnetic layer, or is directly in contact with said first magnetic layer, the other of said first and second magneto-resistive elements includes two or more non-magnetic conductive layers and one or more ferromagnetic layers laminated between said third magnetic layer included in the associated magneto-resistive element and said first magnetic layer, said two or more non-magnetic conductive layers have the number of layers larger by one than the number of layers of said one or more ferromagnetic layers, and each of said two or more non-magnetic conductive layers and each of said one or more ferromagnetic layers are alternately laminated, and at least one of said two or more non-magnetic conductive layers produces antiferromagnetic coupling between two layers adjacent to the associated non-magnetic conductive layer on both sides in the laminating direction, and the number of times of the antiferromagnetic coupling produced between said third magnetic layer and said first magnetic layer in said other magneto-resistive element is an odd number.

18. A magnetic storage cell according to claim 15, wherein:

each of said first and second magneto-resistive elements includes two or more non-magnetic conductive layers and one or more ferromagnetic layers laminated between said third magnetic layer included in the associated magneto-resistive element and said first magnetic layer, said two or more non-magnetic conductive layers have the number of layers larger by one than the number of layers of said one or more ferromagnetic layers in said first magneto-resistive element, and each of said two or more non-magnetic conductive layers and each of said one or more ferromagnetic layers are alternately laminated in said first magneto-resistive element, said two or more non-magnetic conductive layers have the number of layers larger by one than the number of layers of said one or more ferromagnetic layers in said second magneto-resistive element, and each of said two or more non-magnetic conductive layers and each of said one or more ferromagnetic layers are alternately laminated in said second magneto-resistive element, at least one of said two or more non-magnetic conductive layers produces antiferromagnetic coupling between two layers adjacent to the associated non-magnetic conductive layer on both sides in the laminating direction in said first magneto-resistive element, at least one of said two or more non-magnetic conductive layers produces antiferromagnetic coupling between two layers adjacent to the associated non-magnetic conductive layer on both sides in the laminating direction in said second magneto-resistive element, and one of the number of times of the antiferromagnetic coupling produced between said third magnetic layer and said first magnetic layer in said first magneto-resistive element, and the number of times of the antiferromagnetic coupling produced between said third magnetic layer and said first magnetic layer in said second magneto-resistive element is an odd number, and the other is an even number.

19. A magnetic storage cell according to claim 1, wherein information is read based on currents flowing through said first and second magneto-resistive elements.

20. A magnetic memory device comprising a plurality of magnetic storage cells for storing information, each of said magnetic storage cell being a magnetic storage cell according to claim 1.

* * * * *